US011201192B2

(12) United States Patent
Jeong et al.

(10) Patent No.: US 11,201,192 B2
(45) Date of Patent: Dec. 14, 2021

(54) MEMORY DEVICE AND METHOD OF MANUFACTURING THE SAME

(71) Applicant: Samsung Electronics Co., Ltd., Suwon-si (KR)

(72) Inventors: Ji-Hyun Jeong, Hwaseong-si (KR); Gwan-hyeob Koh, Seoul (KR); Dae-hwan Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/030,425

(22) Filed: Sep. 24, 2020

(65) Prior Publication Data

US 2021/0013263 A1 Jan. 14, 2021

Related U.S. Application Data

(63) Continuation of application No. 16/835,667, filed on Mar. 31, 2020, which is a continuation of application (Continued)

(30) Foreign Application Priority Data

Feb. 22, 2016 (KR) .......................... 10-2016-0020700

(51) Int. Cl.
*H01L 27/24* (2006.01)
*H01L 27/102* (2006.01)
(Continued)

(52) U.S. Cl.
CPC ...... *H01L 27/2481* (2013.01); *G11C 13/0004* (2013.01); *G11C 13/004* (2013.01);
(Continued)

(58) Field of Classification Search
CPC ............ H01L 27/2481; H01L 27/2445; H01L 27/1026; H01L 27/2427; H01L 45/1675;
(Continued)

(56) References Cited

U.S. PATENT DOCUMENTS 7,534,647 B2 5/2009 Lung
7,816,661 B2 10/2010 Lai et al.
(Continued)

FOREIGN PATENT DOCUMENTS

| CN | 101840928 | 9/2010 |
| CN | 103119709 | 5/2013 |
| TW | 201407842 A | 2/2014 |

OTHER PUBLICATIONS

Communication, issued from the Chinese Patent Office for Chinese Application No. 201710096969.7, dated Feb. 2, 2019 (10 pages total).

*Primary Examiner* — Dao H Nguyen
(74) *Attorney, Agent, or Firm* — Muir Patent Law, PLLC

(57) ABSTRACT

A memory device includes a first electrode line layer including a plurality of first electrode lines extending on a substrate in a first direction and being spaced apart from each other, a second electrode line layer including a plurality of second electrode lines extending on the first electrode line layer in a second direction that is different from the first direction and being spaced apart from each other, and a memory cell layer including a plurality of first memory cells located at a plurality of intersections between the plurality of first electrode lines and the plurality of second electrode lines, each first memory cell including a selection device layer, an intermediate electrode and a variable resistance layer that are sequentially stacked. A side surface of the variable resistance layer is perpendicular to a top surface of the substrate or inclined to be gradually wider toward an upper portion of the variable resistance layer. The first memory cell
(Continued)

has a side surface slope so as to have a width gradually decreasing toward its upper portion.

20 Claims, 54 Drawing Sheets

Related U.S. Application Data

No. 16/281,486, filed on Feb. 21, 2019, now Pat. No. 10,636,843, which is a continuation of application No. 15/906,550, filed on Feb. 27, 2018, now Pat. No. 10,263,040, which is a continuation of application No. 15/288,233, filed on Oct. 7, 2016, now Pat. No. 9,941,333.

(51) Int. Cl.
*H01L 45/00* (2006.01)
*G11C 13/00* (2006.01)

(52) U.S. Cl.
CPC ...... *G11C 13/0023* (2013.01); *G11C 13/0069* (2013.01); *H01L 27/1026* (2013.01); *H01L 27/2427* (2013.01); *H01L 27/2445* (2013.01); *H01L 45/06* (2013.01); *H01L 45/126* (2013.01); *H01L 45/1233* (2013.01); *H01L 45/1293* (2013.01); *H01L 45/144* (2013.01); *H01L 45/16* (2013.01); *H01L 45/1675* (2013.01); *G11C 2213/15* (2013.01); *G11C 2213/52* (2013.01); *G11C 2213/71* (2013.01); *G11C 2213/72* (2013.01); *G11C 2213/76* (2013.01); *G11C 2213/79* (2013.01)

(58) Field of Classification Search
CPC ... H01L 45/06; H01L 45/1233; H01L 45/126; H01L 45/1293; H01L 45/144; H01L 45/16; H01L 45/04; H01L 45/12; G11C 13/0004; G11C 13/0023; G11C 13/004; G11C 13/0069; G11C 2213/15; G11C 2213/52; G11C 2213/71; G11C 2213/72; G11C 2213/76; G11C 2213/79
USPC ... 257/2, 3, 4, 5, 295, 421, 42, 43, E21.001, 257/E21.002, E21.004, E21.051, E21.068, 257/E21.229, E23.142, E27.004, E27.104, 257/E29.139, E29.266, E29.33, E45.002; 438/95, 97, 382, 621; 365/163
See application file for complete search history.

(56) References Cited

U.S. PATENT DOCUMENTS

| | | | |
|---|---|---|---|
| 8,395,935 B2 | 3/2013 | Lung et al. | |
| 8,507,889 B2 | 8/2013 | Nagashima | |
| 8,519,540 B2 | 8/2013 | Chen et al. | |
| 8,574,954 B2 | 11/2013 | Tang | |
| 8,614,135 B2 | 12/2013 | Eun et al. | |
| 8,633,105 B2 | 1/2014 | Hsia et al. | |
| 8,933,536 B2* | 1/2015 | Lung | H01L 45/04 257/586 |
| 9,136,307 B2 | 9/2015 | Pellizzer | |
| 9,202,846 B2 | 12/2015 | Arayashiki et al. | |
| 9,941,333 B2 | 4/2018 | Jeong et al. | |
| 10,263,040 B2 | 4/2019 | Jeong et al. | |
| 10,636,843 B2 | 4/2020 | Jeong et al. | |
| 2005/0219767 A1 | 10/2005 | Nakamura et al. | |
| 2005/0250316 A1 | 11/2005 | Choi et al. | |
| 2006/0118913 A1 | 6/2006 | Yi et al. | |
| 2007/0019341 A1 | 1/2007 | Mizuno et al. | |
| 2009/0196091 A1 | 8/2009 | Kau et al. | |
| 2010/0159675 A1 | 6/2010 | Jeong et al. | |
| 2012/0001654 A1* | 1/2012 | Strukov | H01L 27/2481 326/41 |
| 2012/0068136 A1 | 3/2012 | Park et al. | |
| 2012/0145985 A1 | 6/2012 | Lee | |
| 2013/0095634 A1 | 4/2013 | Takahashi et al. | |
| 2014/0054537 A1 | 2/2014 | Lee et al. | |
| 2015/0041747 A1 | 2/2015 | Kim | |
| 2015/0243708 A1* | 8/2015 | Ravasio | H01L 27/2481 257/4 |
| 2015/0249110 A1 | 9/2015 | Do et al. | |
| 2015/0255708 A1 | 9/2015 | Dong et al. | |
| 2015/0255717 A1 | 9/2015 | Park et al. | |
| 2015/0349248 A1 | 12/2015 | Tang | |
| 2016/0027845 A1 | 1/2016 | Seong et al. | |
| 2016/0035976 A1 | 2/2016 | Mikawa et al. | |
| 2016/0049447 A1* | 2/2016 | Jung | H01L 27/2481 257/4 |
| 2017/0062712 A1 | 3/2017 | Choi et al. | |
| 2021/0013263 A1* | 1/2021 | Jeong | H01L 45/144 |

* cited by examiner

MEMORY DEVICE AND METHOD OF MANUFACTURING THE SAME

CROSS-REFERENCE TO RELATED APPLICATION

This application is a continuation of U.S. patent application Ser. No. 16/835,667, filed Mar. 31, 2020, in the U.S. Patent and Trademark Office (USPTO), which is a continuation of U.S. patent application Ser. No. 16/281,486, filed Feb. 21, 2019, in the USPTO, which is a continuation of U.S. patent application Ser. No. 15/906,550, filed Feb. 27, 2018, in the USPTO, now U.S. Pat. No. 10,263,040, which is a continuation of U.S. patent application Ser. No. 15/288,233, filed Oct. 7, 2016, in the USPTO, now U.S. Pat. No. 9,941,333, which claims the benefit of priority under 35 U.S.C. § 119 to Korean Patent Application No. 10-2016-0020700, filed Feb. 22, 2016, in the Korean Intellectual Property Office (KIPO), the disclosures of all of which are incorporated herein by reference in their entireties.

BACKGROUND

The disclosed concepts relate to a memory device and a method of manufacturing the same and, more particularly, to a memory device having a stacked cross-point array structure and a method of manufacturing the same.

Since there is a growing trend to make electronic products lightweight, thin, and small-sized, the demand for highly-integrated semiconductor devices has increased. Also, a memory device having a stacked cross-point array structure in which a memory cell is located at an intersection between two electrodes crossing each other has been proposed. However, due to the increased need for the downscaling of a memory device having a stacked cross-point structure, it is necessary to reduce sizes of all layers included in the memory device. However, by reducing the size of the memory device, a variety of defects can occur during a process of manufacturing the memory device, thereby deteriorating reliability of the memory device, and reducing mass productivity.

SUMMARY

The disclosed concepts provide a memory device with improved reliability by minimizing etching damages of a variable resistance layer and suppressing misalignment, and a method of manufacturing the same.

According to some aspects, this disclosure is directed to a memory device comprising: a first electrode line layer including a plurality of first electrode lines extending on a substrate in a first direction and being spaced apart from each other; a second electrode line layer including a plurality of second electrode lines formed on the first electrode line layer and extending in a second direction that is different from the first direction and being spaced apart from each other; and a memory cell layer including a plurality of first memory cells located at intersections of the plurality of first electrode lines and the plurality of second electrode lines, each first memory cell including a selection device, an intermediate electrode and a variable resistance layer that are sequentially stacked, wherein a side surface of the variable resistance layer is perpendicular to a top surface of the substrate or inclined to be gradually wider toward an upper portion of the variable resistance layer, and wherein the plurality of first memory cells have a side surface slope such that a width of the first plurality of memory cells gradually decreases toward an upper portion of the plurality of first memory cells.

According to other aspects, this disclosure is directed to a memory device comprising: a substrate; a first electrode line layer including first electrode lines extending on the substrate in a first direction and being spaced apart from each other; a second electrode line layer including second electrode lines extending on the first electrode line layer in a second direction that is different from the first direction and being spaced apart from each other; an integrated circuit layer formed on the substrate and disposed under the first electrode line layer; and a memory cell layer including first memory cells located at intersections of the first electrode lines and the second electrode lines, wherein each first memory cell includes a selection device, an intermediate electrode and a variable resistance layer sequentially stacked on one another, wherein a side surface of the variable resistance layer is perpendicular to a top surface of the substrate or inclined such that the variable resistance layer gradually widens toward an upper portion of the variable resistance layer, and wherein each of the first memory cells has a side surface having a side surface slope and a width that gradually decreases toward an upper portion of the first memory cell.

According to other aspects, this disclosure is directed to a memory device comprising: a substrate; a first electrode line layer including first electrode lines extending on the substrate in a first direction: a second electrode line layer including second electrode lines extending on the first electrode line layer in a second direction that is different from the first direction; an integrated circuit layer formed on the substrate and disposed under the first electrode line layer; a memory cell layer including first memory cells located at intersections of the first electrode lines and the second electrode lines; and a first insulating layer extending in the first direction and disposed between the first electrode lines, wherein each first memory cell includes a selection device, an intermediate electrode, and a variable resistance layer sequentially stacked on one another, wherein a side surface of the variable resistance layer is perpendicular to a top surface of the substrate or inclined such that the variable resistance layer gradually widens toward an upper portion of the variable resistance layer, and wherein each first memory cell has a side surface with a width that gradually decreases toward an upper portion of the first memory cell.

BRIEF DESCRIPTION OF THE DRAWINGS

The disclosed embodiments will be more clearly understood from the following detailed description taken in conjunction with the accompanying drawings in which.

DETAILED DESCRIPTION OF THE EMBODIMENTS

Figure 1:
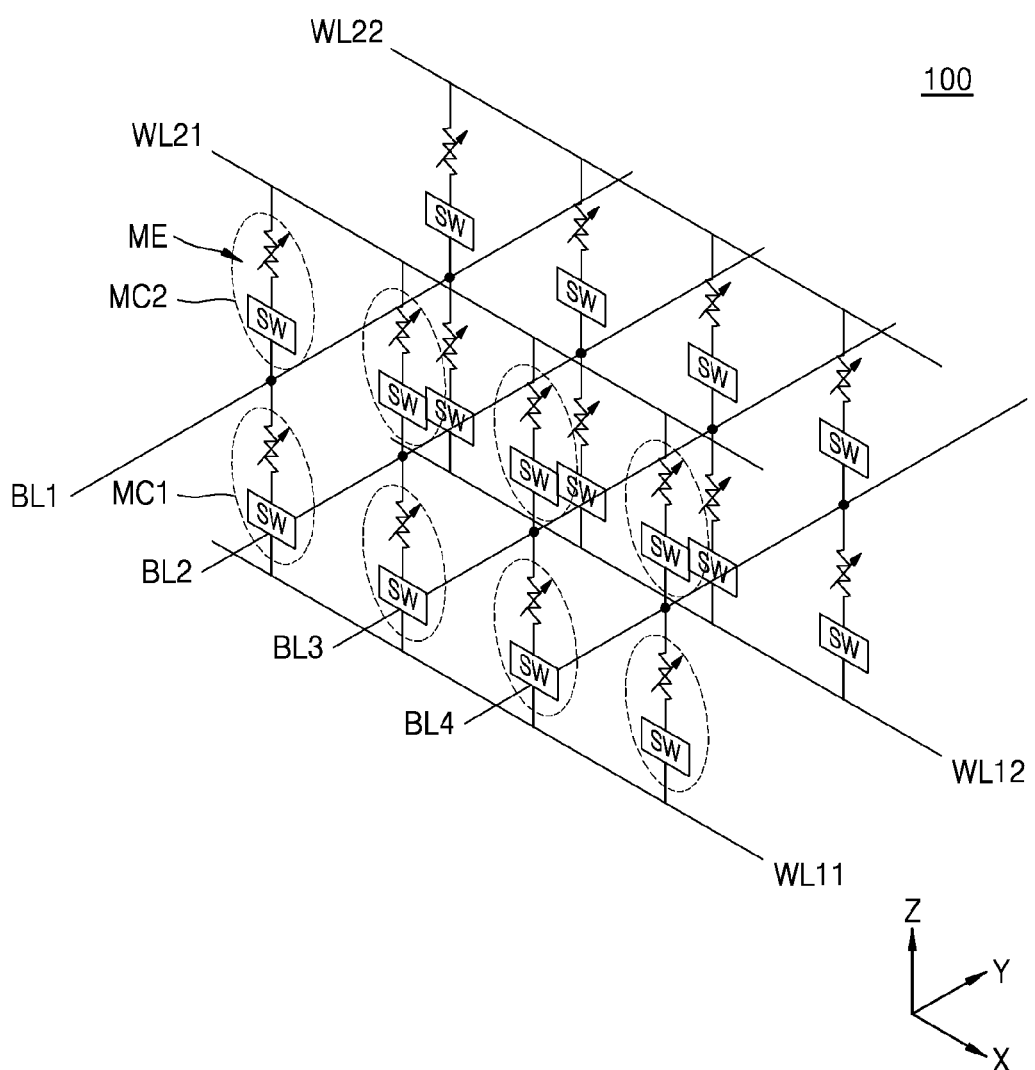
FIG. 1 is an circuit diagram of a memory device according to an exemplary embodiment.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

As used herein, a semiconductor device may refer to any of the various devices disclosed herein, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Embodiments describe a case in which a plurality of common bit lines are interposed between a plurality of lower word lines and a plurality of upper word lines in a direction perpendicular to a top surface of a substrate, but the disclosed concepts are not limited thereto. For example, in addition to the embodiments described herein, a plurality of common word lines may be interposed between a plurality of lower bit lines and a plurality of upper bit lines in a direction perpendicular to a top surface of a substrate. As another example, a plurality of upper bit lines may be located on a plurality of common word lines such that a plurality of common bit lines are interposed between a plurality of lower word lines and the plurality of common word lines in a direction perpendicular to a top surface of a substrate, and the plurality of common word lines are interposed between the plurality of common bit lines and the plurality of upper bit lines in the direction perpendicular to the top surface of the substrate. In addition, it will be understood by one of ordinary skill in the art that various other embodiments may be derived without departing from the spirit and scope of the disclosed concepts.

FIG. 1 is an equivalent circuit diagram of a memory device 100 according to an exemplary embodiment.

Referring to FIG. 1, the memory device 100 may include lower word lines WL11 and WL12 and upper word lines WL21 and WL22. The lower word lines WL11 and WL12 may extend in a first direction (i.e., X direction in FIG. 1) and be spaced apart from each other in a second direction (i.e., Y direction in FIG. 1) perpendicular to the first direction. The upper word lines WL21 and WL22 may extend in the first direction (i.e., the X direction), be spaced apart from each other in a second direction (i.e., the Y direction) perpendicular to the first direction, and also be spaced apart from the lower word lines WL11 and WL12 in a third direction (i.e., Z direction in FIG. 1) perpendicular to the first direction. Also, the memory device 100 may include common bit lines BL1, BL2, BL3, and BL4 and a plurality of memory cells (e.g., a first memory cell MC1, a second memory cell MC2, etc.). The common bit lines BL1, BL2, BL3, and BL4 may extend in the second direction (i.e., the Y direction) and be spaced apart from each of the upper word lines WL21 and WL22 and the lower word lines WL11 and WL12 in the third direction (i.e., the Z direction).

The first and second memory cells MC1 and MC2 may be respectively disposed between the common bit lines BL1, BL2, BL3, and BL4 and the lower word lines WL11 and WL12 and between the common bit lines BL1, BL2, BL3, and BL4 and the upper word lines WL21 and WL22. Specifically, the first memory cells MC1 may be located at an intersection between the common bit lines BL1, BL2, BL3, and BL4 and the lower word lines WL11 and WL12 and include a variable resistance layer ME configured to store information and a selection device SW configured to select a memory cell. Also, the second memory cells MC2 may be located at an intersection between the common bit lines BL1, BL2, BL3, and BL4 and the upper word lines WL21 and WL22 and include a variable resistance layer ME configured to store information and a selection device SW configured to select a memory cell. The selection device SW also may be referred to as a switching device or an access device.

The first memory cells MC1 and the second memory cells MC2 may be disposed with the same structure as each other along the third direction. As shown in FIG. 1, in the first memory cell MC1 disposed between the lower word lines WL11 and the common bit lines BL1, the selection device SW may be electrically connected to the lower word line WL11 and the variable resistance layer ME may be electrically connected to the common bit lines BL1. The variable resistance layer ME and the selection device SW may be connected to each other in series. Also, in the second memory cell MC2 disposed between the upper word lines WL21 and the common bit lines BL1, the variable resistance layer ME may be electrically connected to the upper word line WL21 and the selection device SW may be electrically connected to the common bit line BL1. The variable resistance layer ME and the selection device SW may be connected to each other in series. However, the disclosed concepts are not limited thereto. Unlike shown in FIG. 1, in some embodiments, in each of the first memory cells MC1 and the second memory cells MC2, each position of the selection device SW and the variable resistance layer ME may be mutually changed to each other. In addition, the first memory cells MC1 and the second memory cells MC2 may have symmetrical structures to each other with respect to the common bit lines BL1, BL2, BL3, and BL4 in a third direction (e.g., the Z direction). For example, in the first memory cell MC1, the variable resistance layer ME may be connected to the lower word line WL11 and the selection device SW may be connected to the common bit line BL1. Also, in the second memory cell MC2, the variable resistance layer ME may be connected to the upper word line WL21 and the selection device SW may be connected to the common bit line BL1. Accordingly, the first memory cell MC1 and the second memory cell MC2 may be disposed symmetrically to each other with respect to the common bit line BL1.

Hereinafter, a method of operating the memory device 100 will be described.

For example, a voltage may be applied to the variable resistance layer ME of the first memory cells MC1 or the second memory cells MC2 through the word lines WL11, WL12, WL21, and WL22 and the common bit lines BL1, BL2, BL3, and BL4 so that a current may flow into the variable resistance layer ME. For example, the variable resistance layer ME may include a phase-change material layer, which is reversibly shifted between a first state and a second state. However, the variable resistance layer ME is not limited thereto, and the variable resistance layer ME may include any variable resistor of which a resistance varies according to an applied voltage. For example, a resistance of the variable resistance layer ME may be reversibly shifted between the first state and the second state in response to a voltage applied to the variable resistance layer ME of one of the first and second memory cells MC1 and MC2. In some embodiments, the voltage may be applied to a selected one of the first and second memory cells MC1 and MC2.

Digital data (e.g., "0" or "1") may be stored in the first and second memory cells MC1 and MC2 or may be erased from the first and second memory cells MC and MC2 depending on a change in resistance of the variable resistance layer ME. For example, a high-resistance state "0" and a low-resistance state "1" may be written as data in the first and second memory cells MC1 and MC2. Here, an operation of changing a high-resistance state "0" into a low-resistance state "1" may be referred to as a "set operation", and an operation of changing a low-resistance state "1" into a high-resistance state "0" may be referred to as a "reset operation". However, digital data stored in the first and second memory cells MC1 and MC2 according to an embodiment are not limited to the high-resistance state "0" and the low-resistance state "1". Various resistance states may be stored in the first and second memory cells MC1 and MC2.

An arbitrary one of the first and second memory cells MC1 and MC2 may be accessed by selecting the corresponding lower and upper word lines WL11, WL12, WL21, and WL22 and the common bit lines BL1, BL2, BL3, and BL4. Also, by applying a predetermined signal between the lower and upper word lines WL11, WL12, WL21, and WL22 and the common bit lines BL1, BL2, BL3, and BL4, the first and second memory cells MC1 and MC2 may be programmed. In addition, current may be measured through the common bit lines BL1, BL2, BL3, and BL4 so that information corresponding to a resistance of a variable resistance layer of one selected out of the first and second memory cells MC1 and MC2 may be read.

Figure 2:
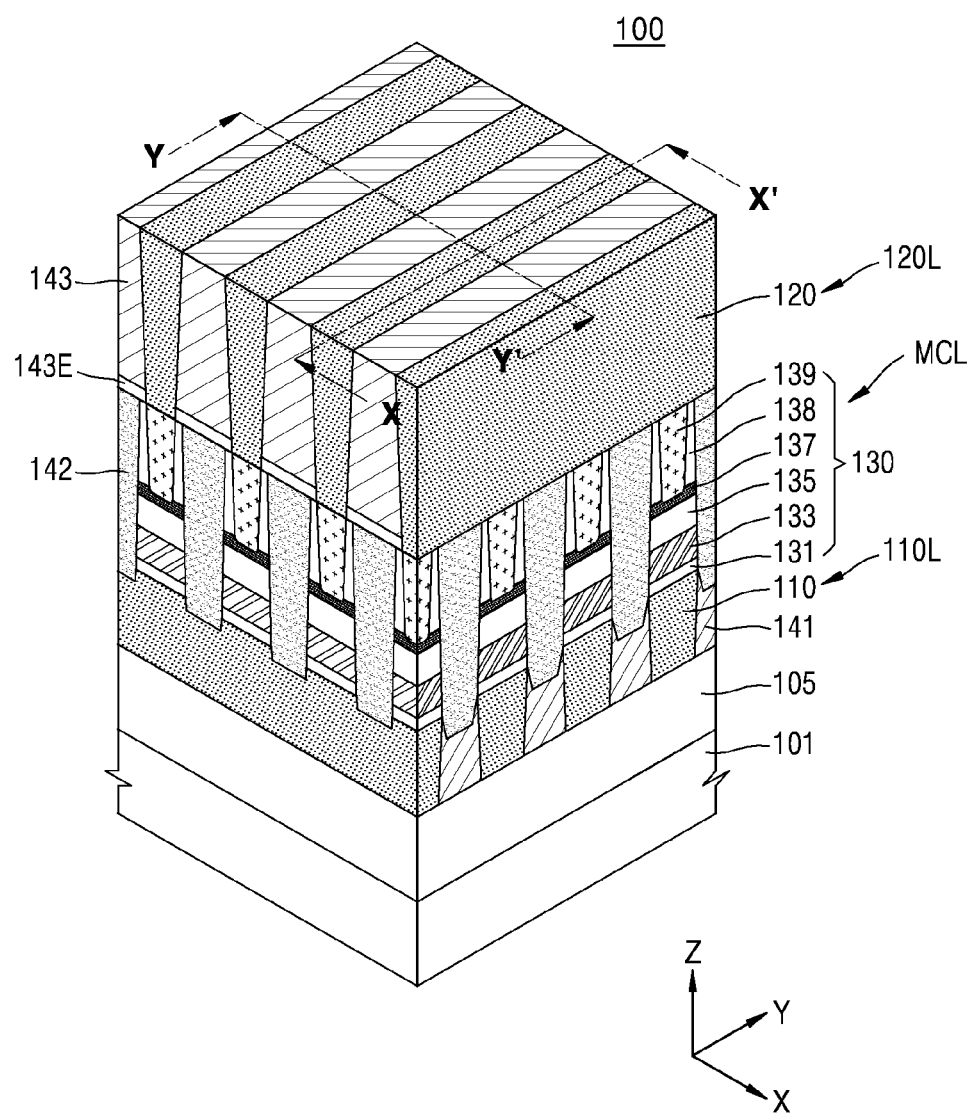
FIG. 2 is a perspective view of a memory device according to an exemplary embodiment.
Figure 3:
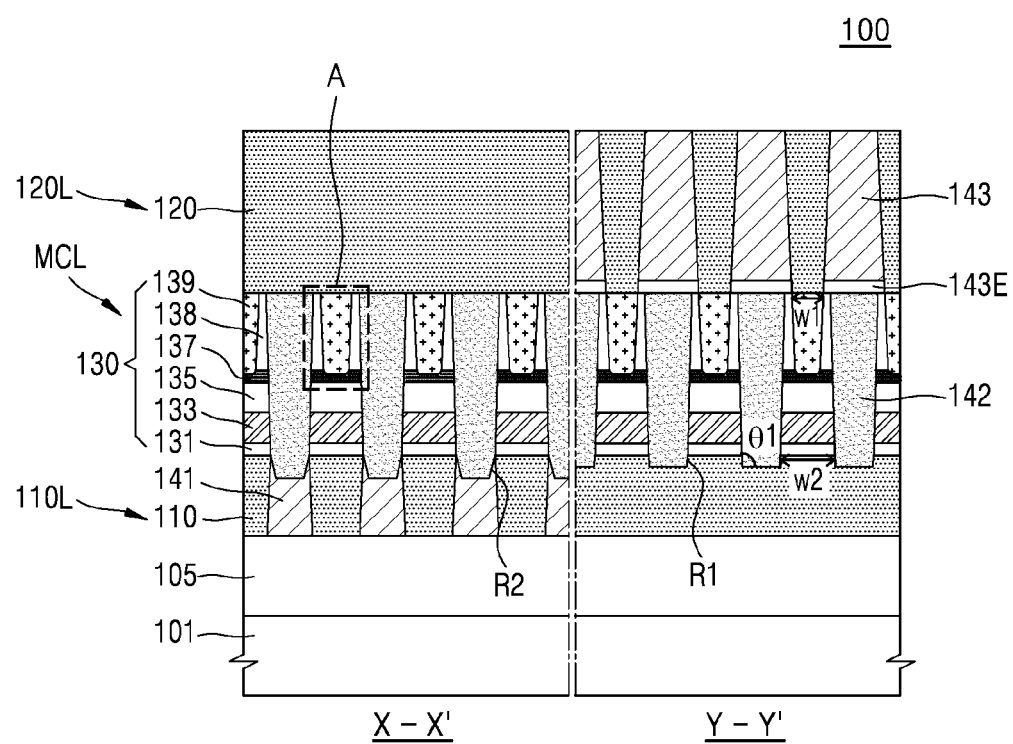
FIG. 3 is a cross-sectional view taken along lines X-X' and Y-Y' of FIG. 2.
Figure 4:
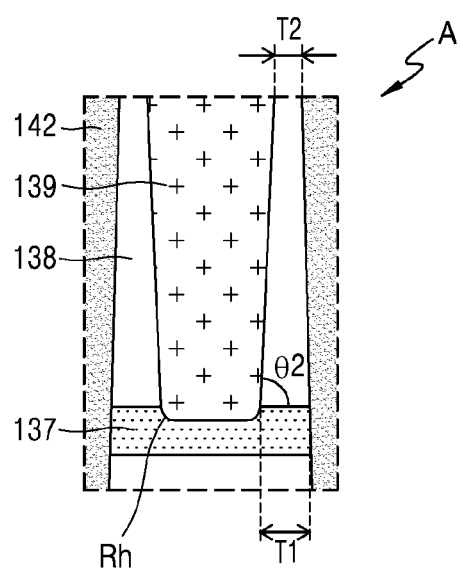
FIG. 4 is an enlarged cross-sectional view of a portion 'A' of FIG. 3.

FIG. 2 is a perspective view of a memory device 100 according to an embodiment. FIG. 3 is a cross-sectional view taken along lines X-X' and Y-Y' of FIG. 2. FIG. 4 is an enlarged cross-sectional view of a portion 'A' of FIG. 3.

Referring to FIGS. 2 to 4, the memory device 100 may include a first electrode line layer 110L, a second electrode line layer 120L and a memory cell layer MCL on a substrate 101.

As shown in the drawings, an interlayer insulating layer 105 may be disposed on the substrate 101. The interlayer insulating layer 105 may be formed of oxide, such as silicon oxide, or nitride, such as silicon nitride, and may serve to electrically separate the first electrode line layer 110L from the substrate 101, insulating the first electrode line layer 110L and the substrate 101 from one another.

Although in the memory device 100 according to one exemplary embodiment, the interlayer insulating layer 105 is disposed on the substrate 101, it is only an illustration. For example, in some embodiments, an integrated circuit layer may be disposed on the substrate 101, and memory cells may be disposed on the integrated circuit layer. The integrated circuit layer may include a peripheral circuit and/or core circuit for operation of the memory cells. For reference, a structure in which the memory cells are disposed on the integrated circuit layer may be referred to as a COP (cell on peripheral) structure.

The first electrode line layer 110L may include a plurality of first electrode lines 110, which extend parallel to one another in the first direction (X direction). The second electrode line layer 120L may include a plurality of second electrode lines 120, which extend parallel to one another in the second direction (Y direction). In terms of an operation of the memory device, in some embodiments, the plurality of first electrode lines 110 may correspond to word lines and the plurality of second electrode lines 120 may correspond to bit lines. In other embodiments, the plurality of first electrode lines 110 may correspond to bit lines and the plurality of second electrode lines 120 may correspond to word lines.

Each of the plurality of first electrode lines 110 and the plurality of second electrode lines 120 may include a metal, conductive metal nitride, conductive metal oxide or a combination thereof. For example, each of the plurality of first electrode lines 110 and the plurality of second electrode lines 120 may include tungsten (W), tungsten nitride (WN), gold (Au), silver (Ag), copper (Cu), aluminum (Al), titanium aluminum nitride (TiAN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof or a combination thereof. Also, each of the plurality of first electrode lines 110 and the plurality of second electrode lines 120 may include a metal layer and a conductive barrier layer covering at least a portion of the metal layer. The conductive barrier layer may include, for example, titanium (Ti), titanium nitride (TiN), tantalum (Ta), tantalum nitride (TaN), or a combination thereof.

In the memory device 100 according to the embodiment, the plurality of first electrode lines 110 and the plurality of second electrode lines 120 may be formed through a damascene process or an embossing and etching process. Also, the plurality of first electrode lines 110 and the plurality of second electrode lines 120 may be formed through a process different from a process for forming memory cells 130. In some embodiments, the plurality of first electrode lines 110 may be formed together with the memory cells 130. More detailed explanation for this will be described in FIG. 7.

When the plurality of first electrode lines 110 and the plurality of second electrode lines 120 are formed by a damascene process, each of the plurality of first electrode lines 110 and the plurality of second electrode lines 120 may have a width which is gradually decreased toward its lower portion. For example, the widths of the plurality of first electrode lines 110 and the plurality of second electrode lines 120 may increase as the plurality of first electrode lines 110 and the plurality of second electrode lines 120 extend away from the substrate 101 in the third direction (e.g., the Z direction). By contrast, when the plurality of first electrode lines 110 and the plurality of second electrode lines 120 are formed by an embossing and etching process, each of the plurality of first electrode lines 110 and the plurality of second electrode lines 120 may have a width which is gradually increased toward its lower portion. For example, the widths of the plurality of first electrode lines 110 and the plurality of second electrode lines 120 may decrease as the plurality of first electrode lines 110 and the plurality of second electrode lines 120 extend away from the substrate 101 in the third direction (e.g., the Z direction). For reference, the plurality of first electrode lines 110 and the plurality of second electrode lines 120 shown in FIGS. 2 and 3 may be formed by a damascene process.

In general, in a semiconductor device, structures may be formed by an embossing and etching process or damascene process. When the structures are formed by the embossing and etching process, a respective bottom width of the structures (e.g., the width of the structures nearer to the substrate 101) may be greater than a respective top width thereof (e.g., the width of the structures farther from the substrate 101). When the structures are formed by the damascene process, a respective top width of the structures may be greater than a respective bottom width thereof. In addition, in the case where a structure is formed by a damascene process, the corresponding structure may be referred to as a damascene structure.

More specifically, in the case of an embossing and etching process, a material layer constituting such a structure may be formed and then, the material layer may be dry-etched using a mask pattern as an etch mask so as to form the structure. Due to the nature of the etching process, the structure may be generally tapered with a bottom width being greater than a top width. On the other hand, in the case of a damascene process, an interlayer insulating layer or sacrificial layer may be formed and then, the interlayer insulating layer or sacrificial layer may be dry-etched using a mask pattern as an etch mask so as to form a trench. Thereafter, the trench may be filled with a material layer constituting such a structure, thereby forming the structure. Due to the nature of the etching process, the trench may be generally tapered with a top width being greater than a bottom width. Accordingly, the structure, which is formed by filling the trench with the material layer, may also have a top width greater than a bottom width.

Meanwhile, in the case of an embossing and etching process or damascene process, a side surface of the structure may be formed to be substantially perpendicular to a top surface of the substrate 101 by precisely controlling etching parameters. Thus, there may be minimal or almost no width difference in the lower and upper portions of the structure. Also, in the memory device 100 according to the embodiment, side surfaces of the first electrode lines 110 and the second electrode lines 120 may be formed to be substantially perpendicular to a top surface of the substrate 101 by precisely controlling etching parameters.

A plurality of first recesses R1 may be formed in an upper portion of each of the plurality of first electrode lines 110 and between memory cells 130 in the first direction (X direction). As shown in the drawings, the plurality of first recesses R1 may be filled with a lower portion of a second insulating layer 142 which is disposed between the memory cells 130. The first recesses R1 may be formed by excessively etching the upper portion of the first electrode line 110 when the memory cells 130 are formed by an embossing and etching process. However, by precisely controlling etching parameters (i.e., not excessively etching), the first recesses R1 may not be fully formed.

The memory cell layer MCL may include a plurality of first memory cells 130 (e.g., MC1 in FIG. 1) spaced apart from each other in the first and second directions (X and Y directions). As shown in the drawings, the first electrode lines 110 and the second electrode lines 120 may intersect or cross over each other. The memory cells 130 may be located at intersections between the first electrode lines 110 and the second electrode lines 120, respectively.

The memory cells 130 may be formed from pillar structures having a rectangular shape. However, the structure of memory cell 130 is not limited to the rectangular shape. For example, the memory cells 130 may have various pillar structures such as a circular pillar shape, an elliptical pillar shape, a polygonal pillar shape, etc. As shown in the drawings, in the memory device 100, the memory cell 130 may basically have a lower portion wider than an upper portion thereof. For example, a width of the memory cell 130 at a portion nearer to the substrate 101 may be narrower than a width of the memory cell 130 at a portion farther from the substrate 101. Accordingly, a sidewall of the memory cell 130 may have a first angle Θ1 of more than 90 with respect to a top surface of the substrate 101. For example, the memory cells 130 may be formed through an embossing and etching process as a whole. In some embodiments, as discussed above, in the embossing and etching process, the sidewall of the memory cell 130 may be formed to be substantially perpendicular to the top surface of the substrate 101 by precisely controlling etching parameters.

The variable resistance layer 139, from among material layers that make up the memory cell 130, may be formed by a damascene process using a hard mask or a sacrificial layer. Accordingly, due to the damascene process, the variable resistance layer 139 may be self-aligned to the material layers thereunder. The material layers may include, for example, a lower electrode 131, a selection device 133, an intermediate electrode 135 and a heating electrode 137. A method of forming the memory cells 130 will be described in detail in FIGS. 25A to 25P.

Each of the memory cells 130 may include a lower electrode 131, a selection device 133, an intermediate electrode 135, a heating electrode 137 and a variable resistance layer 139.

In some embodiments, the variable resistance layer 139 (ME in FIG. 1) may include a phase-change material which is reversibly changed between an amorphous phase and a crystalline phase depending on a heating time. For example, a phase of the variable resistance layer 139 may be reversibly changed due to Joule heat generated by a voltage applied to both ends of the variable resistance layer 139, and the variable resistance layer 139 may include a material of which a resistance is changed due to a change in phase of the variable resistance layer 139. Specifically, the phase-change material may be put into a high-resistance state in an amorphous phase and put into a low-resistance state in a crystalline phase. Data may be stored in the variable resistance layer 139 by defining the high-resistance state as data "0" and by defining the low-resistance state as data "1".

In some embodiments, the variable resistance layer 139 may include one or more elements from VI group of the periodic table (i.e., chalcogenides) and optionally one or more chemical modifiers from III group, IV group or V group. For example, the variable resistance layer 139 may include Ge—Sb—Te (GST). As used herein, a chemical composition notation represented by a hyphen (-) represents elements contained in a specific mixture or compound, and serves to represent all chemical structures containing the represented elements. For example, the Ge—Sb—Te material may include $Ge_2Sb_2Te_5$, $Ge_2Sb_2Te_7$, $GeiSb_2Te_4$, or $GeiSb_4Te_7$.

The variable resistance layer 139 may include a variety of phase-change materials in addition to the Ge—Sb—Te material. For example, the variable resistance layer 139 may include at least one of Ge—Te, Sb—Te, In—Se, Ga—Sb, In—Sb, As—Te, Al—Te, Bi—Sb—Te(BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, In—Sn—Sb—Te, As—Ge—Sb—Te or a combination thereof.

Each element constituting the variable resistance layer 139 may have a variety of stoichiometric ratios. A crystallization temperature, a melting temperature, a phase change rate depending on activation energy for crystallization, and a data retention characteristic of the variable resistance layer 139 may be controlled based on the stoichiometric ratio of each element.

The variable resistance layer 139 may further include at least one of impurities such as carbon (C), nitrogen (N), silicon (Si), oxygen (O), bismuth (Bi), and tin (Sn). An operating current of the memory device 100 may be changed by introduction of the impurities. Also, the variable resistance layer 139 may further include a metal. For example, the variable resistance layer 139 may include at least one of aluminium (Al), gallium (Ga), zinc (Zn), titanium (Ti), chromium(Cr), manganese (Mn), iron (Fe), cobalt (Co), nickel (Ni), molybdenum (Mo), ruthenium (Ru), palladium (Pa), hafnium (Hf), tantalum (Ta), iridium (Ir), platinum (Pt), zirconium (Zr), thallium (Tl), lead (Pb), and polonium (Po). The metal may increase an electrical conductivity and a thermal conductivity of the variable resistance layer 139 and thus a crystallization rate may be enhanced, thereby increasing a set programming speed. The metal may improve a data retention characteristic of the variable resistance layer 139.

The variable resistance layer 139 may include a multi-layered structure in which two or more layers having different physical properties are stacked. The number or thicknesses of the multiple layers constituting the multi-layered structure may be freely selected depending on the purpose of use. A barrier layer may be further interposed between the multiple layers constituting the multi-layered structure. The barrier layer may serve to prevent diffusion of a material between the multiple layers. When a subsequent layer of the multiple layers is formed, the barrier layer may reduce diffusion of a material contained a preceding layer of the multiple layers.

In addition, the variable resistance layer 139 may include a super-lattice structure which is alternately stacked with a plurality of layers including different materials from each other. For example, the variable resistance layer 139 may include a stack structure in which a first layer containing Ge—Te and a second layer containing Sb—Te are alternately stacked. However, the first layer and the second layer are not limited thereto, and may each include various materials described above.

The phase change material as the variable resistance layer 139 may be described above, but aspects of the disclosed concepts are not limited thereto. The variable resistance layer 139 of the memory device 100 may include various materials having a resistance change property.

In some embodiments, in the case where the variable resistance layer 139 includes a transition metal oxide, the memory device 100 may be a resistive random access memory (ReRAM) device. In the variable resistance layer 139 including the transition metal oxide, at least one electrical path may be created or vanished (e.g., removed) by a programming operation. The variable resistance layer 139 may have a low resistance value when the electrical path is created and may have a high resistance value when the electrical path is vanished. By using a difference in the resistance values, the memory device 100 may store data.

In the case where the variable resistance layer 139 includes the transition metal oxide, the transition metal oxide may include at least one of Ta, Zr, Ti, Hf, Mn, Y, Ni, Co, Zn, Nb, Cu, Fe, and Cr. For example, the variable resistance layer 139 including the transition metal oxide may include a single layer or multiple layers, formed of at least one of $Ta_2O_{5-x}$, $Zr_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above materials, the value x and the value y may be selected in a range of $0 \leq x \leq 1.5$ and $0 \leq y \leq 0.5$, respectively, but the embodiments are not limited thereto.

In other embodiments, for example in the case where the variable resistance layer 139 includes a magnetic tunnel junction (MTJ) structure including two electrodes formed of a magnetic material and a dielectric layer interposed between the two electrodes, the memory device 100 may be a magnetic random access memory (MRAM) device.

The two electrodes may be a magnetization pinned layer and a magnetization free layer, respectively, and the dielectric layer interposed therebetween may be a tunnel barrier layer. The magnetization pinned layer may have a pinned magnetization direction and the magnetization free layer may have a variable magnetization direction parallel or anti-parallel (e.g., any direction other than parallel) to the pinned magnetization direction of the magnetization pinned layer. The magnetization directions of the magnetization pinned layer and the magnetization free layer may be parallel to a surface of the tunnel barrier layer, but the embodiments are not limited thereto. For example, the magnetization directions of the magnetization pinned layer and the magnetization free layer may be perpendicular to the surface of the tunnel barrier layer.

In the case where the magnetization direction of the magnetization free layer is parallel to the magnetization direction of the magnetization pinned layer, the variable resistance layer 139 may have a first resistance value. Alternatively, in the case where the magnetization direction of the magnetization free layer is anti-parallel to the magnetization direction of the magnetization pinned layer, the variable resistance layer 139 may have a second resistance value. By using a difference between the first and second resistance values, the memory device 100 may store data. The magnetization direction of the magnetization free layer may be varied by spin torques of electrons in a programming current.

The magnetization pinned layer and the magnetization free layer may include a magnetic material. The magnetization pinned layer may further include an anti-ferromagnetic material which fixes a magnetization direction of a ferromagnetic material in the magnetization pinned layer. The tunnel barrier layer may include an oxide including at least one of Mg, Ti, Al, MgZn, and MgB, but the embodiments are not limited thereto.

The selection device 133 (SW in FIG. 1) may serve as a current control layer for controlling a current flow. The selection device 133 may include a material of which a resistance may vary according to a magnitude of a voltage applied to both ends of the selection device 133. In some embodiments, the selection device 133 may include a material having ovonic threshold switching (OTS) characteristics. For example, when a voltage lower than a threshold voltage $V_T$ is applied to the selection device 133, the selection device 133 may be in a high-resistance state in which current hardly flows (e.g., the flow is impeded) through the selection device 133. When a voltage higher than a threshold voltage $V_T$ is applied to the selection device 133, the selection device 133 may be in a low-resistance state and current may flow through the selection device 133. Also, when current flowing through the selection device 133 becomes smaller than a holding current, the selection device 133 may be changed into a high-resistance state. Meanwhile, the OTS characteristics of the selection device 133 will be described in detail later with reference to FIG. 5.

The selection device 133 may include a chalcogenide material as an OTS material.

The selection device 133 may include one or more elements (e.g., chalcogen elements) selected from VI group of the periodic table and one or more chemical modifiers optionally selected from III group, IV group and/or V group. The chalcogen elements contained in the selection device 133 may include sulphur (S), selenium (Se), and/or tellurium (Te). The chalcogen elements may be characterized by divalent bonding and the presence of lone pair electrons. The divalent bonding may lead to a formation of chain and ring structures upon combining the chalcogen elements to form chalcogenide materials and the lone pair electrons may provide a source of electrons for forming a conducting filament. Trivalent and tetravalent modifiers such as aluminium (Al), gallium (Ga), indium (In), germanium (Ge), tin (Sn), silicon (Si), phosphorus (P), arsenic (As) and antimony (Sb) may enter the chain and ring structures of chalcogen elements and may affect a structural rigidity of the chalcogenide materials. The structural rigidity of the chalcogenide materials may lead to a classification of the chalcogenide materials into one of either threshold switching materials or phase change materials, according to an ability to undergo crystallization or other structural rearrangements.

In some embodiments, the selection device 133 may include silicon (Si), tellurium (Te), arsenic (As), germanium (Ge), indium (In), or a combination thereof. For example, the selection device 133 may include a silicon (Si) concentration of about 14%, a tellurium (Te) concentration of about 39%, an arsenic (As) centration of about 37%, a germanium (Ge) concentration of about 9%, an indium (In) concentration of about 1%. Here, the percentages are atomic percentages which together total 100% of the atoms of the constituent elements.

In some embodiments, the selection device 133 may include silicon (Si), tellurium (Te), arsenic (As), germanium (Ge), sulphur (S), selenium (Se) or a combination thereof. For example, the selection device 133 may include a silicon (Si) concentration of about 5%, a tellurium (Te) concentration of about 34%, an arsenic (As) centration of about 28%, a germanium (Ge) concentration of about 11%, a sulphur (S) concentration of about 21%, and a selenium (Se) concentration of 1%.

In some embodiments, the selection device 133 may include tellurium (Te), arsenic (As), germanium (Ge), sulphur (S), selenium (Se), antimony (Sb), or a combination thereof. For example, the selection device 133 may include a tellurium (Te) concentration of about 21%, an arsenic (As) centration of about 10%, a germanium (Ge) concentration of about 15%, a sulphur (S) concentration of about 2%, a selenium (Se) concentration of 50%, and an antimony (Sb) concentration of about 2%.

In the memory device 100 according to the embodiment, the selection device 133 is not limited to OTS material but includes various materials capable of acting to select a device. For example, the selection device 133 may include a diode, a tunnel junction, a PNP diode, a bipolar junction transistor (BJT), or a mixed ionic-electronic conduction switch (MIEC).

The heating electrode 137 may be interposed between the intermediate electrode 135 and the variable resistance layer 139. The heating electrode 137 may serve to heat the variable resistance layer 139 in the set operation or the reset operation. The heating electrode 137 may include a conductive material that does not react with the variable layer 139 but generates sufficient heat to change a phase of the variable resistance layer 139. For example, the heating electrode 137 may radiate heat without chemically reacting with the variable layer 139.

In some embodiments, the heating electrode 137 may include a high-melting-point metal or a nitride thereof, such as titanium nitride (TiN), titanium silicon nitride (TiSiN), titanium aluminum nitride (TiAlN), tantalum silicon nitride (TaSiN), tantalum aluminum nitride (TaAlN), tantalum nitride (TaN), tungsten silicide (WSi), tungsten nitride (WN), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAN), molybdenum aluminum nitride (MoAN), titanium aluminide (TiAl), titanium oxynitride (TiON), titanium aluminum oxynitride (TiAlON), tungsten oxynitride (WON), tantalum oxynitride (TaON), carbon (C), silicon carbide (SiC), silicon carbon nitride (SiCN), carbon nitride (CN), titanium carbon nitride (TiCN), tantalum carbon nitride (TaCN) or a combination thereof. However, a material included in the heating electrode 137 is not limited thereto.

Each of the lower electrode 131 and the intermediate electrode 135 may be formed of a conductive material that functions as a current passage to allow electrical current to flow through the lower electrode 131 and the intermediate electrode 135. For example, each of the lower electrode 131 and the intermediate electrode 135 may include a metal, a conductive metal nitride, a conductive metal oxide or a combination thereof. Also, each of the lower electrode 131 and the intermediate electrode 135 may include a titanium nitride (TiN) layer but the disclosed concepts are not limited thereto.

In some embodiments, each of the lower electrode 131 and the intermediate electrode 135 may include a conductive layer including a metal or a conductive metal nitride and at least one conductive barrier layer covering at least a portion of the conductive layer. The conductive barrier layer may include a metal oxide, a metal nitride or a combination thereof but is not limited thereto.

Each of the memory cells 130 may include a spacer 138 surrounding the variable resistance layer 139. An outer side surface of the spacer 138 may constitute a portion of side surface of the memory cell 130. The spacer 138 may protect the variable resistance layer 139.

Also, a horizontal cross-sectional area of the variable resistance layer 139 may be adjusted by adjusting a thickness of the spacer 138. Accordingly, a contact area between the variable resistance layer 139 and the heating electrode 137 may be adjusted depending on the thickness of the spacer 138. For example, the spacer 138 may include an oxide such as a silicon oxide ($SiO_2$) or an aluminium oxide ($Al_2O_3$), a nitride such as a silicon nitride ($SiN_4$) or an oxynitride such as a silicon oxynitride.

When a damascene process is performed to form the variable resistance layer 139, a material layer for a spacer may be deposited with a uniform thickness on an inside of a trench and on an insulating layer, and then, the spacer 138 may be formed by leaving the material layer on only sidewalls of the trench through an anisotropic etching. The material layer for a spacer may be conformally formed by using thermal and/or plasma chemical vapor deposition (CVD), atomic layer deposition (ALD), or any other type of deposition method. After forming the spacer 138, a remaining space of the trench may be filled with the variable resistance layer 139.

As shown in FIG. 4, the spacer 138 may have a structure in which an upper portion is thin and a lower portion is thick. For example, the spacer 138 may have a first thickness T1 at a lower end portion nearer the substrate 101 and have a second thickness T2 thinner than the first thickness T1 at an upper end portion further from the substrate 101. This is due to characteristics of the anisotropic etching. That is, when the spacer 138 is formed through an anisotropic etching, an amount of etching of the upper portion may be more than an amount of etching of the lower portion. Due to the structure of the spacer 138, sidewalls of the variable resistance layer 139 surrounded by the spacer 138 may have a second angle Θ2 which is less than or equal to 90° with respect to a top surface of the heating electrode 137 or the substrate 101. Also, with more precise adjustment to the anisotropic etching to form the spacer 138, sidewalls of the variable resistance layer 139 may be substantially perpendicular to a top surface of the heating electrode 137.

As described above, in the case where a structure is formed by a damascene process, a bottom width of the structure may be greater than a top width of the structure. However, in the memory device 100 according to the embodiment, although the variable resistance layer 139 is formed by a damascene process, a bottom width of the variable resistance layer 139 may be smaller than a top width of the variable resistance layer 139 depending on an angle of an inner sidewall of the spacer 138 formed on an inside of the trench. For example, when an angle 62 is less than or equal to 90 with respect to a top surface of the heating electrode 137 or the substrate 101, the bottom width of the variable resistance layer 139 may be smaller than a top width of the variable resistance layer 139. If the spacer 138 is not formed on the inside of the trench, a bottom width of the variable resistance layer 139 may be greater than a top width of the variable resistance layer 139. The structure of the variable resistance layer 139 will be described in detail later with reference to FIGS. 25A to 25P.

Meanwhile, a recess Rh may be formed on the top surface of the heating electrode 137 and the variable resistance layer 139 may contact with the heating electrode 137 by filling the recess Rh with the variable resistance layer 139. The recess Rh may be formed by removing a portion of an upper portion of the heating electrode 137 when the spacer 138 is formed on the inside of the trench through an anisotropic etching process.

A first insulating layer 141 may be disposed between the first electrode lines 110, and a second insulating layer 142 may be disposed between the memory cells 130 of the memory cell layer MCL. Also, a third insulating layer 143 may be disposed between the second electrode lines 120.

The first insulating layers 141 may extend between the first electrode lines 110 in the first direction (X direction) and may be formed in plural number to correspond to the first electrode lines 110. A second recess R2 may be formed on a top surface of each of the first insulating layers 141 to correspond between the memory cells 130 disposed in the second direction (Y direction). The second recess R2 may be filled with a lower portion of the second insulating layer 142 disposed between the memory cells 130. The second recess R2 may be formed by removing a portion of an upper portion of the first insulating layer 141 when the memory cells 130 are formed in an embossing and etching process. Meanwhile, when the memory cells 130 are formed in an embossing and etching process, an etched region may be filled with the second insulating layer 142. As shown in the drawings, the second recess R2 formed on the first insulating layer 141 may be formed deeper than the first recess R1 formed on the first electrode lines 110 such as a metal layer.

In some embodiments, the first insulating layer 141 and the second insulating layer 142 may be formed of the same materials. In such a case, the second recess R2 may be present only in concept, because the first insulating layer 141 and the second insulating layer 142 are not distinguished.

The second insulating layer 142 may serve to electrically separate the memory cells 130 from each other by being interposed between the memory cells 130, thereby insulating the memory cells 130 from one another. The memory cells 130 may be spaced apart from each other in the first direction and the second direction by the second insulating layer 142. The second insulating layer 142 may have an integral structure so that it remains connected across the first and second directions.

The third insulating layers 143 may extend between the second electrode lines 120 in the second direction (Y direction) and may be formed in plural number to correspond to the second electrode lines 120. An etch stop layer 143E may be interposed between the third insulating layer 143 and the second insulating layer 142. The etch stop layer 143E may serve to prevent the second insulating layer 142 from being unnecessarily etched away when the second electrode lines 120 are formed in a damascene process.

More specifically, in the case where both of the second insulating layer 142 and the third insulating layer 143 are formed of an oxide layer such as silicon oxide, when trenches are formed in the third insulating layer 143 to form the second electrode lines 120, the second insulating layer 142 may be removed by etching concurrently with the etching process for forming the third insulating layer 143. However, when the etch stop layer 143E is disposed on the second insulating layer 142, the etching may be stopped by the etch stop layer 143E. The etch stop layer 143E then may be etched using any suitable etching technique for removing the etch stop layer 143E. Accordingly, an etching of the second insulating layer 142, which is disposed under the third insulating layer 143, may be minimized. The etch stop layer 143E may be formed of a nitride layer such as silicon nitride. As described above, in some embodiments, the second insulating layer 142 and the third insulating layer 143 may be formed of an oxide layer, and the etch stop layer may be formed of a nitride layer. In other embodiments, the second insulating layer 142 and the third insulating layer 143 may be formed of a nitride layer, and the etch stop layer may be formed of an oxide layer.

The first to third insulating layers 141, 142 and 143 may be formed of the same materials, or at least one of them may be formed of a different material. For example, the first to third insulating layers 141, 142 and 143 may be formed of dielectric materials such as oxide, nitride or oxynitride, and may function to electrically separate elements from each other, insulating the elements one from another. Instead of the second insulating layer 142, air gaps (not shown) may be formed between the memory cells 130. When the air gaps are formed between the memory cells 130, an insulating liner (not shown) having a predetermined thickness may be formed between the air gaps and the memory cells 130.

The memory device 100 according to the embodiment may be formed using both an embossing and etching process and a damascene process. For example, material layers constituting a lower portion of the memory cell 130 may be formed by the embossing and etching process, and a variable resistance layer 139 constituting an upper portion of the memory cell 130 may be formed by the damascene process using an additional hard mask or sacrificial layer. When the variable resistance layer 139 is formed using the damascene process, etch-related damage may be substantially minimized. Accordingly, the memory cell 130 may be provided while minimizing damage of the variable resistance layer 139. Also, due to the damascene process, the variable resistance layer 139 may be self-aligned to the material layers that constitute a lower portion of the memory cell 130, thereby minimizing a misalignment margin.

Furthermore, when the variable resistance layer 139 is formed by the damascene process, a horizontal cross-sectional area of the variable resistance layer 139 may be adjusted by forming the spacer 138. Accordingly, a contact area between the variable resistance layer 139 and the heating electrode 137 may be adjusted.

Figure 5:
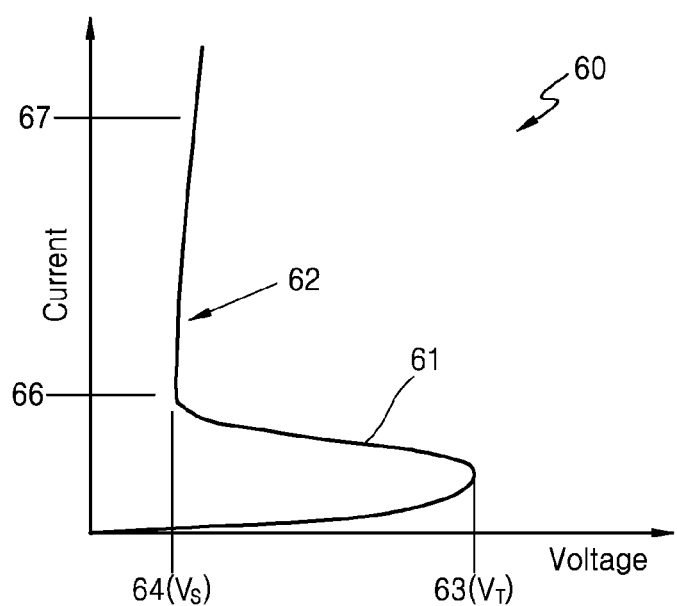
FIG. 5 is a schematic voltage-current (V-I) graph of an exemplary selection device having ovonic threshold switching (OTS) characteristics.

FIG. 5 is a schematic voltage-current (V-I) graph 60 of a selection device having ovonic threshold switching (OTS) characteristics.

Referring to FIG. 5, a first curve 61 shows current relative to voltage when current is not supplied to the selection device layer (i.e., the layer including the selection device 133). Here, the selection device 133 may serve as a switching device having a threshold voltage $V_T$ having a first voltage level 63. When a voltage gradually increases from the origin at which a voltage is 0 V and current is 0 A, current is barely supplied to the selection device 133 until the voltage reaches the threshold voltage $V_T$ (i.e., the first voltage level 63). When the voltage exceeds the threshold voltage $V_T$, current supplied to the selection device 133 sharply increases, and the voltage applied to the selection device 133 is reduced to a second voltage level 64 (or a saturated voltage $V_S$).

A second curve 62 shows current relative to a voltage while current is supplied to the selection device layer. As current flowing through the selection device 133 becomes higher than a first current level 66, a voltage applied to the selection device 133 increases to slightly more than the second voltage level 64. For example, while current flowing through the selection device 133 increases considerably from the first current level 66 to a second current level 67, the voltage applied to the selection device 133 may increase only slightly from the second voltage level 64. That is, once current is supplied through the selection device layer, the voltage applied to the selection device may be maintained at or near a level of the saturated voltage $V_S$ (i.e., the second voltage level 64). If current is reduced to a holding current level (i.e., the first current level 66) or lower, the selection device 133 may be shifted to a high-resistance state so that current may be effectively blocked until a voltage increases to the threshold voltage $V_T$.

FIGS. 6 to 17B are cross-sectional views of memory devices according to exemplary embodiments, and correspond to the cross-sectional view of FIG. 3. The redundant description described in FIGS. 2 and 3 will be omitted.

Figure 6:
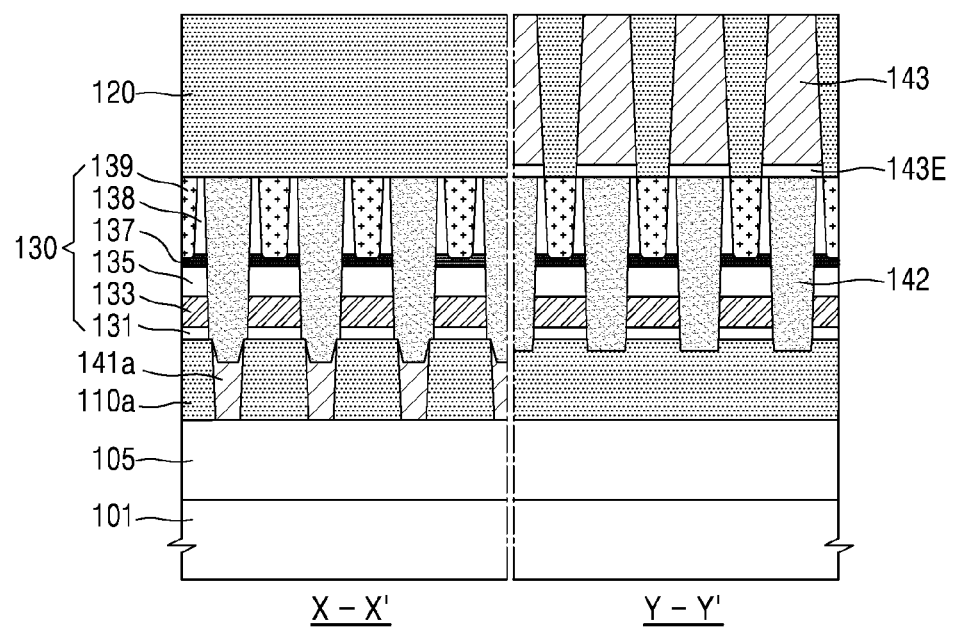
FIGS. 6 to 17B, which correspond to the cross-sectional view taken along lines X-X' and Y-Y' of FIG. 3, are cross-sectional views of memory devices according to exemplary embodiments.

Referring to FIG. 6, a memory device 100A according to an embodiment may be different from the memory device 100 shown in FIG. 3, in that each of first electrode lines 110a may have a structure that becomes gradually wider toward its lower portion. For example, in the memory device 100 shown in FIG. 3, due to a damascene process, each of the first electrode lines 110 may have an upper portion wider than its lower portion. But, in the memory device 100A according to the embodiment, due to an embossing and etching process, each of the first electrode lines 110a may have a lower portion wider than an upper portion thereof.

Since the first electrode line 110a has a structure that becomes gradually wider toward its lower portion, a first insulating layer 141a interposed between the first electrode lines 110a has a structure that becomes narrower toward its lower portion. For example, in FIG. 6, the width of the first insulating layer 141a at a portion nearer to the substrate 101 is narrower than the width of the first insulating layer 141a at a portion further from the substrate 101.

Figure 7:
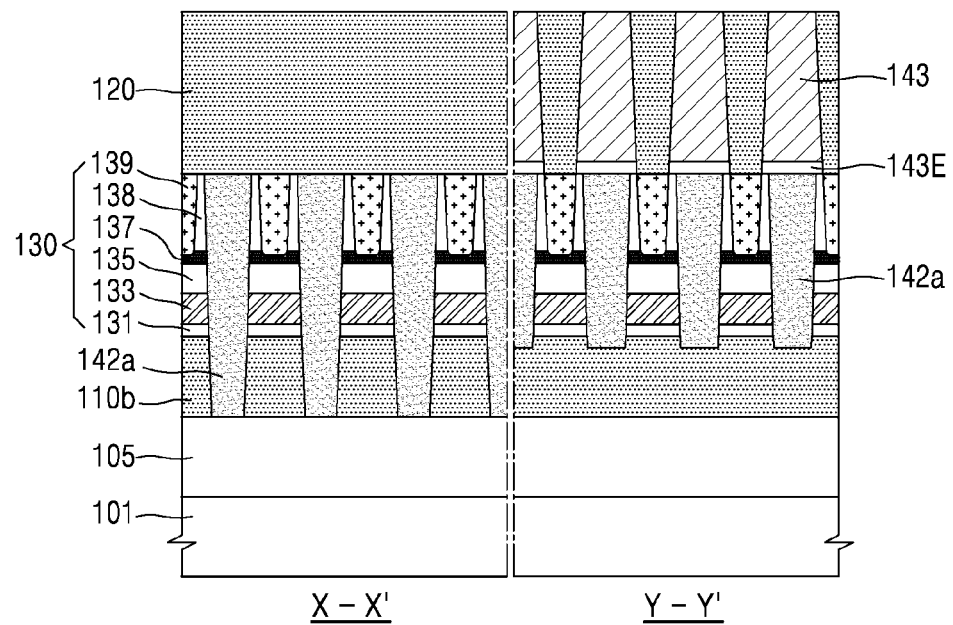

Referring to FIG. 7, a memory device 100B according to an embodiment may be different from the memory device 100 shown in FIG. 3, in that a side surface of a first electrode line 110b has substantially the same slope as a side surface of a memory cell 130 and they are continuously connected to each other without causing a stepped portion.

More specifically, in the memory device 100 shown in FIG. 3, the first electrode line 110 may have a lower portion narrower than an upper portion, and the memory cell 130 may have an upper portion narrower than a lower portion. Accordingly, a side surface of the first electrode line 110 has a slope that is different from a slope of the side surface of the memory cell 130. Also, the first electrode line 110 and the memory cell 130 may have a stepped portion at a contact area therebetween. For example, since the first electrode line 110 is formed by a damascene process, and the memory cell 130 is formed by an embossing and etching process, a top surface of the first electrode line 110 and a bottom surface of the memory cell 130 may have different horizontal cross-sectional areas from each other. Accordingly, a stepped portion may be caused at a contact area between the first electrode line 110 and the memory cell 130. For example, a contact area between the first electrode line 110 and the memory cell 130 may be uneven or discontinuous.

In the memory device 100B according to the embodiment, when the memory cell 130 is formed by an embossing and etching process, the first electrode line 110b may be formed together with the memory cell 130. That is, the first electrode line 110b and the memory cell 130 may be etched in the same embossing and etching process. Thus, a side surface of a first electrode line 110b has the same slope as a side surface of a memory cell 130, and they are continuously connected to each other without causing a stepped portion and without unevenness or discontinuity between the side surface of a first electrode line 110b and the side surface of a memory cell 130.

A second insulating layer 142a may be interposed between the memory cells 130 and between the first electrode lines 110b. For example, the second insulating layer 142a may correspond to the combined first insulating layer 141 and second insulating layer 142 in the memory device 100 shown in FIG. 3, or may correspond to the combined first insulating layer 141a and second insulating layer 142 in the memory device 100A shown in FIG. 6. Because the first electrode lines 110b are formed together with the memory cells 130, spaces between the memory cells 130 and between the first electrode lines 110b may be filled with the second insulating layer 142a in the same process.

Figure 8:
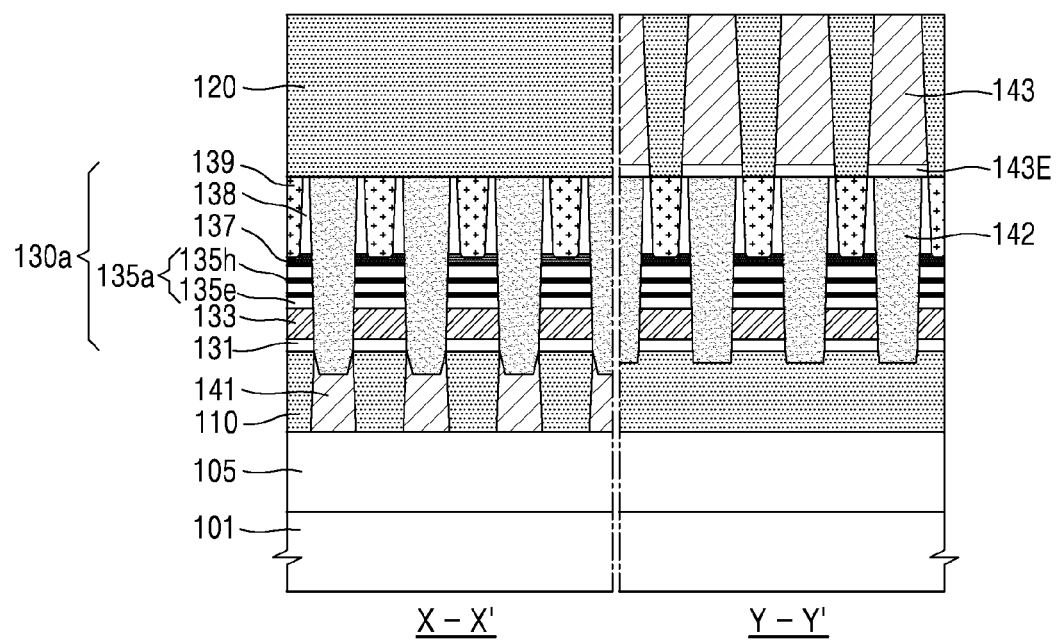

Referring to FIG. 8, a memory device 100C according to an embodiment may be different from the memory device 100 shown in FIG. 3, in that an intermediate electrode 135a of a memory cell 130a may include at least one thermal barrier thin layer 135h. More specifically, the intermediate electrode 135a may include an electrode thin layer 135e serving as an electrode and the thermal barrier thin layer 135h blocking heat transfer.

As shown in the drawing, when the intermediate electrode 135a includes a plurality of thermal barrier thin layers 135h, the intermediate electrode 135a may have a stack structure that is alternately stacked with the electrode thin layer 135e and the thermal barrier thin layer 135h. When the intermediate electrode 135a includes only one thermal barrier thin layer 135h, the thermal barrier thin layer 135h may be interposed between two electrode thin layers 135e.

Materials or functions of the electrode thin layer 135e may be the same as the materials and functions described for the lower electrode 131 and intermediate electrode 135 in FIGS. 2 and 3. The thermal barrier thin layer 135h may be formed of a material which has high electrical conductivity and low thermal conductivity to minimize heat transfer. The thermal barrier thin layer 135h may be formed to have a very thin or small thickness (several nm or lower). For example, the thermal barrier thin layer 135h may be formed of a conductive material such as carbon (C), carbon nitride (CN), titanium silicon nitride (TiSiN), and titanium aluminium nitride (TiAN).

In general, when a selection device 133 includes a material having OTS characteristics, the selection device 133, as described above, may include an amorphous chalcogenide material. However, as the memory device 100C is down-scaled, thicknesses and widths of a variable resistance layer 139, the selection device 133, a heating electrode 137, a lower electrode 131, and/or the intermediate electrode 135a and distances therebetween may be reduced. Accordingly, during a process of operating the memory device 100C, when a phase of the variable resistance layer 139 is changed due to heat generated by the heating electrode 137, the selection device 133 located adjacent to the heating electrode 137 may also be affected by the generated heat, and the selection device 133 may be degraded or damaged. For example, the selection device 133 may be partially crystallized due to heat generated by the heating electrode 137 adjacent to the selection device 133.

In the memory device 100C, the intermediate electrode 135a may be formed to have a greater thickness, so that heat generated by the heating electrode 137 may not be transmitted to the selection device 133. As shown in FIG. 8, the intermediate electrode 135a may be formed to have a thickness thicker than that of the lower electrode 131 to block heat-transfer from the heating electrode 137. For example, the intermediate electrode 135a may have a thickness of 10 to 100 nm. However, the thickness of the intermediate electrode 135a is not limited thereto.

Figure 9:
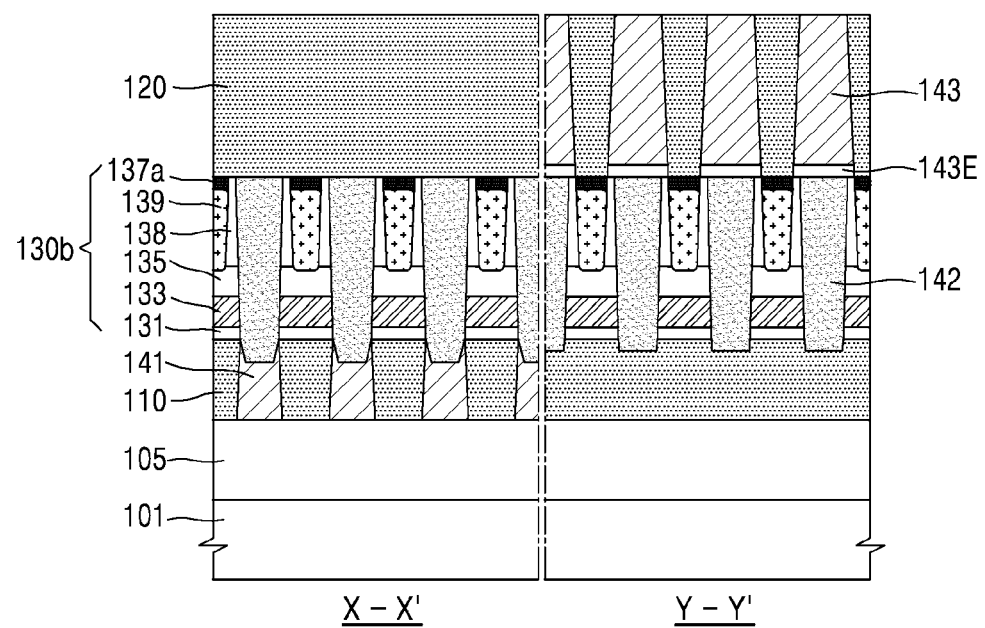

Referring to FIG. 9, a memory device 100D according to an embodiment may be different from the memory device 100 shown in FIG. 3, in that a heating electrode 137a may be interposed between a variable resistance layer 139 and second electrode lines 120. For example, in the memory device shown in FIG. 3, the heating electrode 137 may be interposed between the variable resistance layer 139 and the intermediate electrode 135 and disposed at a bottom portion of the variable resistance layer 139 or below the bottom portion of the variable resistance layer 139. Whereas, in the memory device 100D according the embodiment of FIG. 9, the heating electrode 137a may be interposed between the variable resistance layer 139 and the second electrode lines 120 and disposed on a top portion of the variable resistance layer 139. In some embodiments, the heating electrode 137a may serve not only to heat the variable resistance layer 139 but also to prevent damage of the variable resistance layer 139 during an etching process for forming the second electrode lines 120.

Also, a cross-sectional area of the heating electrode 137a may be different from that of the heating electrode 137 of the memory device 100 shown in FIG. 3. More specifically, in the memory device 100 shown in FIG. 3, and as further illustrated in the enlarged cross-sectional view provided in FIG. 4, the heating electrode 137 may have a cross-sectional area wider than the variable resistance layer 139 and the variable resistance layer 139 may be in contact with a portion of the heating electrode 137. In contrast, in the memory device 100D, the heating electrode 137a may have substantially the same cross-sectional area as the variable resistance layer 139 and be formed on the variable resistance layer 139. For example, cross-sectional width of the heating electrode 137a may be substantially the same as the cross-sectional width of the top portion of the variable resistance layer 139. The heating electrode 137a may be surrounded by the spacer 138. For example, the spacer 139 may surround the side surfaces of the heating electrode 137a.

When the heating electrode 137a is disposed on a top portion of the variable resistance layer 139, the heat transfer from the heating electrode 137a to the selection device 133 may be minimized because an intermediate electrode 135 and the variable resistance layer 139 are interposed between the heating electrode 137a and the selection device 133. In addition, in order to effectively block the heat transfer, the intermediate electrode 135 may be formed in thick thickness, or include at least one thermal barrier thin layer therein.

Figure 10:
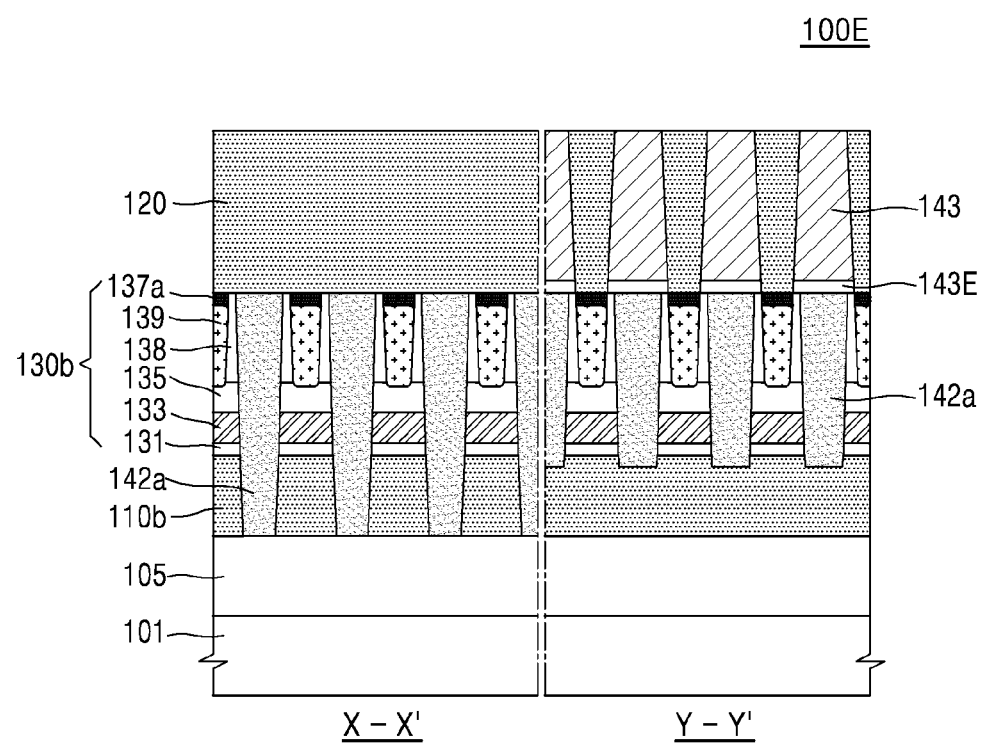

Referring to FIG. 10, a memory device 100E according to an embodiment may be similar to the memory device 100D shown in FIG. 9, in that a heating electrode 137a may be interposed between a variable resistance layer 139 and a second electrode line 120. However, in the memory device 100E according the embodiment of FIG. 10, a side surface of a first electrode line 110b has substantially the same slope as a side surface of a memory cell 130b and they are continuously connected to each other without causing a stepped portion or discontinuity. For example, in the memory device 100E according the embodiment, when the memory cell 130e is formed by an embossing and etching process, the first electrode line 110b may be also formed together with the memory cell 130e. Thus, the second insulating layer 142a of FIG. 10 may have the same structure as the second insulating layer 142a illustrated and described with reference to FIG. 7. That is, the second insulating layer 142a may be interposed between the memory cells 130b and also interposed between the first electrode lines 110b.

Figure 11:
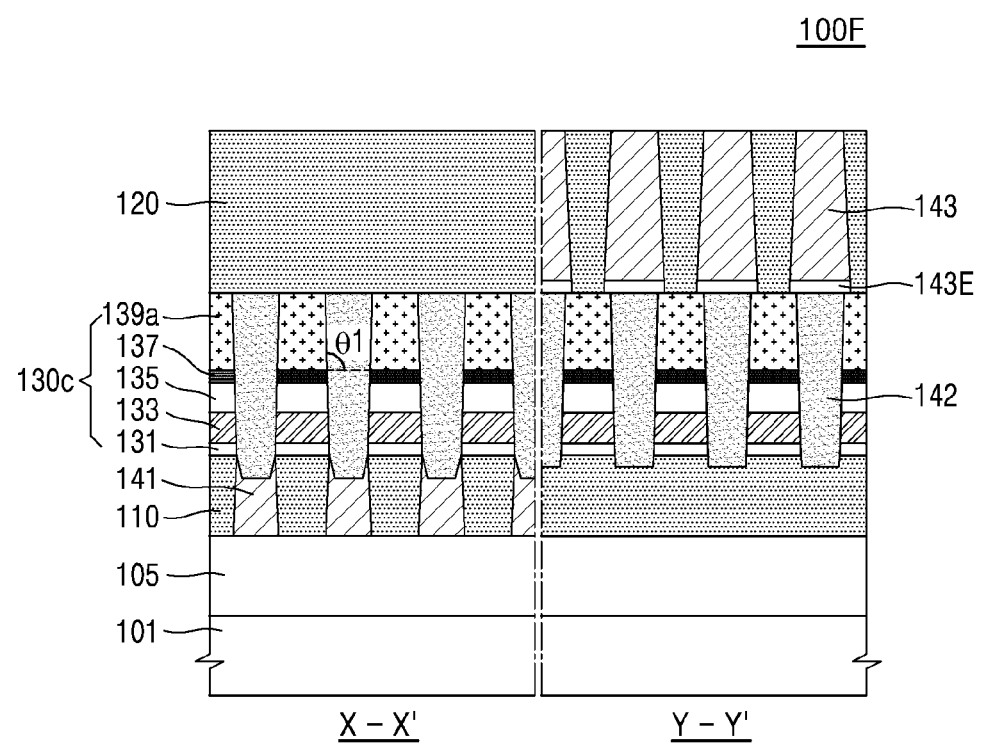

Referring to FIG. 11, a memory device 100F according to an embodiment may be different from the memory device 100 shown FIG. 3, in that in a memory cell 130c, a spacer may be not formed on a side surface of a variable resistance layer 139a. For example, the memory cells 130 shown in FIG. 3 may include the spacer 138 surrounding the variable resistance layer 139, and thus an outer side surface of the spacer 138 may constitute a portion of the side surface of the memory cell 130. In contrast, in the memory device 100F according to the embodiment of FIG. 11, the spacer may not be formed separately and the variable resistance layer 139a may be in direct contact with a second insulating layer 142. Accordingly, a side surface of the variable resistance layer 139a may constitute a portion of the side surface of the memory cell 130c. Due to the absence of the spacer, a horizontal cross-sectional area of the variable resistance layer 139a may be greater than that of the variable resistance layer 139 of each of the memory devices 100, 100A, 100B, 100C, 100D and 100E shown in FIGS. 3 and 6 to 10. For example, a cross-sectional width of the variable resistance layer 139a of FIG. 11 may be greater than the cross-sectional widths of the variable resistance layer 139 of FIGS. 3 and 6 to 10. Also, the variable resistance layer 139a may have substantially the same contact area with the heating electrode 137 disposed under the variable resistance layer 139a. For example, a bottom surface of the variable resistance layer 139a may extend across substantially the entire top surface of the heating electrode 137. Since the memory cell 130c becomes gradually wider toward its lower portion, the side surface of the variable resistance layer 139a may have a first angle 1 of more than 900 with respect to a top surface of the heating electrode 137 or the substrate 101. As described above, when the side surface of the memory cell 130c is formed to be substantially perpendicular to the top surface of the substrate 101 by controlling etching parameters, the side surface of the variable resistance layer 139a may be also formed to be substantially perpendicular to the top surface of the substrate 101.

In the memory device 100F of FIG. 11, unlike the memory devices 100, 100A, 100B, 100C, 100D and 100E of the embodiments of FIGS. 3 and 6 to 10, a decision to not form the spacer may made for varied reasons, such as, for example, when the variable resistance layer 139a does not need to be protected from damage, when an expansion of the contact area between the variable resistance layer 139a and the heating electrode 137 is needed (e.g., a larger or increased contact area), when a side slope of the memory cell 130c is formed to be almost perpendicular to the substrate 101, when a trench in which the memory cell 130c is formed has an excellent gap-filling characteristics, etc.

Figure 12:
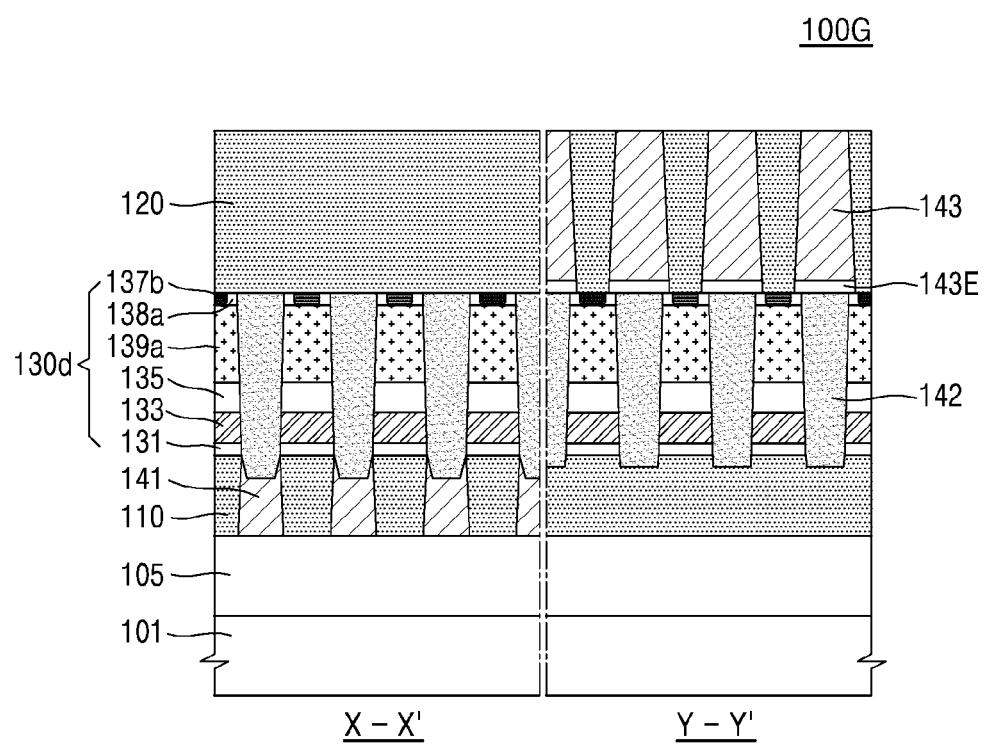

Referring to FIG. 12, a memory device 100G according to an embodiment may be similar to the memory device shown in FIG. 9, in that in the memory cell 130d, a heating electrode 137a may be disposed on a top portion of a variable resistance layer 139a. However, the memory device 100G of FIG. 12 may have a structure in which a spacer 138a may surround only the heating electrode 137a.

Specifically, in the memory device 100G, the spacer 138a may be not formed on a side surface of the variable resistance layer 139a. Accordingly, similar to the memory device 100F shown in FIG. 11, the side surface of the variable resistance layer 139a may constitute a portion of a side surface of the memory cell 130d. Also, the heating electrode 137b may be disposed on an upper portion of the variable resistance layer 139a, and may not extend across the entire top portion of the variable resistance layer 139a. The spacer 138a, which surrounds only the heating electrode 137*b*, may be disposed on the variable resistance layer 139*a*. A periphery side surface of the spacer 138*a* may constitute a portion of the side surface of the memory cell 130*d*.

In order to form this structure, after the variable resistance layer 139*a* is formed in a trench, a portion of an upper portion of the variable resistance layer 139*a* may be removed. Thereafter, after the spacer 138*a* is formed in the removed portion, the heating electrode 137*b* may be formed in a remaining portion.

Since the heating electrode 137*b* is surrounded by the spacer 138*a*, a horizontal cross-sectional area of the heating electrode 137*b* may be smaller than that of the variable resistance layer 139*a*. Thus, a portion of a top surface of the variable resistance layer 139*a* may be in contact with the heating electrode 137*b*. Accordingly, unlike the memory device 100, 100A, 100B and 100C shown in FIGS. 3 and 6 to 8, a contact area between the variable resistance layer 139*a* and the heating electrode 137*b* of FIG. 12 may be adjusted. For example, in the memory device 100, 100A, 100B and 100C shown in FIGS. 3 and 6 to 8, a contact area between the variable resistance layer 139 and the heating electrode 137 may be reduced by limiting a horizontal cross-sectional area of the variable resistance layer 139 by the spacer 138. In contrast, in the memory device 11G of FIG. 12, a contact area between the variable resistance layer 139*a* and the heating electrode 137*b* may be reduced by reducing a horizontal cross-sectional area of the heating electrode 137 by the spacer 138. In the memory device 100D and 100E shown in FIGS. 9 and 10, a horizontal cross-sectional area of the variable resistance layer 139 may be reduced together with that of the heating electrode 137*a*, thereby reducing a contact area therebetween.

Figure 13:
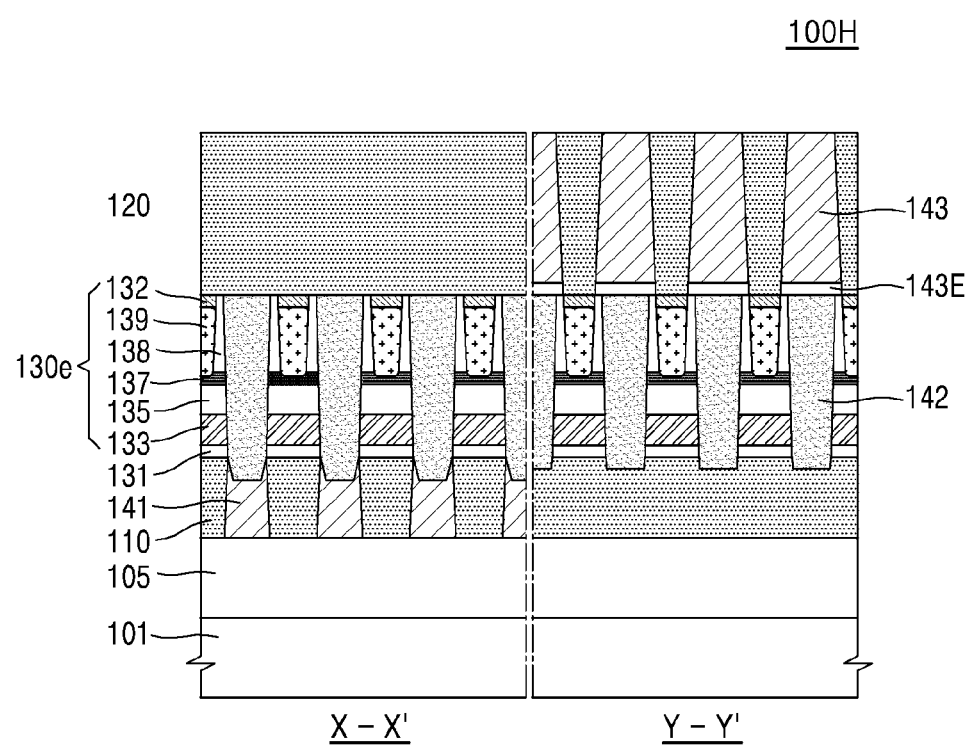

Referring to FIG. 13, a memory device 100H according to an embodiment may be different from the memory device 100 shown in FIG. 3, in that a memory cell 130*e* may further include a top electrode 132 on a variable resistance layer 139. For example, the memory device 100H according to the embodiment of FIG. 13 may further include the top electrode 132 interposed between the variable resistance layer 139 and a second electrode line 120. Like the heating electrode 137*a* of each of the memory devices 100D and 100E shown FIGS. 9 and 10, respectively, the top electrode 132 may serve to prevent damage to the variable resistance layer 139 during the etching process for forming the second electrode lines 120. Also, the top electrode 132 may enhance a connection force between the variable resistance layer 139 and the second electrode layer 120, thereby solving a problem of poor contact.

For reference, the intermediate electrode 135, the heating electrode 137*a* and the top electrode 132 have been described to be separated or distinguished from one another, but the embodiments are not limited thereto. For example, at least one of the intermediate electrode 135 and the top electrode 137*a* may include a heating layer that is in contact with the variable resistance layer 139. The heating layer may be configured to be constituted in the intermediate electrode 135 and the top electrode 132. When the heating layer constitutes the intermediate electrode 135 and/or the top electrode, the heating layer may constitute a part or whole of the intermediate electrode and/or the top electrode 132. For example, in the memory devices 100D and 100E of FIGS. 9 and 10, the heating electrode 137*a* may be viewed as constituting the top electrode 132. Also, the top electrode 132 of the memory device 100H may function as the heating layer.

The heating layer may be included in the intermediate electrode 135 and/or the top electrode 132.

Figure 14:
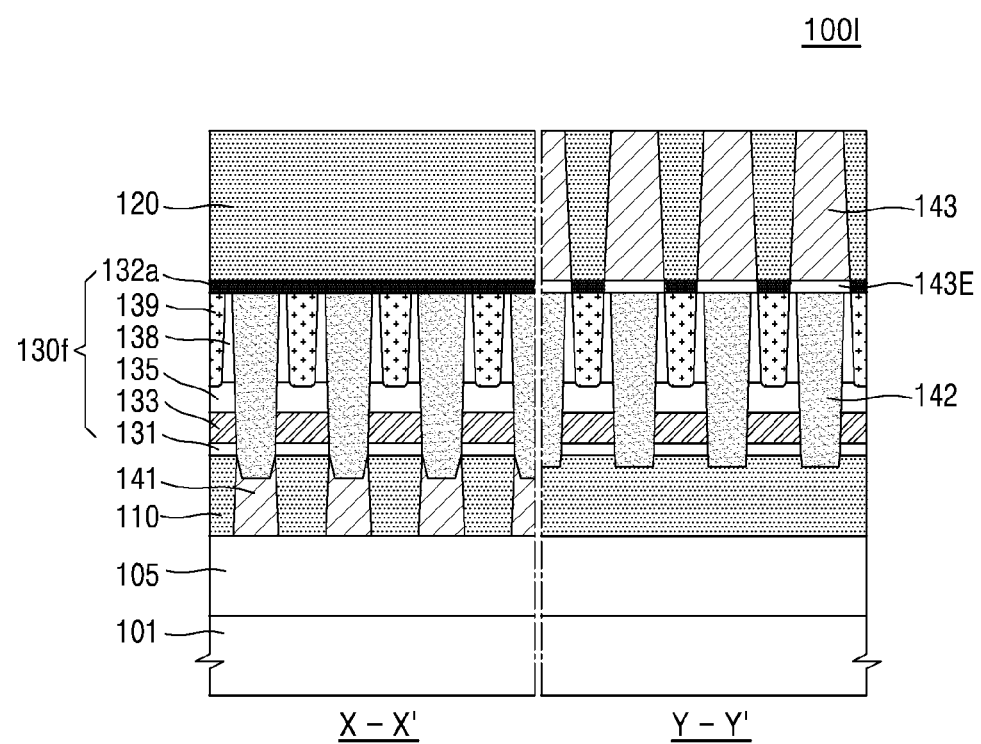

Referring to FIG. 14, a memory device 100I according to an embodiment may be different from the memory devices 100, 100A, 100B, 100C, 100D, 100E, 100F, 100G and 100H shown FIGS. 3 and 6 to 13, in that a top electrode 132*a* of memory cells 130*f* may extend in the second direction (Y direction). For example, in the memory device 100I according to the embodiment, the memory cells 130*f* may be disposed under second electrode lines 120 and may include the top electrode 132*a* that extends in the second direction. The top electrode 132*a* may be in contact with top surfaces of a variable resistance layer 139, a spacer 138 and a second insulating layer 142, and may extend in the second direction above the variable resistance layer 139, the spacer 138 and the second insulating layer 142.

When the second electrode lines 120 are formed by a damascene process, the top electrode 132*a* may be formed together with the second electrode lines 120. For example, line-type trenches may be formed in a third insulating layer 143, and the line-type trenches may be filled with a material layer for a top electrode 132*a*. Thereafter, by remaining the material layer in a bottom portion of the trenches through etch-back process, the top electrode 132*a* may be formed.

As described above, at least one of an intermediate electrode 135 and the top electrode 132*a* may include a heating layer for heating the variable resistance layer 139. For example, in the memory device 100I according to the embodiment, the top electrode 132*a* may serve as a heating layer. For example, the top electrode 132*a* may correspond to the heating electrode 137*a* of each of the memory devices 100D and 100E shown in FIGS. 9 and 10.

Figure 15:
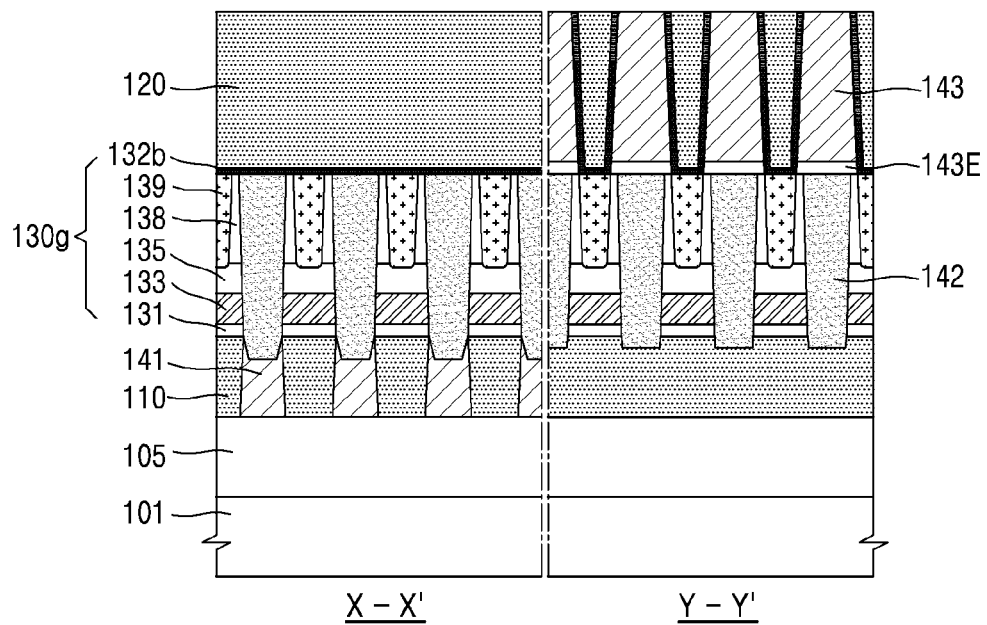

Referring to FIG. 15, a memory device 100J according to an embodiment may be different from the memory device 100I shown FIG. 14, in that a top electrode 132*b* of memory cells 130*g* may surround a bottom surface and both side surfaces of each of second electrode lines 120, and may extend in the second direction (Y direction). As shown in the drawing, the top electrode 132*b* may surround the bottom surface and both side surfaces of each of second electrode lines 120, and may be in contact with top surfaces of a variable resistance layer 139, a spacer 138 and a second insulating layer 142.

When the second electrode lines 120 are formed by a damascene process, the top electrode 132*b* may be formed together with the second electrode lines 120. For example, line-type trenches may be formed in a third insulating layer 143, and a material layer for a top electrode may be uniformly formed on bottoms and both sidewalls of trenches and the third insulating layer 143. Thereafter, a conductive material layer for the second electrode lines 120 may be formed on the material layer for a top electrode to completely fill the trenches, and the top electrode 132*b* and the second electrode lines 120 may be formed by the etch-back process and/or CMP process to expose a top surface of the third insulating layer 143 through. For example, the etch-back process and/or CMP process may remove portions of the third insulating layer 143 to the etch stop layer 143E.

In the memory device 100J according to the embodiment, at least one of the intermediate electrode 135 and the top electrode 132*b* may include a heating layer for heating the variable resistance layer 139. For example, in the memory device 100J according to the embodiment of FIG. 15, the top electrode 132*b* may serve as a heating layer. For example, the top electrode 132*b* may correspond to the heating electrode 137*a* of each of the memory devices 100D and 100E shown in FIGS. 9 and 10, respectively.

Figure 16A:
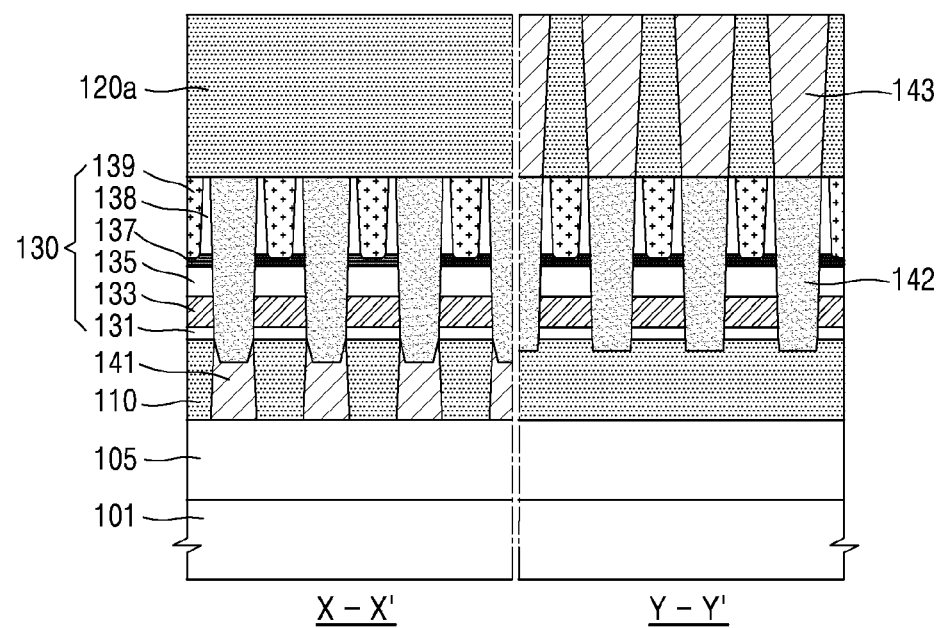

Referring to FIG. 16A, a memory device 100K according to an embodiment may be different from the memory device 100 shown in FIG. 3, in that second electrode lines 120*a* may have a structure that becomes gradually wider toward its lower portion (e.g., at portions nearer to the substrate 101). For example, in the memory device 100K according to the embodiment, the second electrode lines 120*a* may be formed through an embossing and etching process. Specifically, a conductive material layer for the second electrode layers may be formed on the variable resistance layer 139, the spacer 138 and the second insulating layer 142, and then a line-type mask pattern extending in the second direction (Y direction) may be formed on the conductive material layer. Thereafter, by etching the conductive material layer using the mask pattern as an etch mask, the second electrode lines 120*a* may be formed as shown in FIG. 16.

When the second electrode lines 120*a* are formed by an embossing and etching process, an additional etch stop layer may not be formed on the second insulating layer 142 and the third insulating layer 143. Because a metal layer for the second electrode lines 120*a* is in direct contact with the variable resistance layer 139, the etch stop layer may be formed on the second insulating layer. Also, in general, a metal layer may have a high etch selectivity with respect to the second insulating layer 142 (e.g., an oxide layer or nitride layer). Thus, in a process of etching the metal layer, an additional etch stop layer may need to be disposed in order to prevent the second insulating layer 142 from being etched.

Figure 16B:
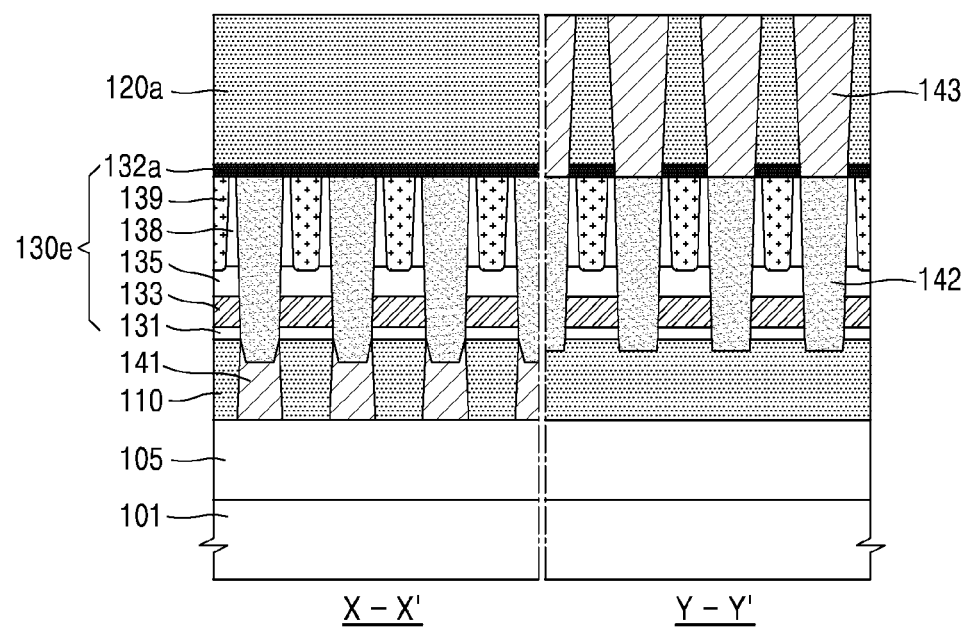

Referring to FIG. 16B, a memory device 100L according to an embodiment may be similar to the memory device 100I shown FIG. 14, in that a top electrode 132*a* may be formed in line-shape and extend in the second direction (Y direction). However, in the memory device 100L according to the embodiment of FIG. 16B, the second electrode lines 120*a* and the top electrode 132*a* may be formed by an embossing and etching process and thus, the second electrode lines 120*a* and the top electrode 132*a* may have a structure that becomes gradually wider toward its lower portion (e.g., a portion nearer to the substrate 101).

Specifically, a material layer for a top electrode and a conductive material layer for a second electrode line may be sequentially stacked on the variable resistance layer 139, the spacer and the second insulating layer 142, and a line-type mask pattern may be formed to extend in the second direction (Y direction). Thereafter, as shown in FIG. 16B, the top electrode 132*a* and the second electrode lines 120*a* may be formed by etching the conductive material layer and the material layer for the top electrode using the mask pattern as an etch mask.

Figure 17A:
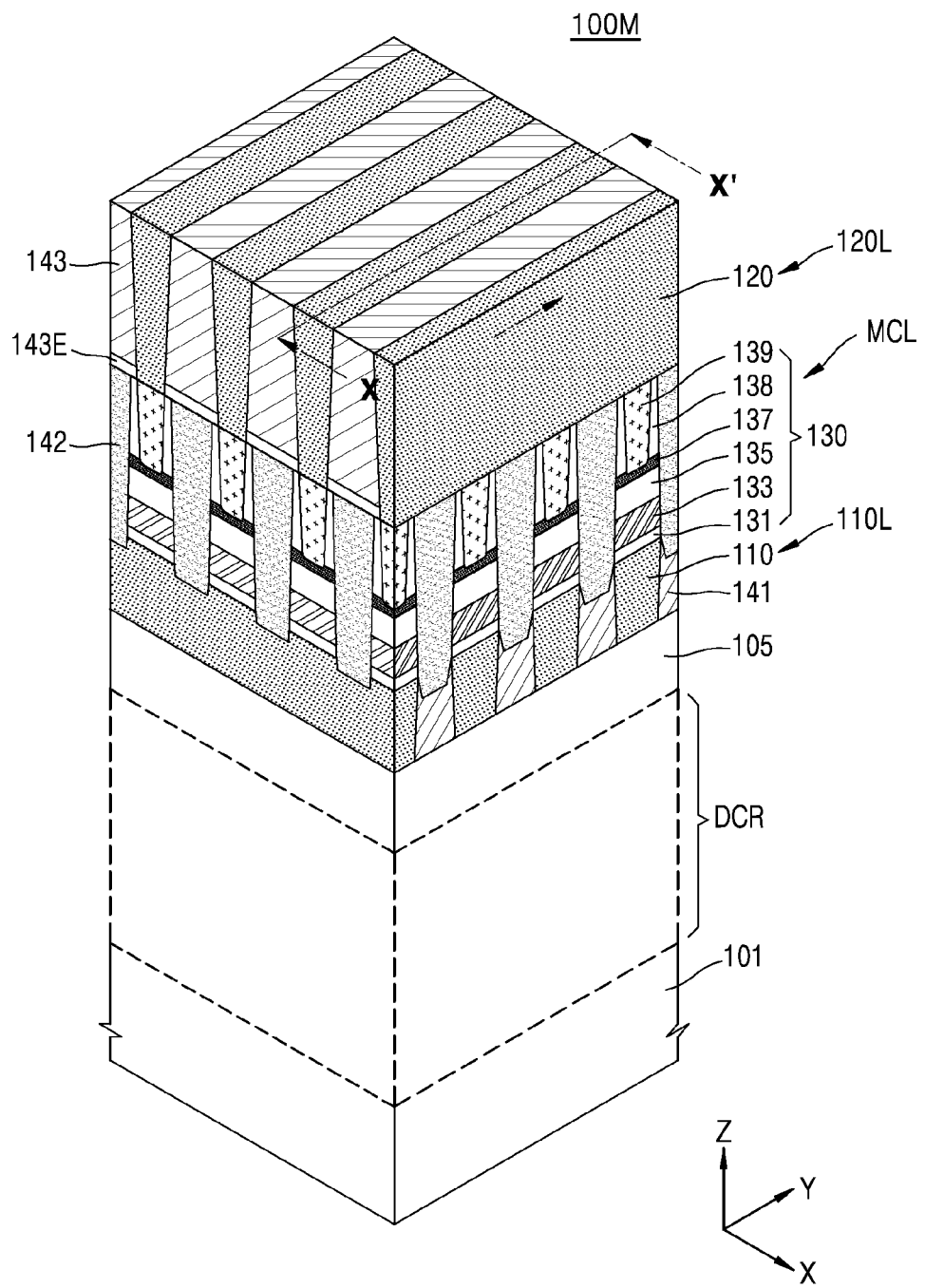
Figure 17B:
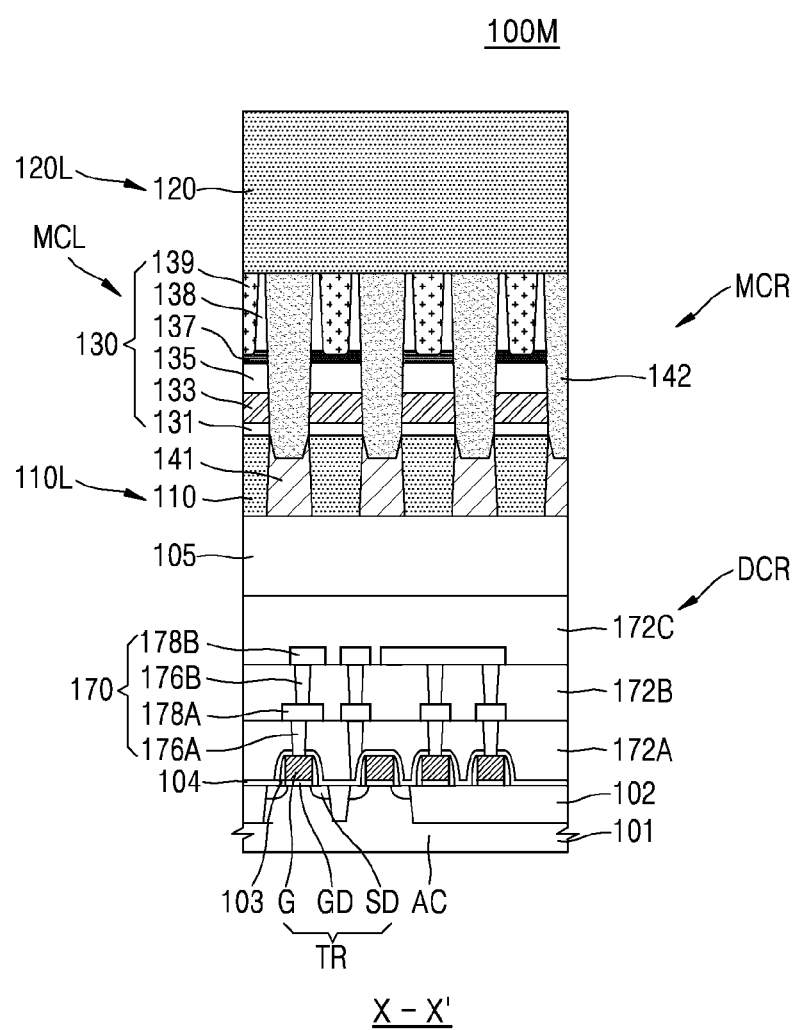

Referring to FIGS. 17A and 17B, a memory device 100M may include a driving circuit region DCR positioned at a first level and a memory cell array region MCR positioned at a second level on a substrate 101. Here, the level means a height (or position) from the substrate 101 in a vertical direction (Z direction in FIG. 2). The first level is closer to the substrate 101 than the second level.

The driving circuit region DCR may be a region where peripheral circuits (or drive circuits) for driving memory cells in the memory cell array region MCR are disposed, and may correspond to the integrated circuit layer described with reference to FIGS. 2 and 3. For example, the peripheral circuit in the driving circuit region DCR may include circuits capable of processing rapidly data that is input to or output from the memory cells in the memory cell array region MCR. The peripheral circuits may include, for example, a page buffer, a latch circuit, a cache circuit, a column decoder, a sense amplifier, a data in/out circuit, or low decoder.

An active region AC for the peripheral circuits (or the drive circuits) may be defined by a device isolation layer 102 formed in the substrate 101. A plurality of transistors TR constituting the peripheral circuits in the driving circuit region DCR may be formed on the active region AC. The plurality of transistors TR may each include a gate G, a gate insulating layer GD, and source/drain regions SD. An insulating spacer 103 may be formed on opposite sidewalls of the gate G, and an etch stop layer 104 may be formed on the gate G and the insulating spacer 103. The etch stop layer 104 may include an insulating material, for example, silicon nitride or silicon oxynitride.

A plurality of lower interlayer insulating layers 172A, 172B, and 172C may be sequentially stacked on the etch stop layer 104. The plurality of lower interlayer insulating layers 172A, 172B, and 172C may include silicon oxide, silicon nitride, and/or silicon oxynitride. The plurality of lower interlayer insulating layers 172A, 172B, and 172C may be formed of the same or different materials.

The driving circuit region DCR may include a multilevel interconnection structures 170, which are electrically connected to the plurality of transistors TR. The multilevel interconnection structures 170 may be insulated from each other by the plurality of lower interlayer insulating layers 172A, 172B, and 172C. The multilevel interconnection structures 170 may include a first contact 176A, a first interconnection layer 178A, a second contact 176B, and a second interconnection layer 178B, which are disposed sequentially on the substrate 101 and electrically connected to each other. The first and second interconnection layers 178A and 178B may include a metal, a conductive metal nitride, a metal silicide, or a combination thereof. The first and second interconnection layers 178A and 178B may include, for example, tungsten, molybdenum, titanium, cobalt, tantalum, nickel, tungsten silicide, titanium silicide, cobalt silicide, tantalum silicide, nickel silicide, etc.

In the memory device 100M according to the embodiment of FIGS. 17A and 17B, although the multilevel interconnection structures 170 include a two-level interconnection structure including the first interconnection layer 178A and the second interconnection layer 178B as illustrated in FIG. 17B, aspects of the disclosed concepts are not limited thereto. For example, according to a lay-out of the driving circuit region DCR, and an arrangement or types of the gate G, the multilevel interconnection structures 170 may include a tree-or-more-level interconnection structure.

An interlayer insulating layer 105 may be formed on the plurality of lower interlayer insulating layers 172A, 172B, and 172C. The memory cell array region MCR may be disposed on the interlayer insulating layer 105. The interlayer insulating layer 105 and the memory cell array region MCR may be identical to the interlayer insulating layer 105 as described with reference to FIGS. 2 and 3. For example, the memory cell array region MCR may include a first electrode line layer 110L, a memory cell layer MCL and a second electrode line layer 120L. Of course, in the memory cell array region MCR, the memory devices 100, and 100A to 100J as described with reference to FIGS. 2, 3 and 5 to 13B may be disposed.

An interconnection structure (not shown) penetrating the interlayer insulating layer 105 may be further disposed to electrically connect the memory cells in the memory cell array region MCR to the peripheral circuits in the driving circuit region DCR. In the memory device 100M, since the memory cell array region MCR is disposed on the driving circuit region DCR, an integration of the memory device 100M may be increased.

Memory devices having various cross-point array structures have been described until now, but the disclosed concepts are not limited thereto.

Figure 18:
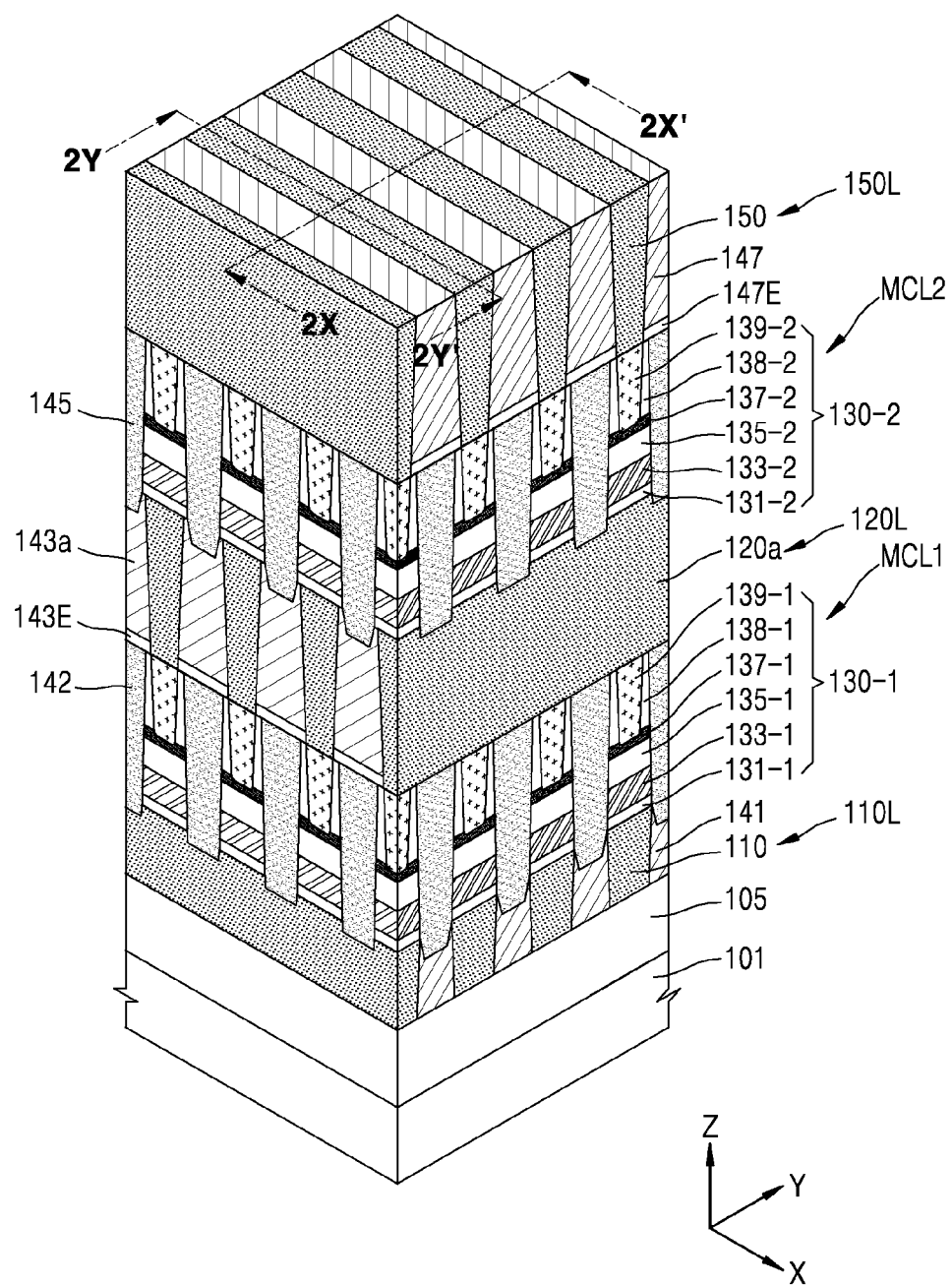
FIG. 18 is a perspective view of a memory device according to an exemplary embodiment.
Figure 19:
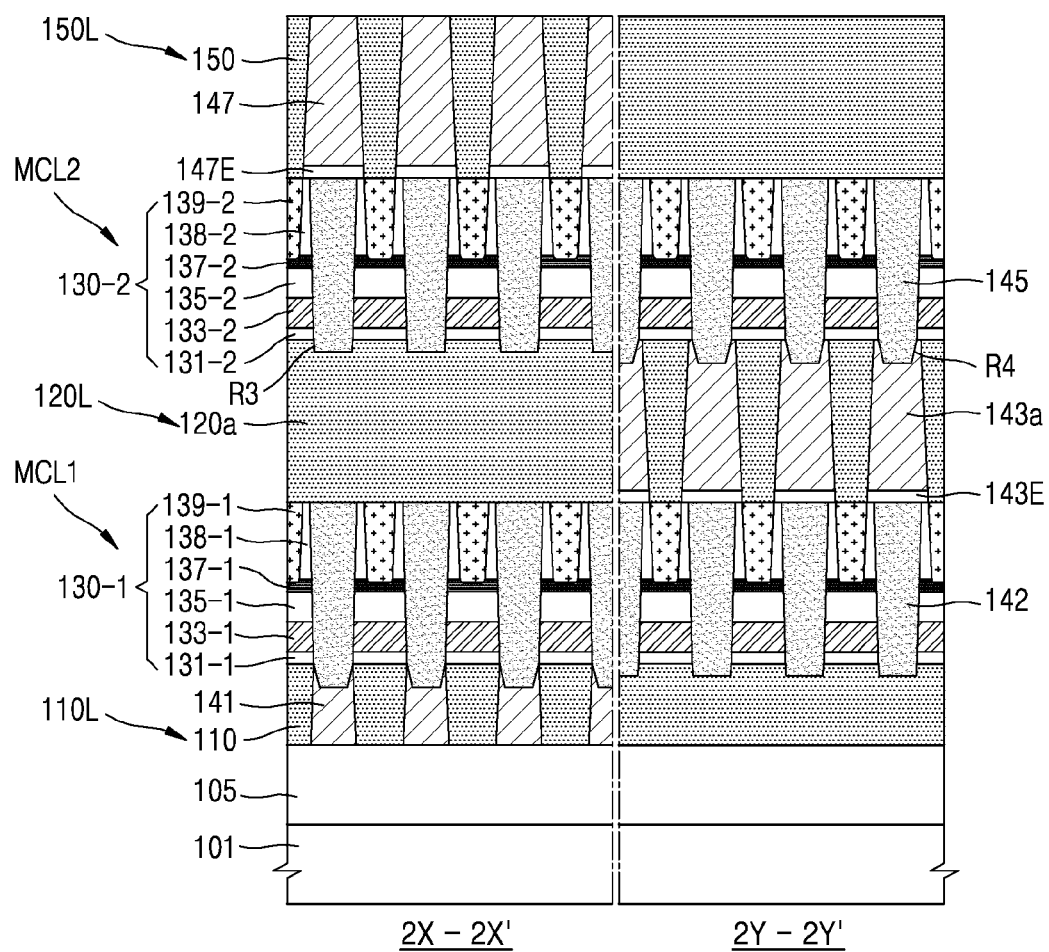
FIG. 19 is a cross-sectional view taken along lines 2X-2X' and 2Y-2Y' of FIG. 18.

FIG. 18 is a perspective view of a memory device according to an exemplary embodiment. FIG. 19 is a cross-sectional view taken along lines 2X-2X' and 2Y-2Y' of FIG. 18. The redundant description described in FIGS. 2 and 3 will be omitted.

Referring to FIGS. 18 and 19, a memory device 200 according to an embodiment may have a two-level structure that is configured to have two memory cell layers MCL1 and MCL2 stacked therein.

Specifically, a first electrode line layer 110L may include a plurality of first electrode lines 110, which extend parallel to one another in the first direction (X direction). A second electrode line layer 120L may include a plurality of second electrode lines 120a, which extend parallel to one another in the second direction (Y direction). A third electrode line layer 150L may include a plurality of third electrode lines 150, which extend parallel to one another in the first direction (X direction). The second electrode line layer 120L may be disposed above the first electrode line layer 110L, and the third electrode line layer 150L may be disposed above the second electrode line layer 120L. The third electrode lines 150 and the first electrode lines 110 may be located at different levels in the third direction (Z direction), but may have substantially the same arrangement.

In terms of an operation of the memory device 200, the first electrode lines 110 and the third electrode lines 150 may correspond to word lines and the second electrode lines 120a may correspond to bit lines. In some embodiments, the first electrode lines 110 and the third electrode lines 150 may correspond to bit lines and the second electrode lines 120a may correspond to word lines. When the first electrode lines 110 and the third electrode lines 150 correspond to word lines, the first electrode lines 110 may correspond to the lower word lines, and the third electrode lines 150 may correspond to the upper word lines. Since the second electrode lines 120a are commonly shared by the lower word lines and the upper word lines, the second electrode lines 120a may correspond to the common bit lines.

The first to third electrode lines 110, 120a and 150 may have the same material as the first and second electrode lines 110 and 120 described with reference to FIGS. 2 and 3. Also, the first electrode lines 110 may have the same structure as the first electrode lines 110 described with reference to FIGS. 2 and 3. The second electrode lines 120a may have a similar structure to the second electrode lines 120 described with reference to FIGS. 2 and 3, but a third recess RS may be formed on an upper portion of the second electrode lines 120a by disposing second memory cells 130-2 on the second electrode line 120a. The third recess RS may be formed between second memory cells 130-2 disposed in the second direction (Y direction). The third recess RS may be filled with a lower portion of a fourth insulating layer 145 disposed between the second memory cells 130-2.

The first memory cell layer MCL1 may include a plurality of memory cells 130-1 (e.g., MC1 in FIG. 1) which are spaced apart from each other in the first direction (X direction) and the second direction (Y direction) to be arrayed in two-dimensions. The second memory cell layer MCL2 may include a plurality of memory cells 130-2 (e.g., MC2 in FIG. 2), which are spaced apart from each other in the first direction (X direction) and the second direction (Y direction) to be arrayed in two-dimensions. As shown in FIG. 18, the first electrode lines 110 and the second electrode lines 120a may cross each other, and the second electrode lines 120a and the third electrode lines 150 may cross each other. The first memory cells 130-1 may be disposed between the first electrode line layer 110L and the second electrode line layer 120L and at respective intersections of the first electrode lines 110 and the second electrode lines 120a. The second memory cells 130-2 may be disposed between the second electrode line layer 120L and the third electrode line layer 150L and at respective intersections of the second electrode lines 120a and the third electrode lines 150.

The first memory cells 130-1 and the second memory cells 130-2 may each have a pillar shaped-structure (e.g., a square pillar) like the memory cells 130 of the memory device 100 described with reference to FIGS. 2 and 3, but the embodiments are not limited thereto. For example, the first memory cells 130-1 and the second memory cells 130-2 may each have various pillar-shapes such as a cylindrical pillar, an oval pillar, a polygonal pillar, etc. As shown in FIG. 18, the first memory cells 130-1 and the second memory cells 130-2 may each have a lower portion larger than an upper portion thereof. For example, the first memory cells 130-1 and the second memory cells 130-2 may be basically formed through an embossing and etching process. However, as described above, the variable resistance layer 139-1 and 139-2 and the spacer 138-1 and 138-2 may be formed through a damascene process using a hard mask layer or sacrificial layer. Thus, the variable resistance layer 139-1 and 139-2 and the spacer 138-1 and 138-2 may be self-aligned to the lower material layers of the first and second memory cells 130-1 and 130-2.

The first memory cells 130-1 may include a lower electrode 131-1, a selection device 133-1, an intermediate electrode 135-1, a heating electrode 137-1, a variable resistance layer 139-1, and a spacer 138-1. The second memory cells 130-2 may include a lower electrode 131-2, a selection device 133-2, an intermediate electrode 135-2, a heating electrode 137-2, a variable resistance layer 139-2, and a spacer 138-2. The lower electrode 131-1 and 131-2, the selection device 133-1 and 133-2, the intermediate electrode 135-1 and 135-2, the heating electrode 137-1 and 137-2, the variable resistance layer 139-1 and 139-2, and the spacer 138-1 and 138-2 may be identical to, respectively, the lower electrode 131, the selection device 133, the intermediate electrode 135, the heating electrode 137, the variable resistance layer 139 and the spacer 138 described with reference to FIGS. 2 and 3.

A first insulating layer 141 may be disposed between the first electrode lines 110, and a second insulating layer 142 may be disposed between the first memory cells 130-1 of the first memory cell layer MCL1. Also, a third insulating layer 143a may be disposed between the second electrode lines 120a, and a fourth insulating layer 145 may be disposed between the second memory cells 130-2 of the second memory cell layer MCL2. A fifth insulating layer 147 may be disposed between the third electrode lines 150.

Materials or functions of the first to fifth insulating layers 141, 142, 143a, 145 and 147 may be identical to the materials and functions described for the first to third insulating layers 141, 142 and 143 in FIGS. 2 and 3. Also, structures of the first and second insulating layers 141 and 142 may be identical to the structures of the first and second insulating layers 141 and 142 described with reference to FIGS. 2 and 3. A structure of the third insulating layer 143a may be similar to that of the third insulating layer 143 of the memory device 100 in FIGS. 2 and 3, but a fourth recess RS may be formed on an upper portion of the third insulating layer 143a by disposing second memory cells 130-2 on the third insulating layer 143a. The fourth recess RS may be formed between second memory cells 130-2 disposed in the first direction (X direction). The fourth recess RS may be filled with a lower portion of a fourth insulating layer 145 disposed between the second memory cells 130-2.

The fourth insulating layer 145 may have substantially the same structure as the second insulating layer 142 except for being disposed between the second memory cells 130-2. A fifth insulating layer 147 may be formed extending in the first direction (X direction) between the third electrode lines 150. A etch stop layer 147E may be disposed between the fifth insulating layer 147 and the fourth insulating layer 145. Function or material of the etch stop layer 147E may be identical to the function or material of the etch stop layer 143E described with reference to FIGS. 2 and 3. When the second electrode lines 120a and the third electrode lines 150 may be formed through an embossing and etching process, the etch stop layer 147E may be not required.

Instead of the second insulating layer 142 and/or the fourth insulating layer 145, air gaps (not shown) may be formed between the first memory cells 130-1 and/or between the second memory cells 130-2. When the air gap are formed, an insulating liner (not shown), having a predetermined thickness, may be formed between the air gap and the memory cell 130-1 and 130-2.

So far, the memory cells 130 of the memory device 100 of FIGS. 2 and 3 have been described as a structure stacked with two layers, but a structure of the memory device 200 according to the embodiment is not limited thereto. For example, the memory device 200 according to the embodiment may have a two-level structure that is stacked with the memory cells 130a to 130e of the memory devices 100A to 100M in FIGS. 5 to 17B.

The memory device 200 according to the embodiment may be formed using both an embossing and etching process and a damascene process. Material layers constituting a lower portion of the memory cells 130-1 and 130-2 of the memory device 200 may be formed by the embossing and etching process, and variable resistance layers 139-1 and 139-2 constituting an upper portion of the memory cells 130-1 and 130-2 may be formed by the damascene process using additional hard mask or sacrificial layer. When the variable resistance layer 139 is formed using the damascene process, an etch-related damage may be substantially minimized. Also, the variable resistance layers 139-1 and 139-2 may be self-aligned to the material layers constituting a lower portion of the memory cell 130, thereby minimizing a misalign margin. Accordingly, the memory device 200 having a three-dimensional cross-point array structure including a plurality of layers stacked in a vertical direction (Z direction) may be embodied, and integration density of the memory device 200 may be improved.

Furthermore, when the variable resistance layers 139-1 and 139-2 are formed by the damascene process, by forming spacers 138-1 and 138-2 to adjust horizontal cross-sectional areas of the variable resistance layers 139-1 and 139-2, contact areas interposed between the variable resistance layers 139-1 and 139-2 and heating electrode layers 137-1 and 137-2 may be adjusted. Accordingly, the memory device 200 may have improved reliability.

Figure 20:
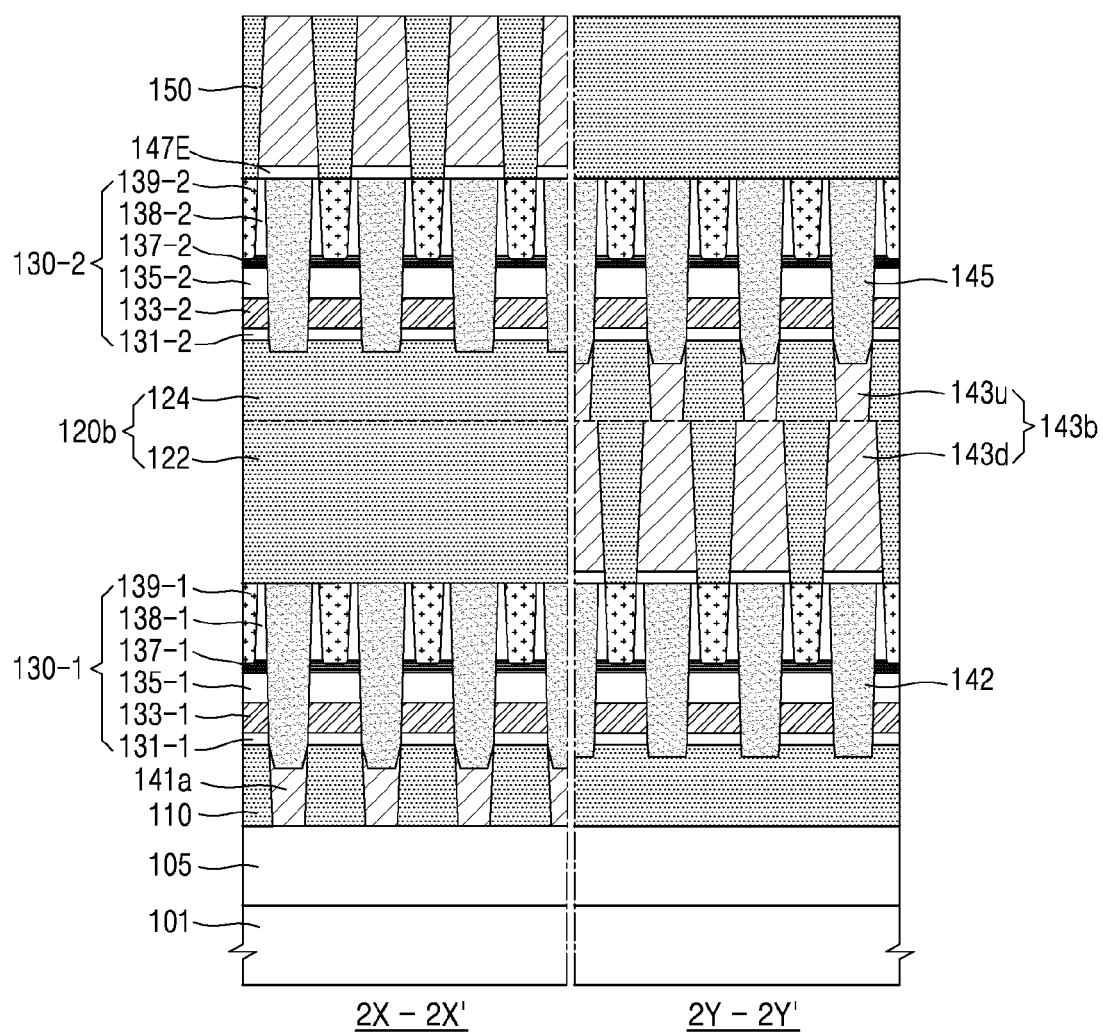
FIGS. 20 to 22, which correspond to the cross-sectional view taken along lines 2X-2X' and 2Y-2Y' of FIG. 19, are cross-sectional views of memory devices according to exemplary embodiments.
Figure 21:
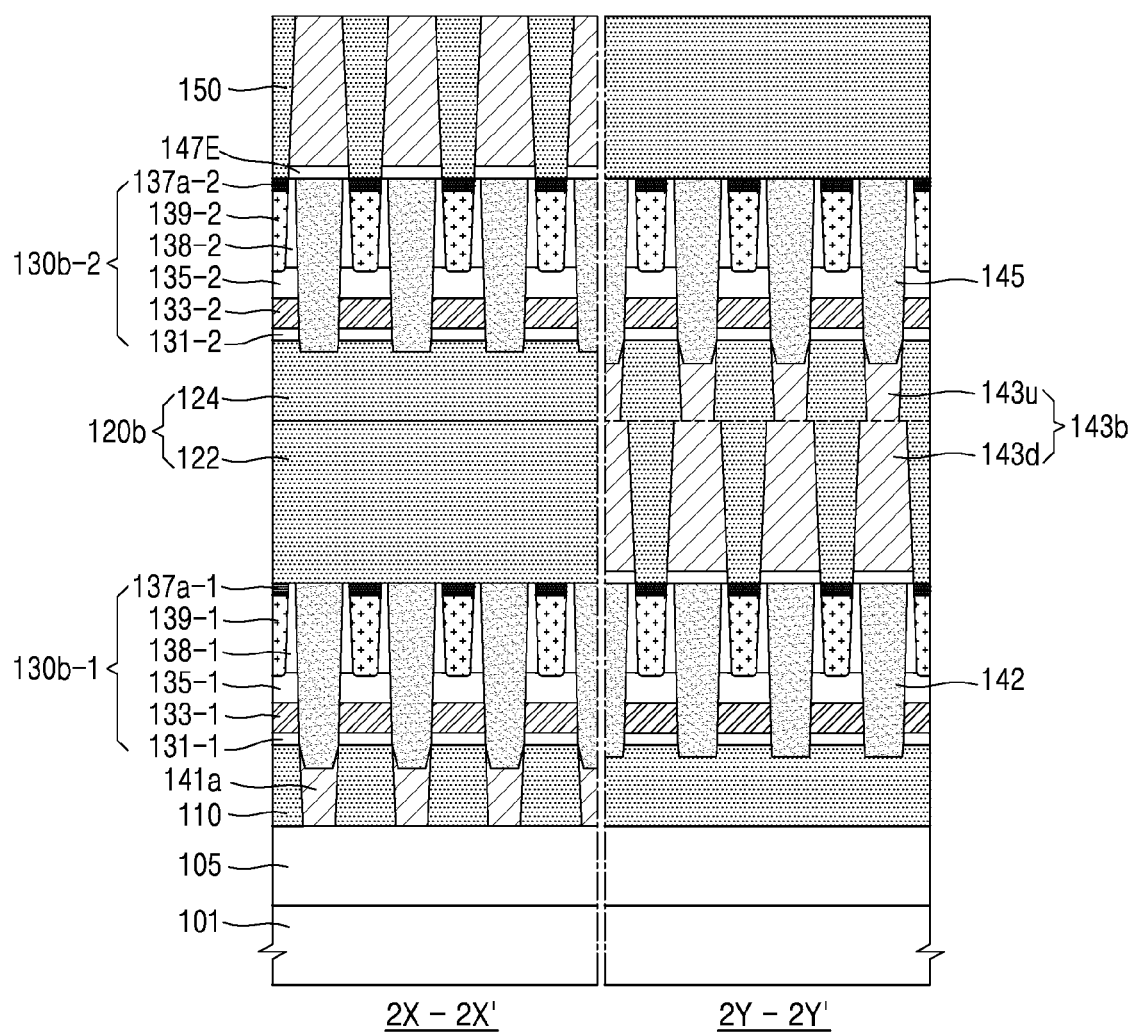
Figure 22:
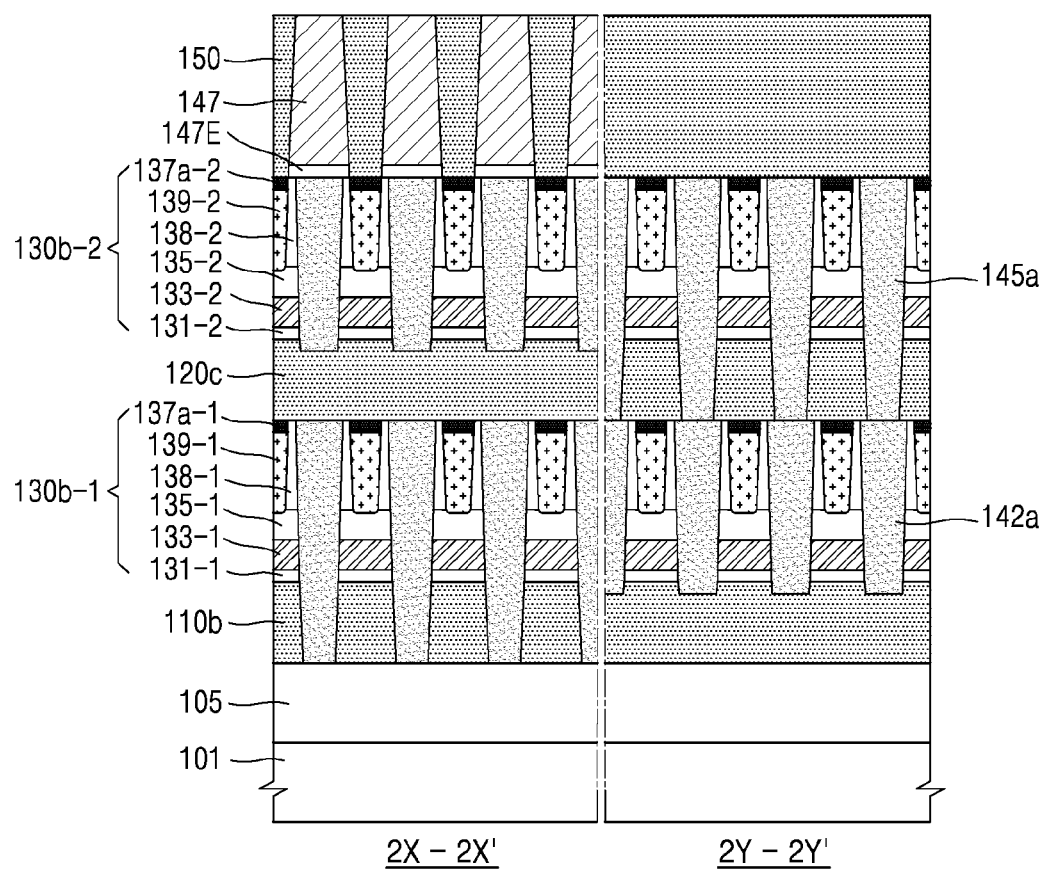

FIGS. 20 to 22 are cross-sectional views of memory devices according to exemplary embodiments, and may correspond to the cross-sectional view of FIG. 19. The redundant description described in FIGS. 2, 3, 18 and 19 will be omitted.

Referring to FIG. 20, a memory device 200A according to an embodiment may be similar to the memory device 200 of FIG. 19, in that the memory device 200A may have a two-level structure that is stacked with two memory cells MCL-1 and MCL-2. However, the memory device 200A according to the embodiment may be different from the memory device 200 of FIG. 19, in that a second electrode line 120b may include a lower electrode 122 and an upper electrode layer 124.

Specifically, in the memory device 200A, the second electrode line 120b may include the lower electrode layer 122 and the upper electrode layer 124. Also, a second insulating layer 143b interposed between the second electrode lines 120b may include a lower second insulating layer 143d corresponding to the lower electrode layer 122 and an upper second insulating layer 143u corresponding to the upper electrode layer 124.

The memory device 200A according to the embodiment may be similar to a two-level structure that is stacked with two memory device 100A of FIG. 6 in the same manner as the memory device 200 of FIG. 19. However, in the memory device 200 of FIG. 19, the second memory cells 130-2 may be directly stacked on the second electrode lines 120a and the second insulating layer 143a. In contrast, the memory device 200A according to the embodiment may have a structure that is stacked with the upper layer electrode 124 (corresponding to the first electrode lines 110a in FIG. 6) and memory cells 130-2 on the lower electrode layer 122 (corresponding to the second electrode lines 120 in FIG. 6) and the lower second insulating layer 143d (corresponding to the third insulating layer 143 in FIG. 6). Accordingly, the lower electrode layer 122 may correspond to the second electrode lines 120 of the memory device 100A of FIG. 6, and the upper electrode layer 124 may correspond to the first electrode lines 110a of the memory device 100A of FIG. 6. Also, the lower second insulating layer 143d may correspond to the second insulating layer 142 of the memory device 100A of FIG. 6, and the upper second insulating layer 143u may correspond to the first insulating layer 141a of the memory device 100A of FIG. 6.

Referring to FIG. 21, a memory device 200B according to the embodiment may be different from the memory device 200A of FIG. 20, in that a heating electrode 137a-1 and 137a-2 may be disposed on an upper portion of the variable resistance layer 139-1 and 139-2. For example, in the memory device 200B according to the embodiment, a second electrode line 120b may also include a lower electrode layer 122 and an upper electrode layer 124. Also, a second insulating layer 143b interposed between the second electrode lines 120b may be a lower second insulating layer 143d and an upper second insulating layer 143u. The memory cells 130b-1 and 130b-2 may have a structure in which the heating electrodes 137a-1 and 137a-2 are disposed on the variable resistance layers 139-1 and 139-2, respectively, and are surrounded respectively by spacers 138-1 and 139-2.

Referring to FIG. 22, a memory device 200C according to an embodiment may be similar to the memory device 200 of FIG. 19, in that the memory device 200C may have a two-level structure that is stacked with two memory cells MCL-1 and MCL-2. However, the memory device 200C according to the embodiment may be different from the memory device 200 of FIG. 19, in that the memory device 200C may have a two-level structure that is stacked with the first electrode line 110b and the memory cell 130b of the memory device 100E of FIG. 10.

Specifically, in the memory device 200C according the embodiment, the first electrode lines 110b may be formed by etching together with the first memory cells 130b-1. Thus, the second insulating layer 142a may be interposed between the first memory cells 130b-1 and between the first electrode lines 110b. Also, the second electrode lines 120c may be formed by etching together with the second memory cells 130b-2. Thus, a fourth insulating layer 145a may be interposed between the second memory cells 130b-2 and between the second electrode lines 120c.

In the memory device 200C according the embodiment, the second electrode lines 120c may be shared by the first memory cells 130b-1 and the second memory cells 130b-2. The second electrode lines 120c may be formed only one time, when the first memory cells 130b-1 or the second memory cells 130b-2 are formed. Accordingly, the process may be greatly simplified. Also, by omitting a layer corresponding to electrode lines, it is possible to reduce an overall height of the memory device.

Unlike the memory devices 200 and 200C shown in FIGS. 19 and 22, the memory devices 200A and 200B shown in FIGS. 20 and 21 may have a structure in which the lower electrode layer 122 and the upper electrode layer 124 of the second electrode line 120b may be formed by separate process steps, respectively.

Figure 23:
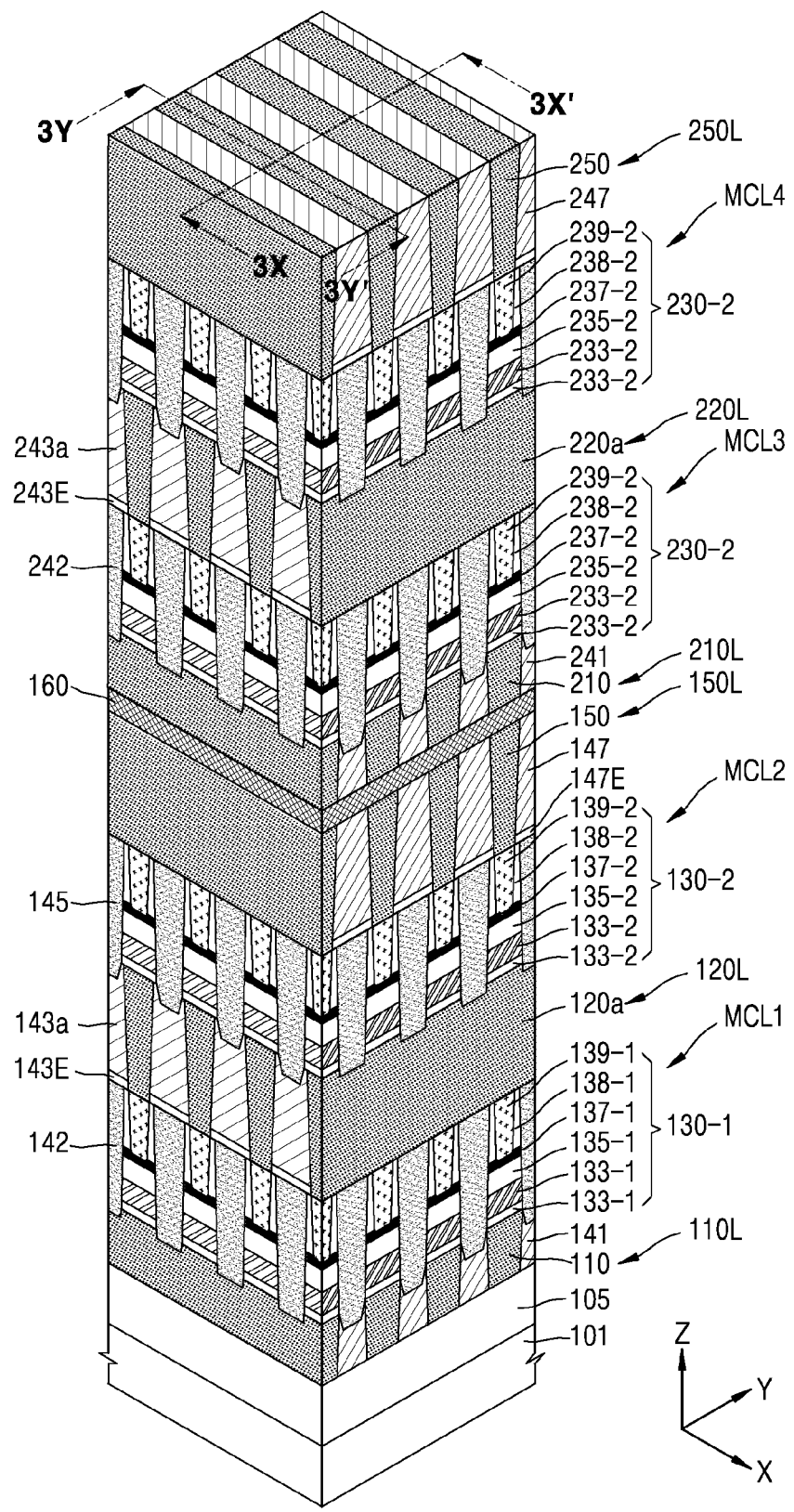
FIG. 23 is a perspective view of a memory device according to an exemplary embodiment.
Figure 24:
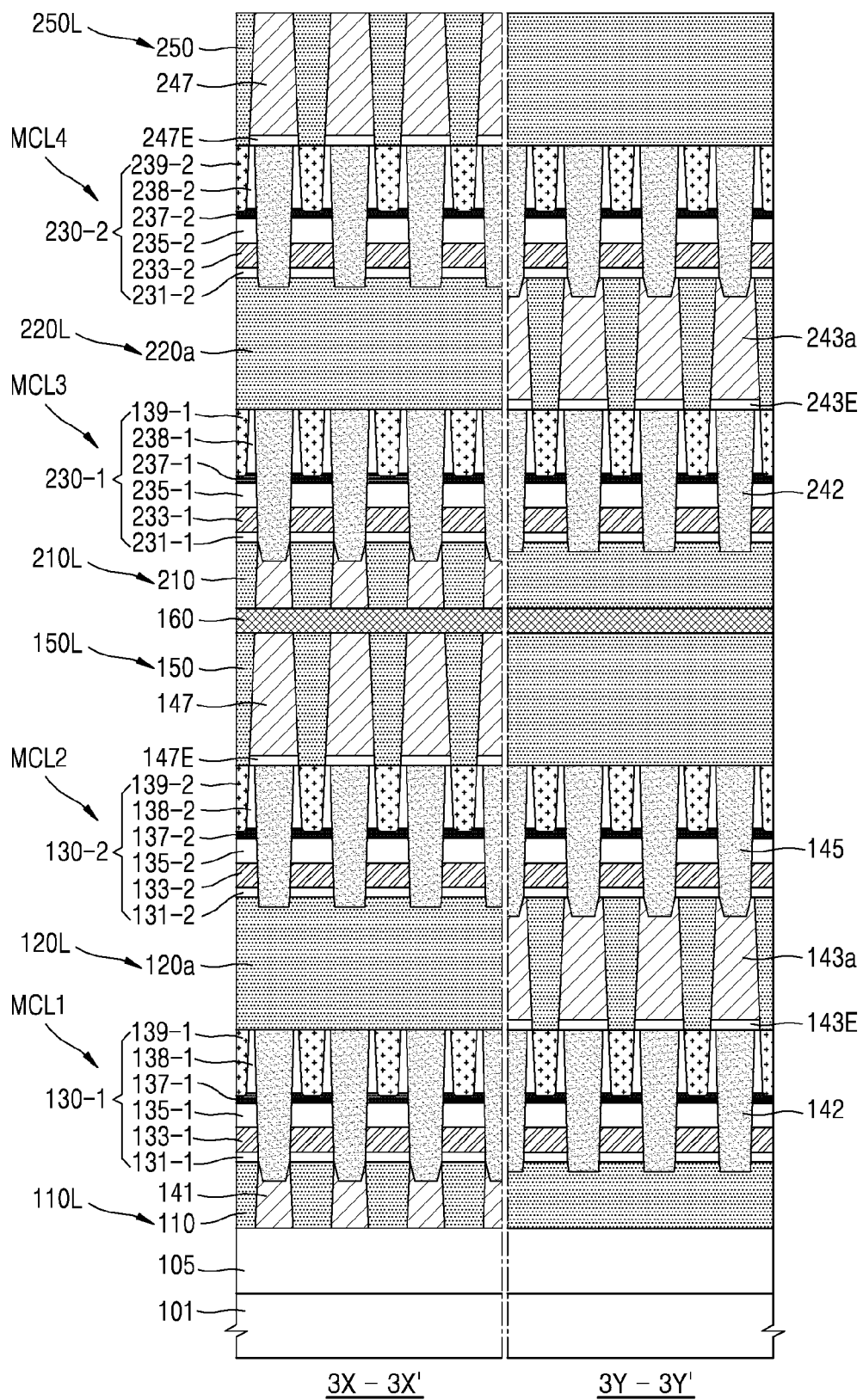
FIG. 24 is a cross-sectional view taken along lines 3X-3X' and 3Y-3Y' of FIG. 23.

FIG. 23 is a perspective view of a memory device according to an embodiment. FIG. 24 is a cross-sectional view taken along lines 3X-3X' and 3Y-3Y' of FIG. 23. The redundant description described in FIGS. 2, 3, 18 and 19 will be omitted.

Referring to FIGS. 23 and 24, a memory device 1000 according to an embodiment may have a four-level structure that is stacked with four memory cell layers MCL1, MCL2, MCL3 and MCL4. Specifically, a first memory cell layer MCL1 may be disposed between a first electrode line layer 110L and a second electrode line layer 120L, and a second memory cell layer MCL2 may be disposed between the second electrode line layer 120L and a third electrode line layer 150L. A second interlayer insulating layer 160 may be formed on the third electrode line layer 150L, and a first upper electrode line layer 210L, a second upper electrode line layer 220L and a third upper electrode line layer 250L may be disposed on the second interlayer insulating layer 160. The first upper electrode line layer 210L may include first upper electrode lines 210 which have the same structure as the first electrode lines 110. The second upper electrode line layer 220L may include second upper electrode lines 220a, which have the same structure as the second electrode lines 120. The third upper electrode line layer 250L may include third upper electrode lines 250, which have the same structure as the third electrode lines 150 or the first electrode lines 110. A first upper memory cell layer MCL3 may be disposed between the first upper electrode line layer 210L and the second upper electrode line layer 220L. A second upper memory cell layer MCL4 may be disposed between the second upper electrode line layer 220L and the third upper electrode line layer 250L.

A first electrode line layer 110L, a second electrode line layer 120L, a third electrode line layer 150L, a first memory cell layer MCL1 and a second memory cell layer MCL2 may be identical as those described with reference to FIGS. 18 and 19. Also, the first upper electrode line layer 210L, the second upper electrode line layer 220L, the third upper electrode line layer 250L, the first upper memory cell layer MCL3 and the second upper memory cell layer MCL4 may have substantially the same structure as, respectively, the first electrode line layer 110L, the second electrode line layer 120L, the third electrode line layer 150L, the first memory cell layer MCL1 and the second memory cell layer MCL2, except that the second interlayer insulating layer 160 may be disposed instead of the interlayer insulating layer 105. Accordingly, a detailed description of each element will be omitted.

The memory device 1000 according to the exemplary embodiment of FIGS. 23 and 24 may have a stack structure that is repeatedly stacked with the memory devices 200 of FIGS. 18 and 19 and interposed with the second interlayer insulating layer 160 therebetween. For example, the second interlayer insulating layer 160 may be disposed between sequentially stacked memory devices 200. But the structure of the memory device 1000 according to the embodiment is not limited thereto. For example, the memory device 1000 according to some exemplary embodiments may also have a stack structure that is repeatedly stacked with the memory devices 200A, 200B and 200C illustrated in FIGS. 20 to 22, and interposed with the second interlayer insulating layer 160 therebetween. For example, the second insulating layer 160 may be disposed between memory devices 200A and 200B and/or stacked between memory devices 200B and 200C and/or disposed between memory devices 200A and 200C. In addition, the memory device 1000 according to the exemplary embodiments may also have a stack structure that is repeatedly stacked with the two-level structures including the memory cells 130a to 130e of the memory devices 100A to 100M, respectively illustrated in FIGS. 5 to 17B, and may be interposed with the second interlayer insulating layer 160 between the two-level structures.

Although the illustrated memory device 1000 may have a four-level structure that is stacked with four memory cell layers MCL1, MCL2, MCL3 and MCL4, aspects of the disclosed concepts are not limited thereto.

Figure 25A:
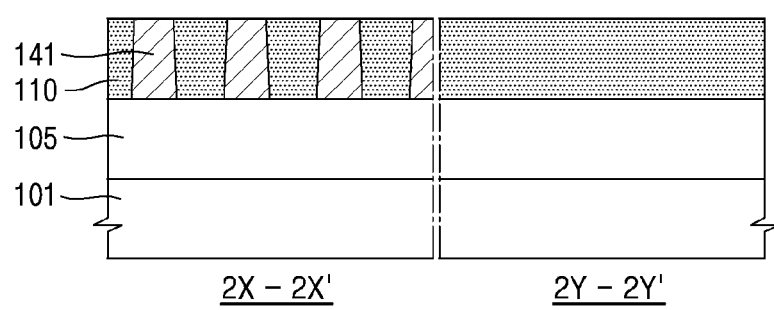
FIGS. 25A to 25P, which correspond to the cross-sectional view taken along lines X-X' and Y-Y' of FIG. 3 or the cross-sectional view taken along lines 2X-2X' and 2Y-2Y' of FIG. 19, are cross-sectional views of process operations of a method of manufacturing a memory device of FIG. 2 or FIG. 18 according an exemplary embodiment.
Figure 25B:
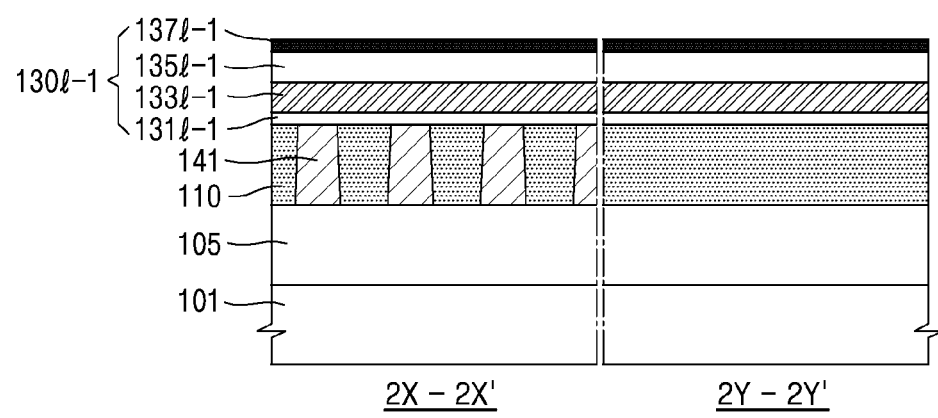
Figure 25C:
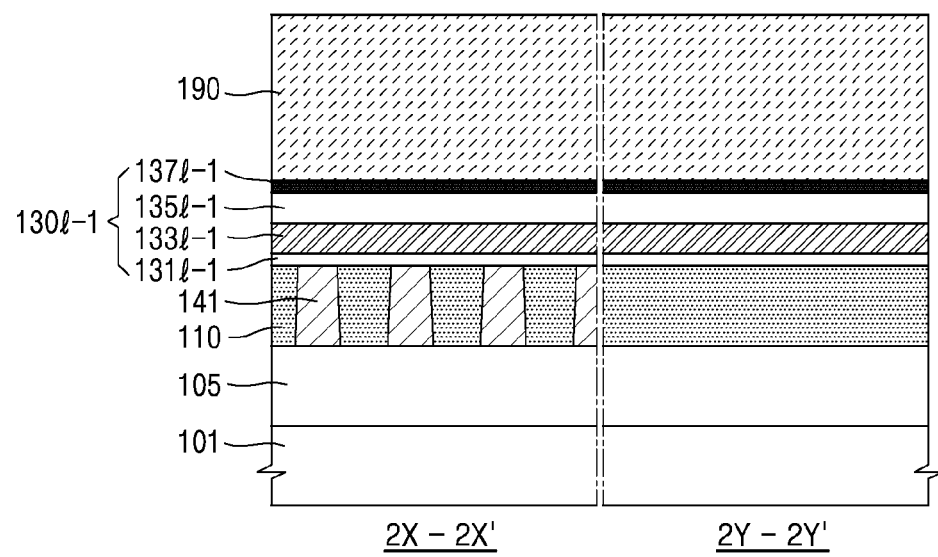
Figure 25D:
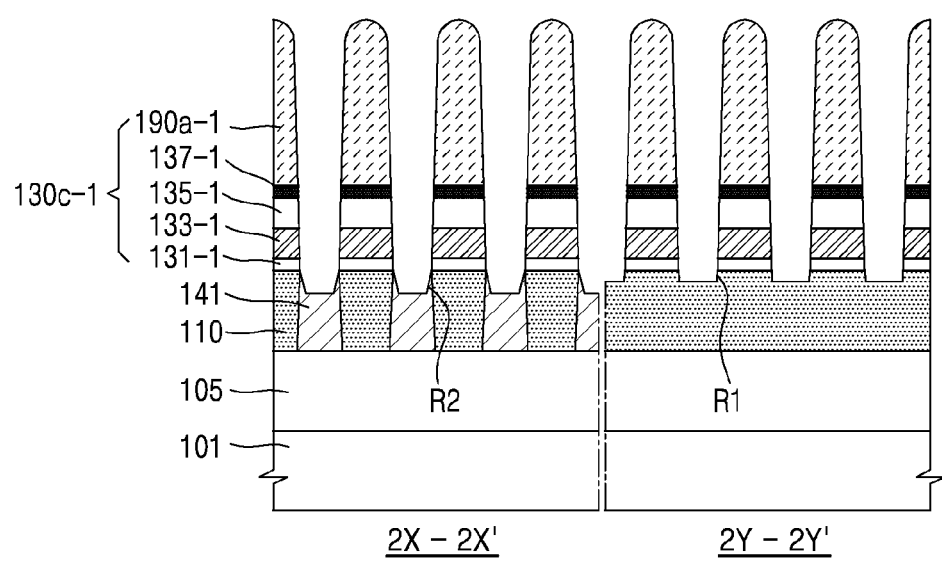
Figure 25E:
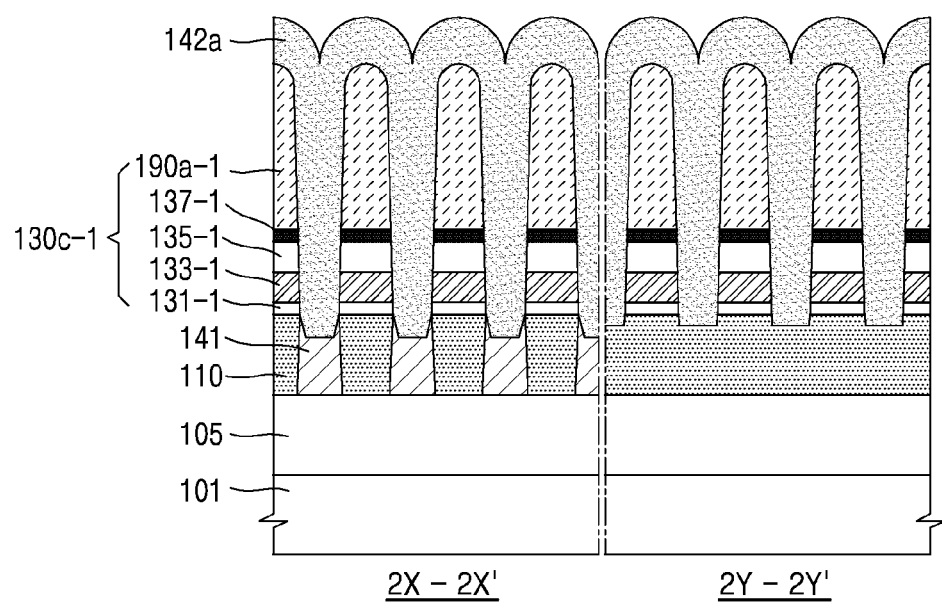
Figure 25F:
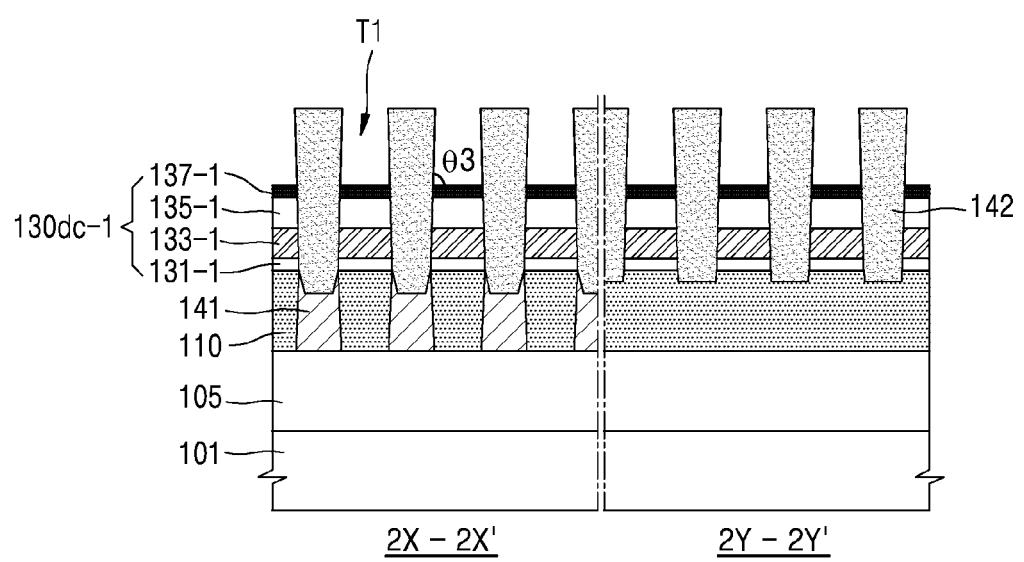
Figure 25G:
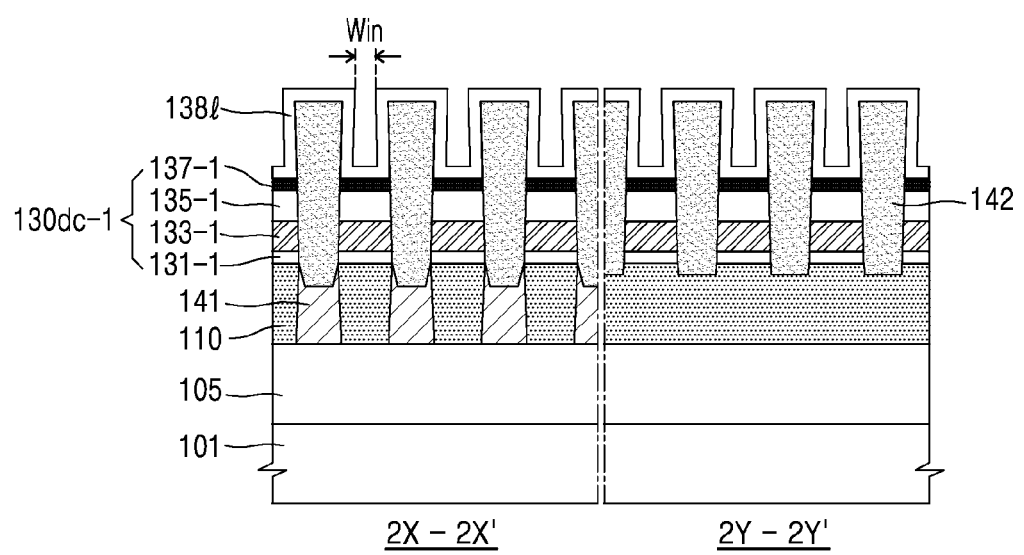
Figure 25H:
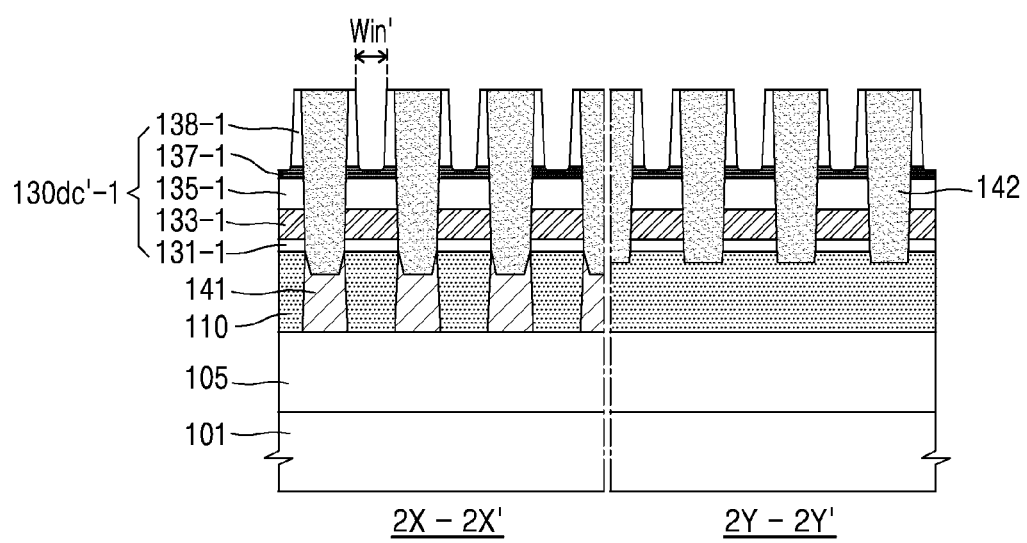
Figure 25I:
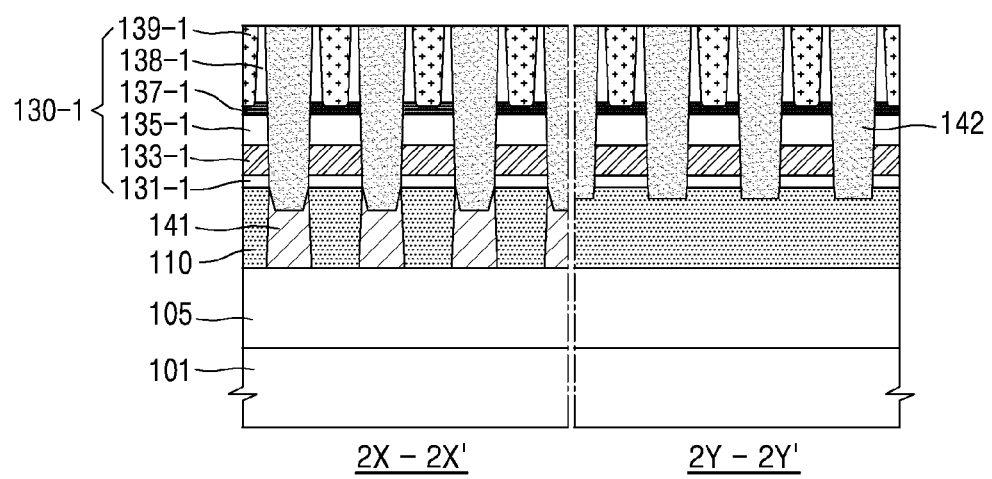
Figure 25J:
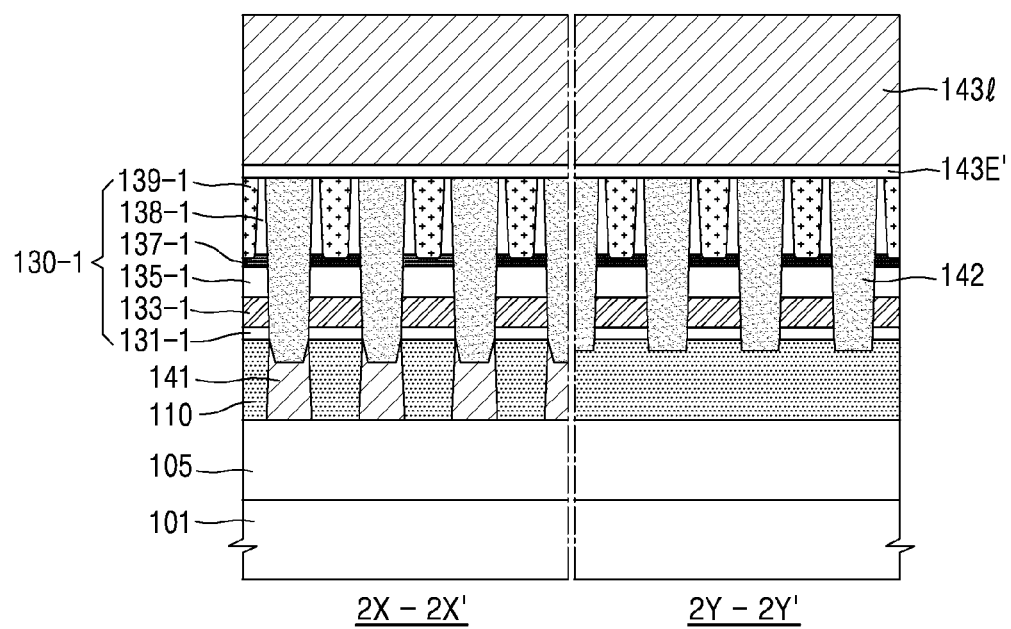
Figure 25K:
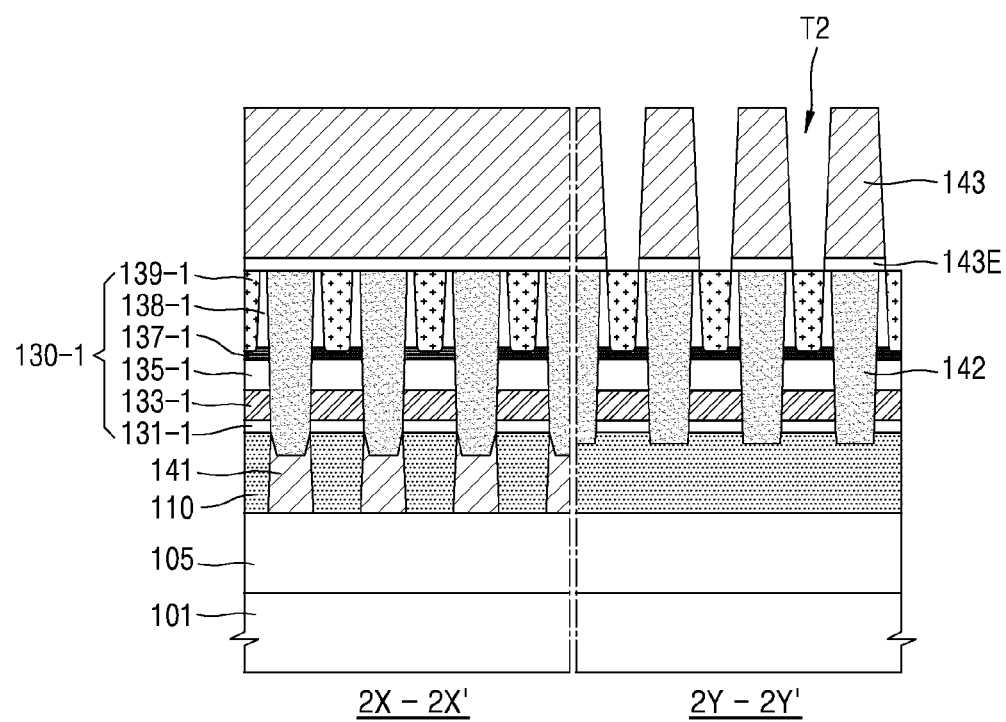
Figure 25L:
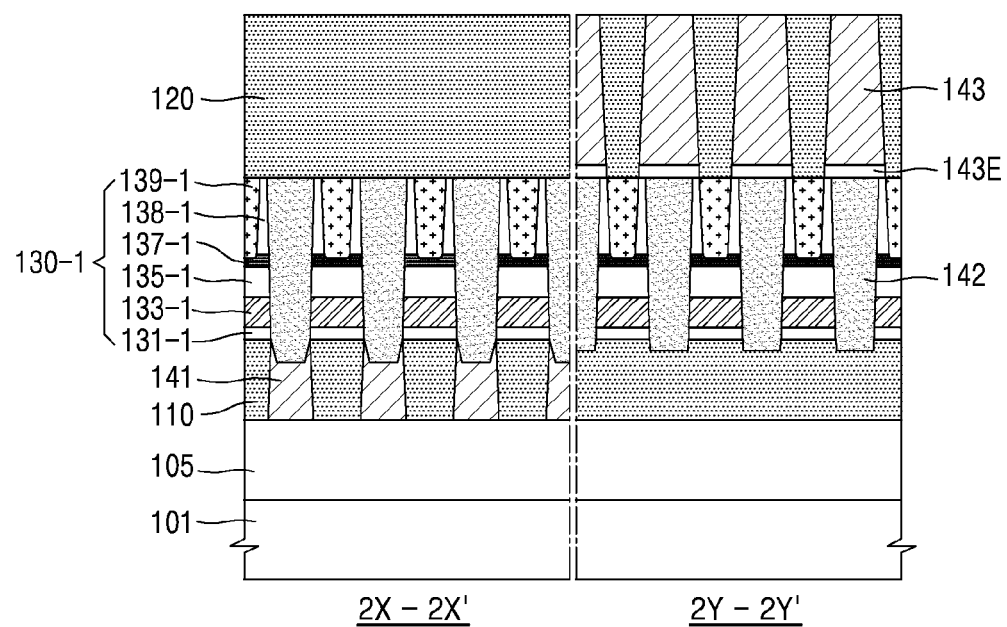
Figure 25M:
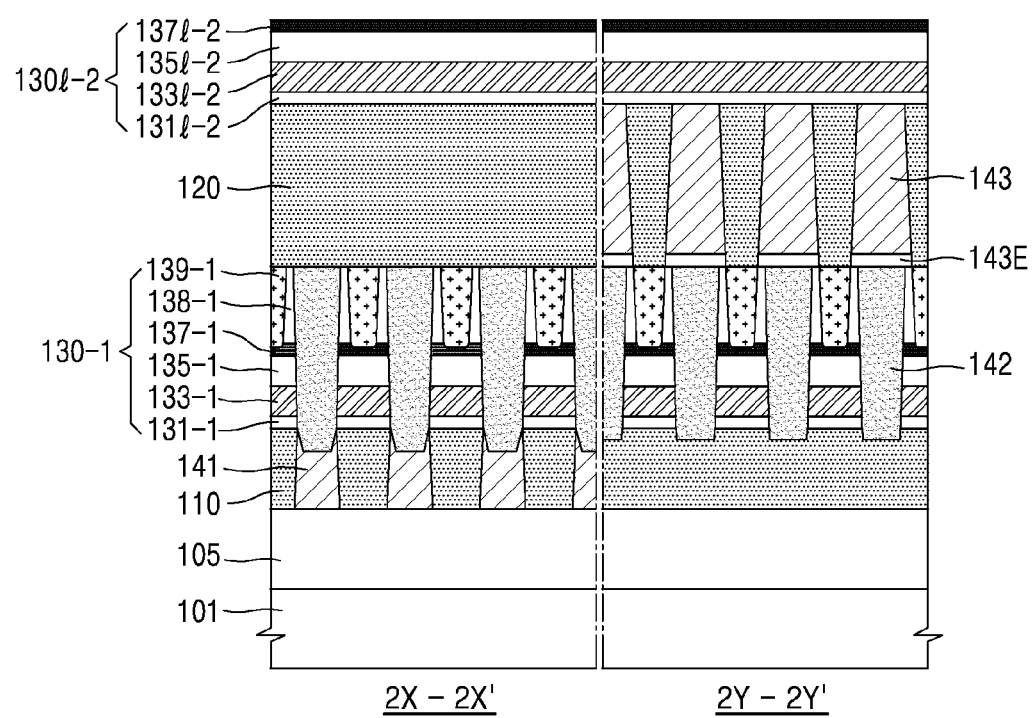
Figure 25N:
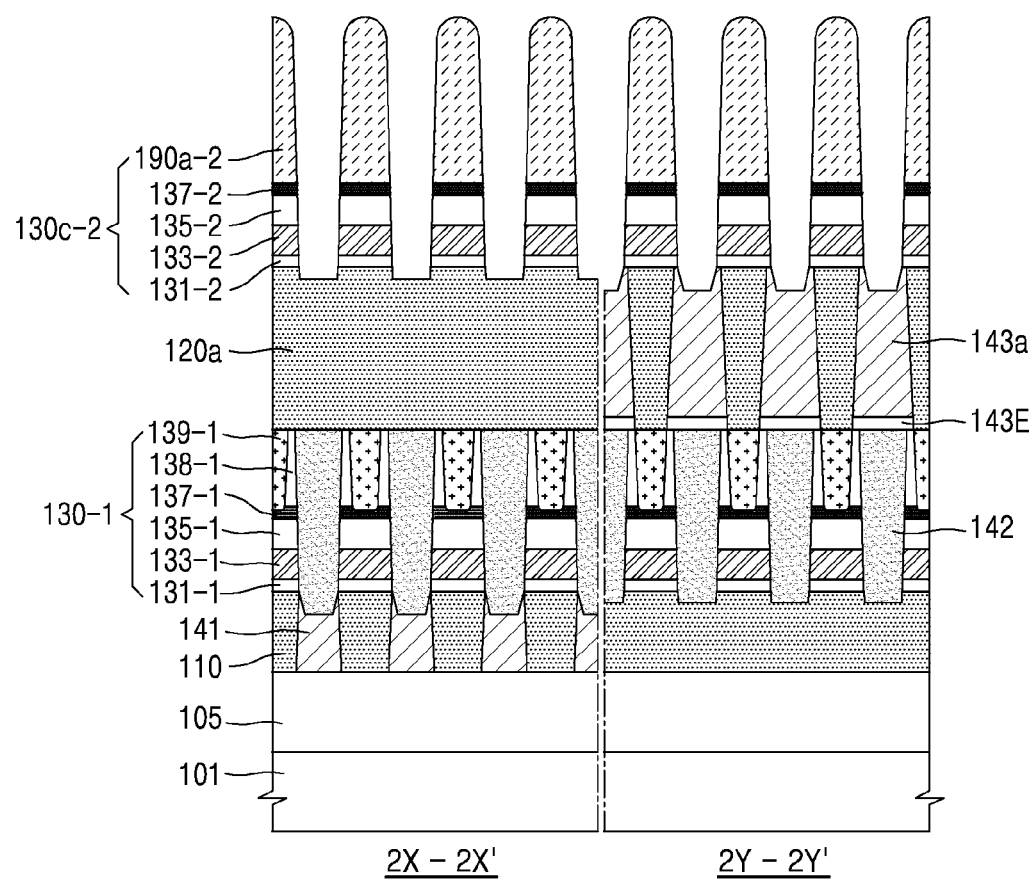
Figure 25O:
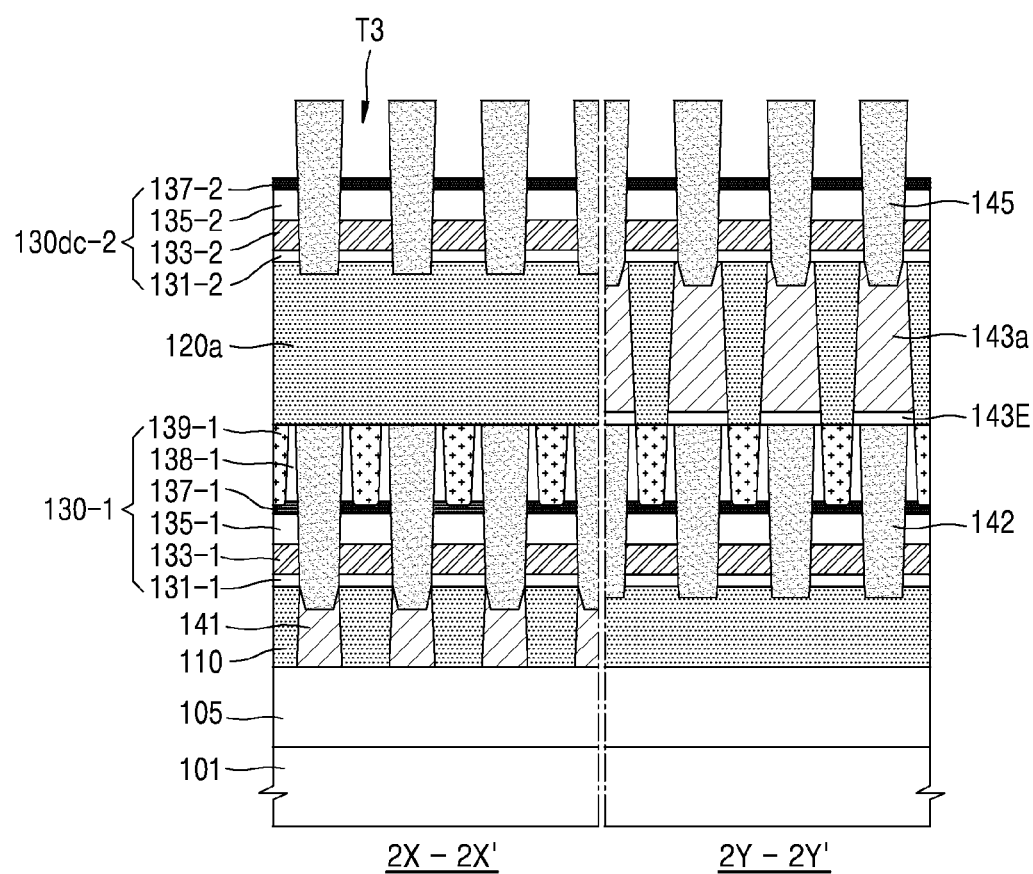
Figure 25P:
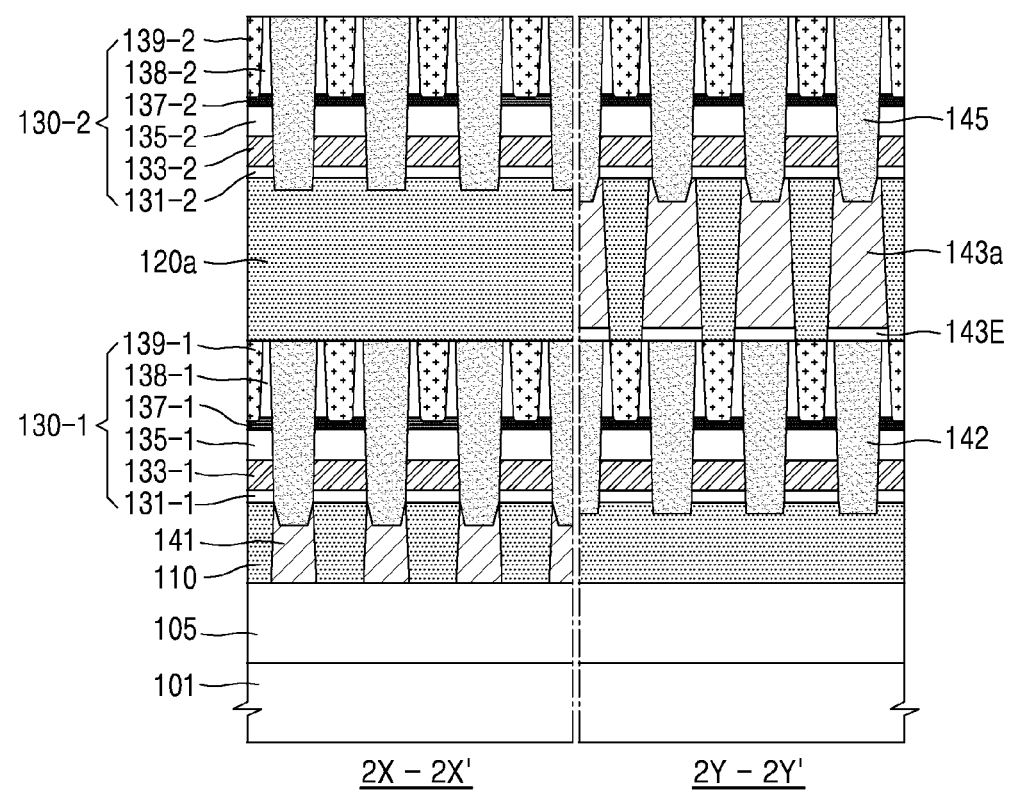

FIGS. 25A to 25P are cross-sectional views of process operations of a method of manufacturing a memory device of FIG. 2 or FIG. 18 according to some exemplary embodiments, and correspond to the exemplary cross-sectional views of FIG. 3 or FIG. 19.

Referring to FIG. 25A, a plurality of first electrode lines 110 may be formed on a interlayer insulating layer 105, extend in a first direction (X direction) and spaced apart from each other. The first electrode lines 110 may be formed by a damascene process. Thus, the first electrode lines 110 may have a structure that becomes narrower toward its lower portions (e.g., portions nearer to the substrate 101). Materials of the first electrode lines 110 may be identical to the materials described with reference to FIGS. 2 and 3. A first insulating layer 141 extending in the first direction may be interposed between the first electrode lines 110.

The first electrode lines 110 may be also formed by an embossing and etching process. When the first electrode lines 110 are formed by the embossing and etching, the first electrode lines 110 may have a structure that becomes gradually wider toward its lower portions (e.g., portions nearer to the substrate 101).

Referring to FIG. 25B, a material layer 131l-1 for a lower electrode, a material layer 133l-1 for a selection device, a material layer 135l-1 for an intermediate electrode and a material layer 137l-1 for a heating electrode may be sequentially stacked on the first electrode lines 110 and the first insulating layer 141 to form a first stack structure 130l-1. Material and function of each material layer constituting the first stack structure may be identical to those described with reference to FIGS. 2 and 3.

Referring to FIG. 25C, a hard mask layer or sacrificial layer 190 may be formed on the material layer 137l-1 for the heating electrode. The hard mask layer, which is used for etching an etch-target layer, may be formed of oxide such as silicon oxide, or nitride such as silicon nitride, or other dielectric materials. The hard mask layer may be patterned using a photoresist pattern formed by a photolithography process. The sacrificial layer 190 may be a material that has substantially the same function as the hard mask layer, and include other materials except for materials of the hard mask layer. The sacrificial layer may be easily removed by subsequent wet or dry etching process. Hereinafter, the sacrificial layer 190 may be referred to the hard mask layer 190 without separately distinguishing the hard mask layer and the sacrificial layer.

Referring to FIG. 25D, the hard mask layer 190 may be etched using the photoresist pattern as an etch mask. Thus, a hard mask pattern 190a having island shapes, which are spaced apart from each other in a first direction (X direction) and a second direction (Y direction), may be formed on the material layer 137l-1 for the heating electrode. The photoresist pattern may be formed through the photolithography process. The hard mask pattern 190a may have a very fine pitch of less than several tens of nm. Thus, the hard mask pattern may be formed through double patterning technology (DPT) or quadruple patterning technology (QPT).

After forming the hard mask pattern 190a, the first stack structure 130l-1 may be etched using the hard mask pattern as an etch mask to form first cell structures 130c-1. The first cell structures 130c-1 may be spaced apart from each other in the first direction (X direction) and the second direction (Y direction), and each may include a lower electrode 131-1, a selection device 133-1, an intermediate electrode 135-1, a heating electrode 137-1 and a lower mask pattern 190a-1. Since the first cell structures 130c-1 are formed by an embossing and etching process, each of the first cell structures 130c-1 may have a structure that becomes gradually wider toward its lower portion (e.g., portion nearer to the substrate 101).

As shown in FIG. 25D, in the etching process of the first cell structures 130c-1, a first recess R1 may be formed on an upper portion of the first electrode lines 110 and a second recess R2 may be formed on an upper portion of the first insulating layer 141.

Referring to FIG. 25E, after forming the first cell structures 130c-1, a gap-fill insulating layer 142a may be formed to fill gaps between the first cell structures 130c-1 and to cover an upper surface of the hard mask pattern 190a-1. The gap-fill insulating layer 142a may be formed of material having an etch selectivity with respect to the hard mask pattern 190a-1. For example, when the hard mask pattern 190a-1 is formed of oxide material, the gap-fill insulating layer 142a may be formed of nitride material. In some embodiments, when the hard mask pattern 190a-1 is formed of nitride material, the gap-fill insulating layer 142a may be formed of oxide material. But the materials of the hard mask pattern 190a-1 and the gap-fill insulating layer 142a are not limited thereto. For example, when there is an etch selectivity with respect to each other, the hard mask pattern 190a-1 and the gap-fill insulating layer 142a may be formed of a variety of different dielectric materials.

Referring to FIG. 25F, after forming the gap-fill insulating layer 142a, an upper portion of the gap-fill insulating layer 142a may be removed through a planarization process, such as an etch-back process and/or chemical mechanical polishing (CMP). An upper surface of the hard mask pattern 190a-1 may be exposed by the planarization process. A portion of an upper portion of the hard mask pattern 190a-1 may be also removed by the planarization process. After the planarization process, a remaining gap-fill insulating layer may be a second insulating layer 142.

Thereafter, the remaining hard mask pattern 190a-1 may be removed through a wet and/or dry etch-back process to form first trenches T1. By removing the hard mask pattern 190a-1, the first cell structure 130c-1 may be a first lower cell structure 130dc-1. For reference, the first trenches T1 may be formed by removing the hard mask pattern 190a-1 of the first cell structure 130c-1. Thus, the first trenches T1 may basically have a structure that becomes gradually wider toward its lower portion (e.g., wider at portions nearer to the substrate 101). For example, an inner sidewall of the first trenches T1 may have a third angle Θ3 which is less than or equal to 90 with respect to a top surface of the heating electrode 137-1 or the substrate 101. Also, the first angle Θ1 shown in FIG. 3 and the third angle Θ3 shown in FIG. 25F may be related as outer angle and inner angle with respect to the first trenches T1. For example, the first angle Θ1 and the third angle Θ3 may add up to 180°.

Referring to FIG. 25G, a material layer 138l for a spacer may be formed to have a uniform thickness on a bottom surface and sidewalls of the first trenches T1 and the second insulating layer 142. The material layer 138l for a spacer may be formed of oxide, nitride or oxynitride. Also, the material layer 138l for a spacer may be formed by a deposition technology, such as, for example, CVD, ALD, etc. After forming the material layer 138l for a spacer, an entrance portion of the first trenches T1 may have a first width Win.

Referring to FIG. 25H, the material layer 138l for a spacer disposed on a top surface of the second insulating layer 142, and the bottom surface of the first trenches T1 may be removed by an anisotropic dry etching process in order to form a spacer 138-1 on the sidewall of the first trenches T1. After forming a spacer 138-1, an entrance portion of the first trenches T1 may have a second width Win'. The second width Win' may be greater than the first width Win.

Immediately after forming the material layer 138l for a spacer, the entrance portion (e.g., a first width Win) of the first trenches T1 may be very narrow. Then, when a material layer for a variable resistance is subsequently formed in the first trenches T1, it may be difficult to fill the first trenches T1 with the material layer for a variable resistance. Accordingly, in order to enhance gap-fill properties of the material layer for a variable resistance, the entrance portion of the first trenches T1 may be widened by an anisotropic dry etching process. As shown in FIG. 4, an inner sidewall of the spacer 138-1 may have a second angle Θ2, which is less than or equal to 900 with respect to the top surface of the heating electrode 137-1. Also, the spacer 138-1 may function to decrease critical dimension (CD) of the bottom surface of the first trenches T1 by as much as its thickness. Thus, a variable resistance layer 139-1, which is subsequently formed in the first trenches T1, may decrease its size and critical dimension (CD). As a result, by forming the spacer 138-1 on the sidewalls of the first trenches T1, the gap-fill properties of the material layer for a variable resistance may be improved. Also, by adjusting the thickness of the spacer 138-1, the critical dimension (CD) of the bottom surfaces of the first trenches T1 may be adjusted.

Referring to FIG. 25, after forming the spacer 138-1, the first trenches T1 may be filled with the material layer for a variable resistance to form a variable resistance layer 139-1. By forming the variable resistance layer 139-1, a first memory cell 130-1 may be embodied. For example, each of the first memory cells 130-1 may include the lower electrode 131-1, the selection device 133-1, the intermediate electrode 135-1, the heating electrode 137-1 and the spacer 138-1.

Referring to FIG. 25J, a third insulating material layer 143*l* may be formed on the first memory cells 130-1 and the second insulating layer 142. Before forming the third insulating material layer 143*l*, a material layer 134E' for an etch stop may be formed first. If second electrode lines 120 are formed by an embossing and etching process, a conductive material layer for second electrode lines 120 may be formed on the first memory cells 130-1 and the second insulating layer 142 without forming the material layer 134E' for an etch stop.

Referring to FIG. 25K, the third insulating material layer 143*l* and the material layer 134E' for an etch stop may be etched to form line-type second trenches T2 extending in the second direction. Specifically, the third insulating material layer 143*l* may be etched by a first etchant until exposing the material layer 134E' for an etch stop. Thereafter, the material layer 134E' for an etch stop may be etched by a second etchant to form the second trenches T2. By forming the second trenches T2, a third insulating layer 143 and an etch stop layer 143E may be formed.

Referring to FIG. 25L, the second trenches T2 may be filled with a conductive material layer to form second electrode lines 120.

Referring to FIG. 25M, after forming the second electrode lines 120, like FIG. 25B, a material layer 131*l*-2 for a lower electrode, a material layer 133*l*-2 for a selection device, a material layer 135*l*-2 for an intermediate electrode and a material layer 137*l*-2 for a heating electrode may be sequentially stacked on the second electrode lines 120 and the second insulating layer 142 to form a second stack structure 130*l*-2. Material and function of each material layer constituting the second stack structure 130*l*-2 may be identical as described with reference to FIGS. 2 and 3.

Referring to FIG. 25N, by performing the process described with reference to FIGS. 23C and 23D, second cell structures 130*c*-2 may be formed. The second cell structures 130*c*-2 may be spaced from each other in the first and second directions and each include a lower electrode 131-2, a selection device 135-2, a heating electrode 137-2 and a lower mask pattern 190*a*-2.

Referring to FIG. 25O, after forming the second cell structures 130*c*-2, the process described with reference to FIGS. 25E and 25F may be performed to form third trenches T3 in a fourth insulating layer 145. By forming the third trenches T3, second lower cell structures 130*dc*-2 may be formed.

Referring to FIG. 25P, thereafter, the process described with reference to FIGS. 25G and 25I may be performed to form second memory cells 130-2. By forming the second memory cells 130-2, the memory device 200 of FIG. 18 may be embodied.

Figure 26A:
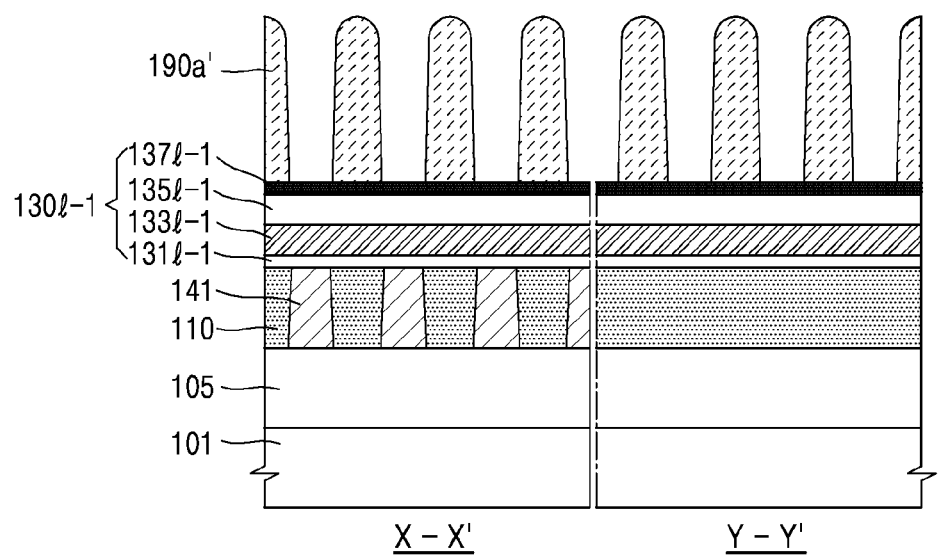
FIGS. 26A to 26B, which correspond to the cross-sectional view taken along lines X-X' and Y-Y' of FIG. 3 or the cross-sectional view taken along lines 2X-2X' and 2Y-2Y' of FIG. 19, are cross-sectional views of process operations of a method of manufacturing a memory device of FIG. 2 or FIG. 18 according an exemplary embodiment.
Figure 26B:
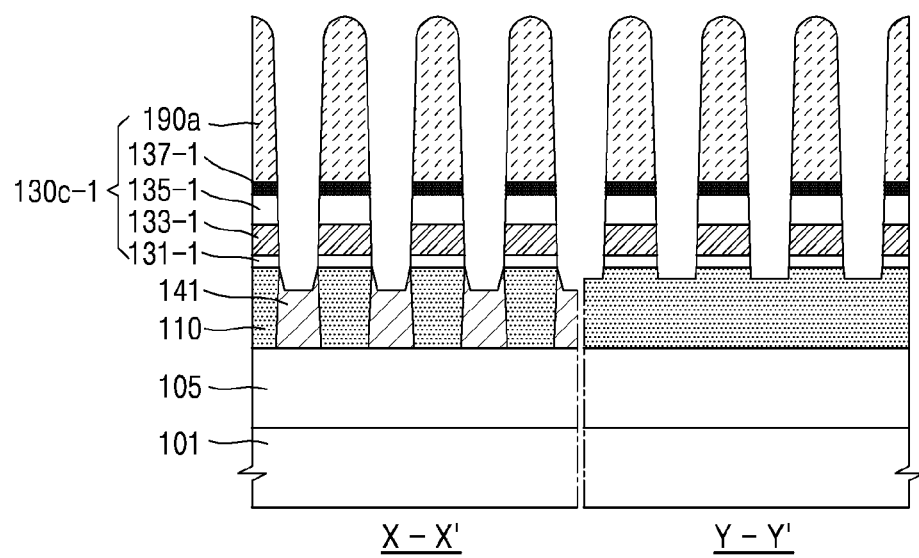

FIGS. 26A to 26B are cross-sectional views of process operations of a method of manufacturing a memory device of FIG. 2 or FIG. 18 according exemplary embodiments. FIGS. 26A to 26B correspond to the cross-sectional view of FIG. 3 or FIG. 19 and show an exemplary method of forming the first cell structures 130*c*-1 of FIG. 25D. The redundant description in FIGS. 25A to 25P will be omitted.

Referring to FIG. 26A, after forming the first stack structure 130*l*-1 and the hard mask 190 on the first electrode lines 110 and the first insulating layer 141 like FIGS. 25B and 25C, a hard mask pattern 190*a*' having island shapes, which are spaced apart from each other in a first direction (X direction) and a second direction (Y direction), may be formed on the first stack structure 130*l*-1.

Referring to FIG. 26B, the first stack structure 130*l*-1 may be etched using the hard mask pattern 190*a*' having the island shapes as an etch mask in order to form the first cell structures 130*c*-1, which are spaced apart from each other in the first direction (X direction) and the second direction (Y direction). The first cell structure 130*c*-1 may be substantially the same as the first cell structure 130*c*-1 of FIG. 23D. Thus, the first cell structure 130*c*-1 may each include a lower electrode 131-1, a selection device 133-1, an intermediate electrode 135-1, a heating electrode 137-1 and a lower mask pattern 190*a*-1.

Figure 27A:
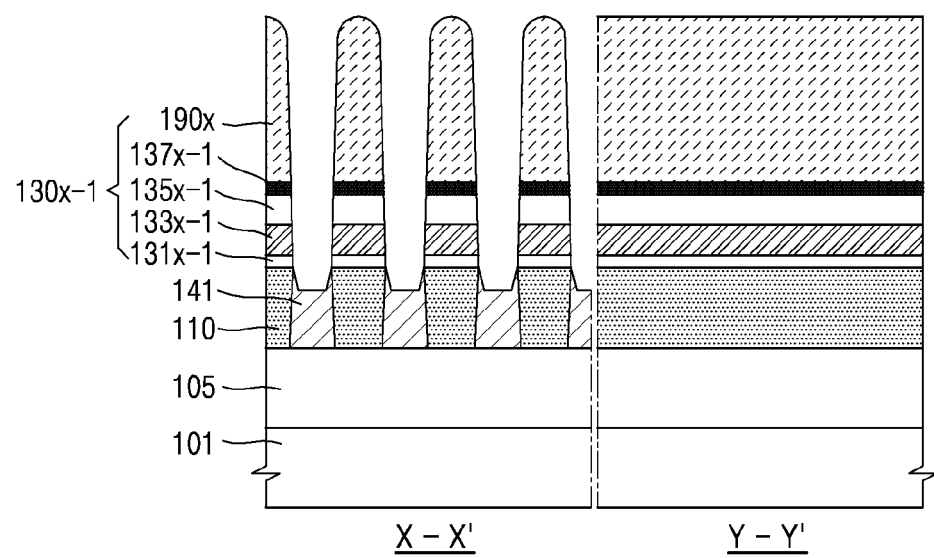
FIGS. 27A to 27C, which correspond to the cross-sectional view taken along lines X-X' and Y-Y' of FIG. 3 or the cross-sectional view taken along lines 2X-2X' and 2Y-2Y' of FIG. 19, are cross-sectional views of process operations of a method of manufacturing a memory device of FIG. 2 or FIG. 18 according an exemplary embodiment.
Figure 27B:
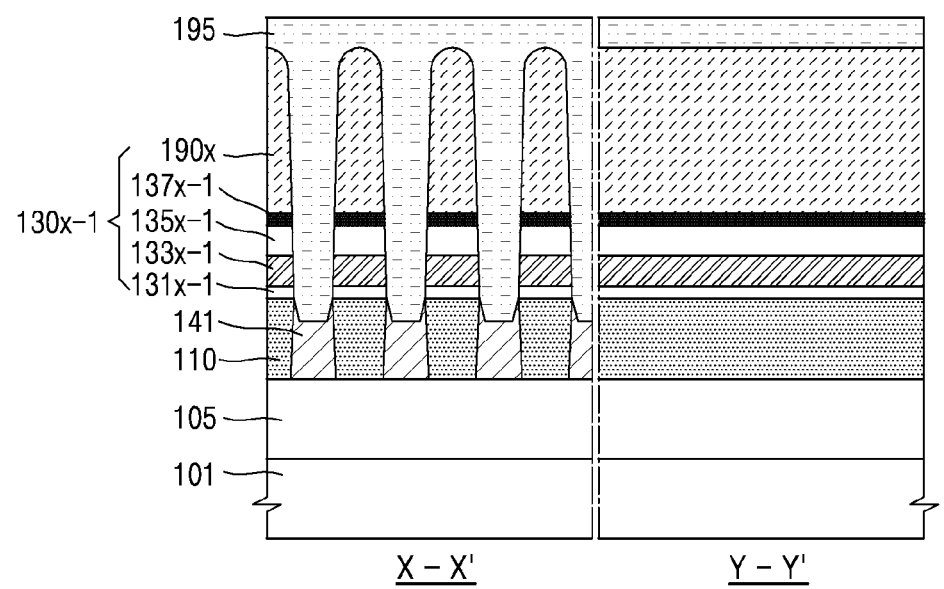
Figure 27C:
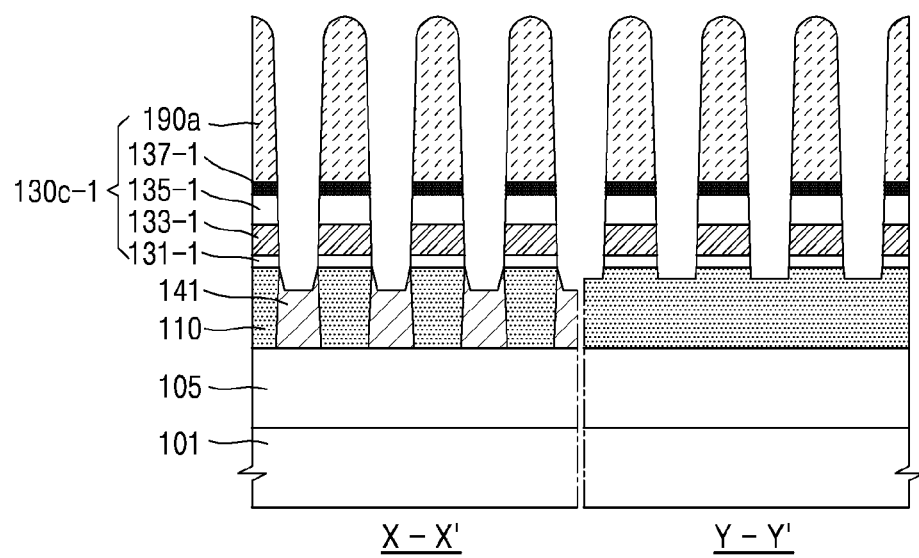

FIGS. 27A to 27C are cross-sectional views of process operations of a method of manufacturing a memory device of FIG. 2 or FIG. 18 according exemplary embodiments. FIGS. 27A to 27C correspond to the cross-sectional view of FIG. 3 or FIG. 19 and show another exemplary method of forming the first cell structures 130*c*-1 of FIG. 25D. The redundant description in FIGS. 25A to 25P will be omitted.

Referring to FIG. 27A, after forming the first cell structure 130*l*-1 and the hard mask 190 on the first electrode lines 110 and the first insulating layer 141, such as shown in connection with FIGS. 25B and 25C, a first hard mask pattern 190*x* having line shapes, which extend in the first direction (X direction) and are spaced apart from each other in the second direction (Y direction), may be formed on the first cell structure 130*l*-1. Thereafter, the first cell structure 130*l*-1 may be etched using the first hard mask pattern 190*x* as an etch mask until exposing the first insulating layer 141 and a portion of the first electrode lines 110 in order to form a plurality of first line stack structures 130*x*-1. The plurality of first line stack structures 130*x*-1 may extend in the first direction (X direction) and be spaced apart from each other in the second direction (Y direction). Also, the plurality of first line stack structures 130*x*-1 may be electrically connected to the first electrode lines 110.

Referring to FIG. 27B, a gap-fill material layer 195 may be formed to fill between the first line stack structures 130*x*-1 and to cover the first hard mask pattern 190*x*. For example, the gap-fill material layer 195 may be disposed between the first line stack structures 130*x*-1, and may fill the space between the first line stack structures 130*x*-1.

Referring to FIG. 27C, the gap-fill material layer 195 may be planarized by an etch-back process and/or chemical mechanical polishing (CMP) process until exposing an upper surface of the first hard mask pattern 190*x*. After planarization of the gap-fill material layer 195, a second mask pattern (not shown) having line shapes may be formed on the first hard mask pattern 190*x* and the gap-fill material layer 195. The second mask pattern may extend in the first direction (X direction) and be spaced apart from each other in the second direction (Y direction). And then the first hard mask pattern 190*x*, the gap-fill material layer 195 and the first line stack structure 130*x*-1 may be etched using the second mask pattern as an etch mask. Thereafter, by removing the remaining gap-fill material layer 195, first cell structure 130*c*-1 may be embodied. The first cell structures 130*c*-1 may have substantially the same structure as the first cell structures 130*c*-1 of FIG. 25D.

Figure 28A:
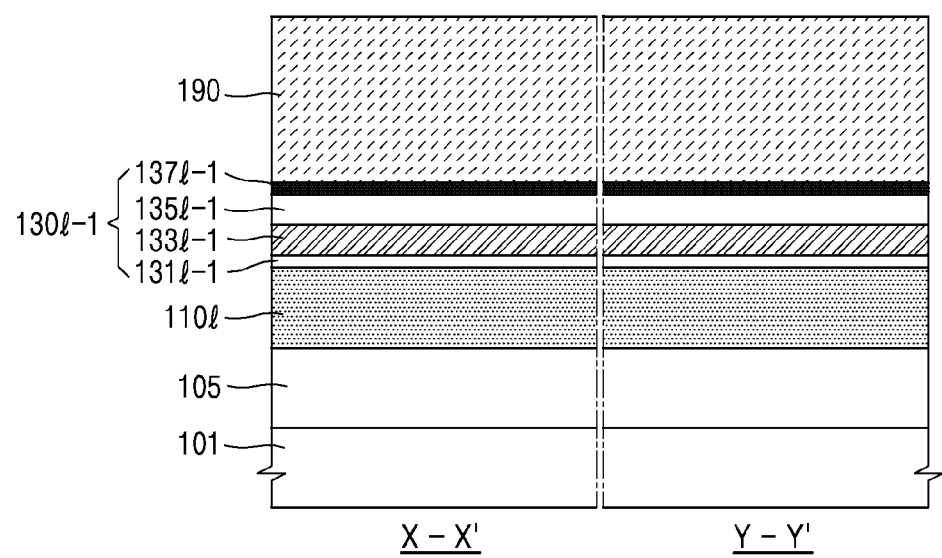
FIGS. 28A to 28C, which correspond to the cross-sectional view taken along lines X-X' and Y-Y' of FIG. 3 or the cross-sectional view taken along lines 2X-2X' and 2Y-2Y' of FIG. 19, are cross-sectional views of process operations of a method of manufacturing a memory device of FIG. 2 or FIG. 18 according an exemplary embodiment.
Figure 28B:
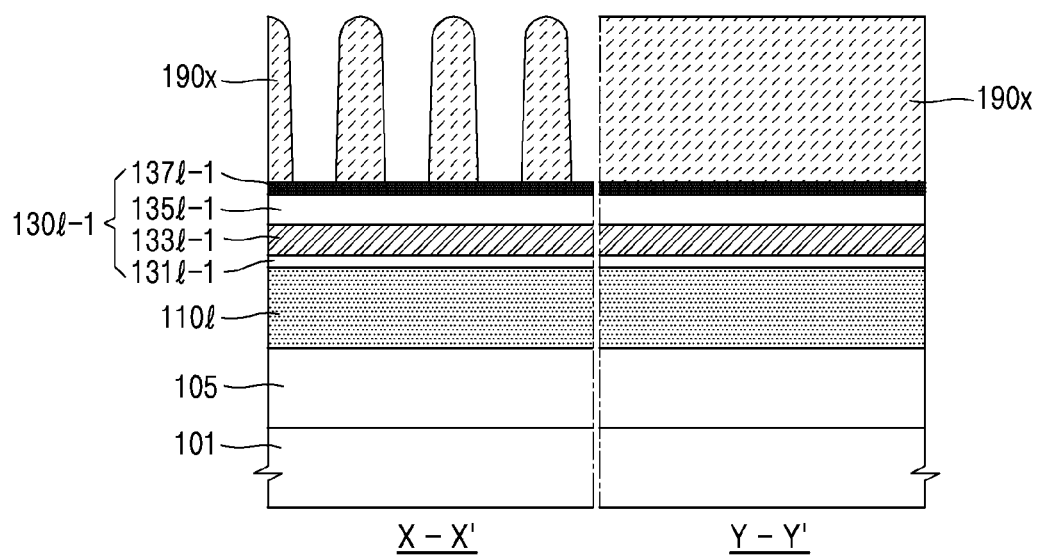
Figure 28C:
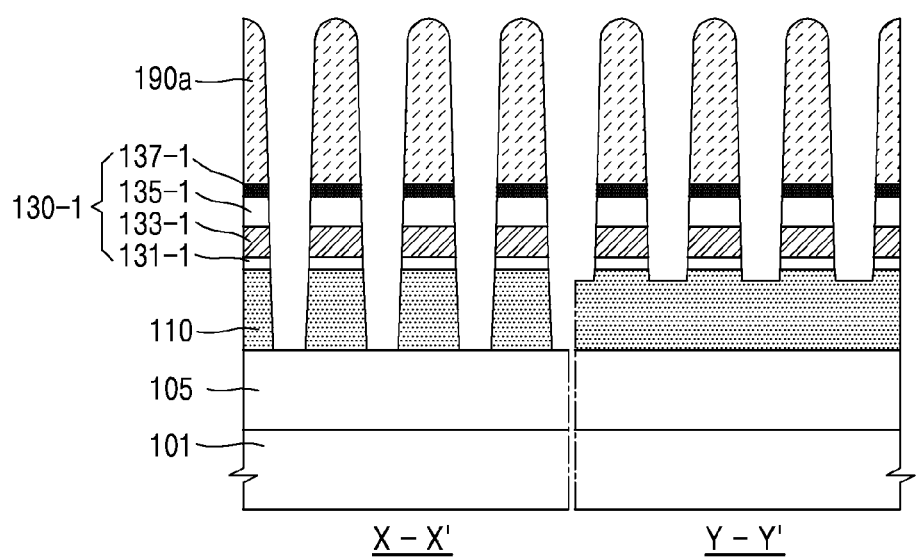

FIGS. 28A to 28C are cross-sectional views of process operations of a method of manufacturing a memory device of FIG. 2 or FIG. 18 according exemplary embodiments. FIGS. 28A to 28C correspond to the cross-sectional view of FIG. 3 or FIG. 19, and show an exemplary method of forming the first electrode lines 110 of FIG. 25D together with the first cell structures 130*c*-1. The redundant description in FIGS. 25A to 25P will be omitted.

Referring to FIG. 28A, a conductive material layer 110*l* for a first electrode, a first stack structure 130*l*-1 and a hard mask 190 may be sequentially stacked on the interlayer insulating layer 105.

Referring to FIG. 28B, a first hard mask pattern 190*x* having line shapes, which extend in the first direction (X direction) and are spaced apart from each other in the second direction (Y direction), may be formed on the first stack structure 130*l*-1.

Referring to FIG. 28C, the first stack structure 130*l*-1 and the conductive material layer 110*l* may be first-etched using the first hard mask pattern 190*x* as an etch mask until exposing the interlayer insulating layer 105. After the first etching, first electrode lines 110 and first line stack structures 130-1, which extend in the first direction and are spaced apart from each other in the second direction, may be formed.

Thereafter, as described with reference to FIG. 27C, a gap-fill material layer may be formed to fill between the first electrode lines 110 and between the first line stack structures, and planarized by an etch-back process and/or chemical mechanical polishing (CMP) process until exposing an upper surface of the first hard mask pattern 190*x*. After planarization of the gap-fill material layer, a second mask pattern (not shown) having line shapes, which extend in the second direction and are spaced apart from each other in the first direction, may be formed on the first hard mask pattern 190*x* and the gap-fill material layer. And then the first hard mask pattern 190*x*, the gap-fill material layer and the first line stack structure may be second-etched using the second mask pattern as an etch mask. Thereafter, by removing the remaining gap-fill material layer, first cell structures 130*c*-1 may be embodied. The first cell structures 130*c*-1 may have substantially the same structure as the first cell structures 130*c*-1 of FIG. 25D.

Figure 29A:
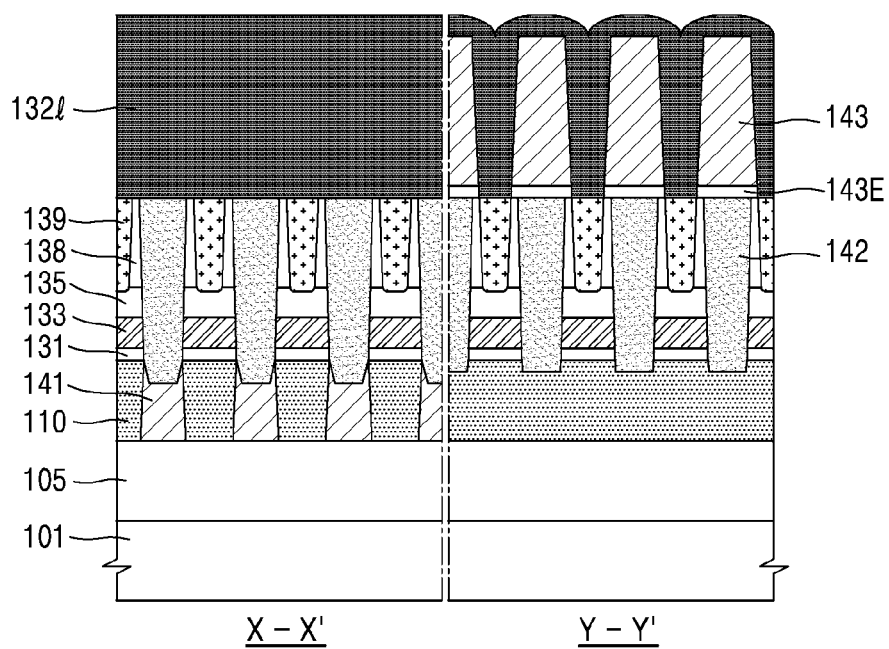
FIGS. 29A to 29B, which correspond to the cross-sectional view taken along lines X-X' and Y-Y' of FIG. 3, are cross-sectional views of process operations of a method of manufacturing a memory device of FIG. 14 according an exemplary embodiment.
Figure 29B:
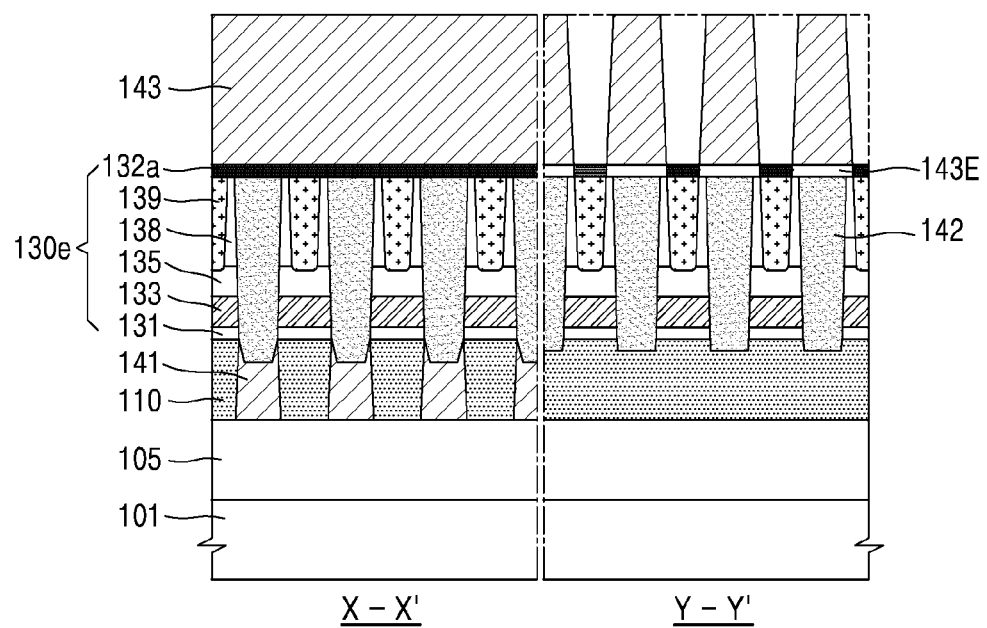

FIGS. 29A and 29B are cross-sectional views of process operations of a method of manufacturing a memory device of FIG. 14 according an exemplary embodiment, and correspond to the cross-sectional view of FIG. 3. The redundant description with reference to FIGS. 25A to 25P will be omitted.

Referring to FIG. 29A, the processes described with reference to FIGS. 25A to 25K may be performed, thereby forming second trenches T2 in a third insulating layer 143. A portion of upper surfaces of a variable resistance layer 139-1 and a second insulating layer 142 may be exposed through the second trenches T2. Thereafter, as shown FIG. 29A, a material layer 132*l* for an upper electrode may be formed to completely fill the second trenches T2 and to cover the third insulating layer 143.

Referring to FIG. 29B, a thin layer of the material layer 132*l* for an upper electrode may remain in a bottom portion of the second trenches T2 by an etch-back process, thereby forming an upper electrode layer 132*a*. Thereafter, by filling the second trenches T2 with a conductive material layer, second electrode lines 120 may be formed. The memory device 100I may be embodied by forming the top electrode layer 132*a* and the second electrode lines 120.

Figure 30:
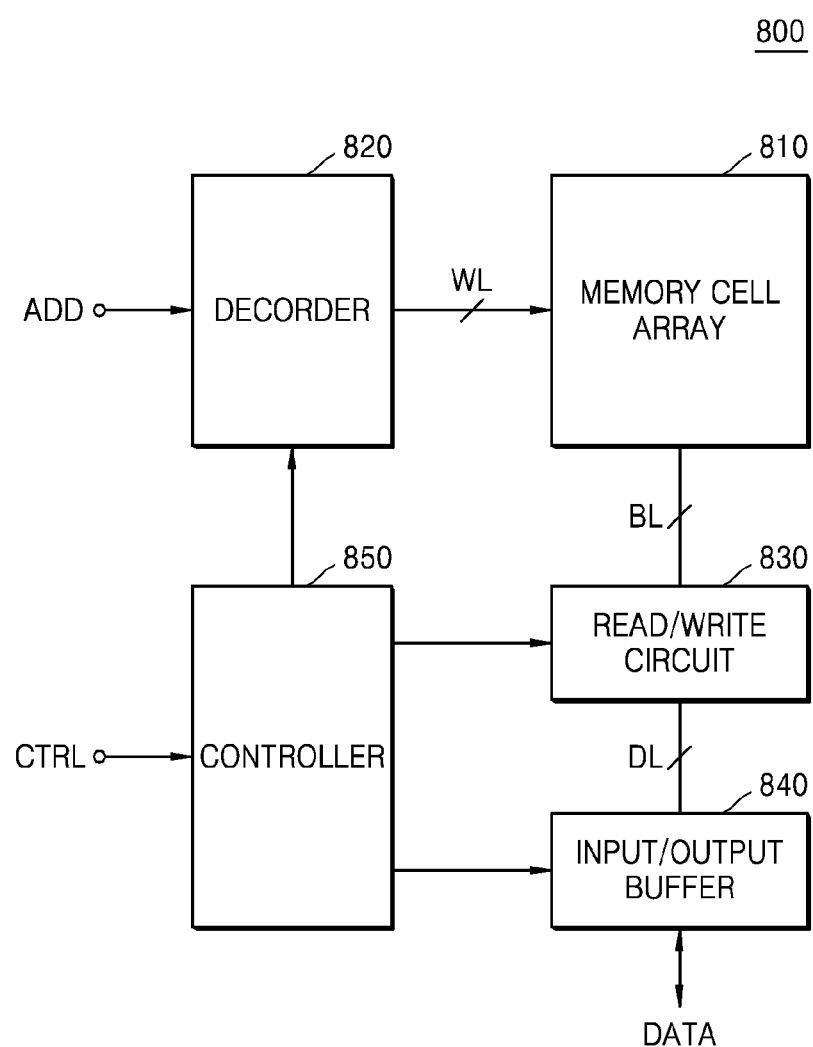
FIG. 30 is a block diagram of a memory device according to an exemplary embodiment.

FIG. 30 is a block diagram of a memory device according to an exemplary embodiment.

Referring to FIG. 30, the memory device 800 may include a memory cell array 810, a decoder 820, a read/write circuit 830, an input/output buffer 840, and a controller 850. The memory cell array 810 may include at least one of the memory device 100 illustrated in FIGS. 1 to 3, the memory devices 100A to 100M illustrated respectively in FIGS. 6 to 17B, the memory devices 200 and 200A to 200C illustrated respectively in FIGS. 18 to 22 and the memory device 1000 illustrated in FIGS. 23 and 24.

A plurality of memory cells in the memory cell array 810 may be connected to the decoder 820 through a plurality of word lines WL and may be connected to the read/write circuit 830 through a plurality of bit lines BL. The decoder 820 may receive addresses ADD from the outside (e.g., external of decoder 820) and may decode a row address and a column address to access a selected memory cell in the memory cell array 810 by control of the controller 850 operating in response to a control signal CTRL.

The read/write circuit 830 may receive data from the input/output buffer and a plurality of data lines DL, and may write the received data in the selected memory cell of the memory cell array 810 by control of the controller 850. The read/write circuit 830 may read data from the selected memory cell of memory cell array 810 by control of the controller 850 and may transfer the read data to the input/output buffer.

Figure 31:
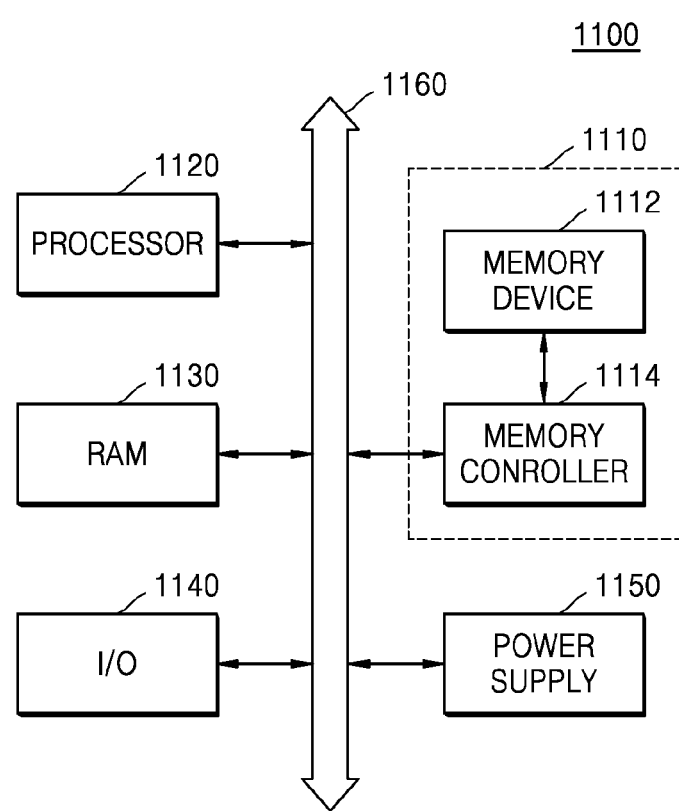
FIG. 31 is a block diagram of a computer system according to an exemplary embodiment.

FIG. 31 is a block diagram of a computer system according to an embodiment.

Referring to FIG. 31, a computer system 1100 may include a memory system 1110, a processor 1120, a random access memory (RAM) 1130, an input/output (I/O) unit 1140, and a power supply 1150. Furthermore, the memory system 1110 may include a memory device 1112 and a memory controller 1114. Although not shown, the computer system 1110 may further include ports which communicate with devices, such as, for example, a video card, a sound card, a memory card, an USB device, or other electronic device. The computer system 1100 may be a personal computer or a mobile electronic device such as a notebook computer, a mobile phone, a personal digital assistant (PDA), or a camera.

The processor 1120 may perform specific calculations or tasks. The processor 1120 may be a microprocessor or a central processing unit (CPU). The processor 1120 may communicate with the RAM 1130, the I/O unit 1140, and the memory system 1110 through a bus 1160 such as, for example, an address bus, a control bus, a data bus, etc. Here, the memory system 1110 may include at least one of the memory device 100 illustrated in FIGS. 1 to 3, the memory devices 100A to 100M illustrated respectively in FIGS. 6 to 17B, the memory devices 200 and 200A to 200C illustrated respectively in FIGS. 18 to 22 and the memory device 1000 illustrated in FIGS. 23 and 24.

In some embodiments, the processor 1120 may be connected to an expansion bus such as a peripheral component interconnection (PC) bus.

The RAM 1130 may store data and information for operating the computer system 1100. The RAM 1130 may include a DRAM, a mobile DRAM, an SRAM, a ReRAM, a FRAM, a MRAM, or a PRAM.

The I/O unit 1140 may include one or more input units, such as, for example, a keypad, a keyboard, a mouse, etc. and one or more output units, such as, for example, a display, a printer, etc. The power supply unit 1150 may supply an operating voltage which is necessary for operation of the computer system 1100.

While the concepts have been particularly shown and described with reference to exemplary embodiments thereof, it will be understood that various changes in form and details may be made therein without departing from the spirit and scope of the following claims.

What is claimed is:

1. A semiconductor device comprising:
a substrate;

a circuit layer disposed on the substrate;
an interlayer insulating layer disposed on the circuit layer;
a first electrode disposed on the interlayer insulating layer;
a second electrode disposed on the interlayer insulating layer, and spaced apart from the first electrode;
a first insulation disposed on the interlayer insulating layer;
a second insulation disposed on the interlayer insulating layer, and spaced apart from the first insulation;
a first memory cell and a second memory cell disposed on the first electrode, and spaced apart from each other;
a third memory cell and a fourth memory cell disposed on the second electrode, and spaced apart from each other;
a third electrode disposed on the first memory cell and the third memory cell;
a fourth electrode disposed on the second memory cell and the fourth memory cell, and spaced apart from the third electrode; and
an upper insulation disposed between the third electrode and the fourth electrode,
wherein each of the first, second, third and fourth memory cells includes a selection device layer, an intermediate electrode disposed on the selection device layer and a variable resistance layer disposed on the intermediate electrode,
wherein the first electrode is disposed between the first insulation and the second insulation,
wherein a width of an upper portion of the first memory cell is less than a width of a lower portion of the first memory cell, and
wherein an upper surface of the first insulation is uneven such that a side portion of the upper surface of the first insulation is disposed higher than a center portion of the upper surface of the first insulation.

2. The semiconductor device of claim 1, wherein an upper surface of the second insulation includes a recess.

3. The semiconductor device of claim 1, wherein the first insulation is disposed between the first electrode and the second electrode.

4. The semiconductor device of claim 1, further comprising a third insulation disposed on the interlayer insulating layer, and disposed between the first memory cell and the second memory cell and between the third memory cell and the fourth memory cell.

5. The semiconductor device of claim 1,
wherein each of the first, second, third and fourth memory cells further includes a spacer disposed on a sidewall of the variable resistance layer, and
wherein a sidewall of the selection device layer, a sidewall of the intermediate electrode and a sidewall of the spacer have the substantially same slope.

6. The semiconductor device of claim 1, wherein a width of the variable resistance layer is less than a width of the selection device layer.

7. The semiconductor device of claim 1, wherein a width of a top portion of the first electrode is greater than a width of a middle portion of the first electrode.

8. The semiconductor device of claim 1, wherein a width of a widest portion of the third electrode is less than a width of a widest portion of the first electrode.

9. The semiconductor device of claim 1, wherein a height of the third electrode is greater than a height of the first electrode.

10. A semiconductor device comprising:
a substrate;
an interlayer insulating layer disposed on the substrate;
a first electrode disposed on the interlayer insulating layer;
a second electrode disposed on the interlayer insulating layer, and spaced apart from the first electrode;
a first insulation disposed on the interlayer insulating layer;
a second insulation disposed on the interlayer insulating layer, and spaced apart from the first insulation;
a first memory cell and a second memory cell disposed on the first electrode, and spaced apart from each other;
a third memory cell and a fourth memory cell disposed on the second electrode, and spaced apart from each other;
a third electrode disposed on the first memory cell and the third memory cell;
a fourth electrode disposed on the second memory cell and the fourth memory cell, and spaced apart from the third electrode;
a third insulation disposed between the third electrode and the fourth electrode;
a fifth memory cell and a sixth memory cell disposed on the third electrode, and spaced apart from each other;
a seventh memory cell and an eighth memory cell disposed on the fourth electrode, and spaced apart from each other;
a fifth electrode disposed on the fifth memory cell and the seventh memory cell;
a sixth electrode disposed on the sixth memory cell and the eighth memory cell, and spaced apart from the fifth electrode; and
a fourth insulation disposed between the fifth electrode and the sixth electrode,
wherein each of the first, second, third, fourth, fifth, sixth, seventh and eighth memory cells includes a selection device layer, an intermediate electrode disposed on the selection device layer and a variable resistance layer disposed on the intermediate electrode,
wherein the first electrode is disposed between the first insulation and the second insulation,
wherein a width of an upper portion of the first memory cell is less than a width of a lower portion of the first memory cell, and
wherein a side portion of an upper surface of the first insulation is disposed higher than a center portion of the upper surface of the first insulation.

11. The semiconductor device of claim 10, wherein the upper surface of the first insulation is uneven.

12. The semiconductor device of claim 10, wherein an upper surface of the third insulation is uneven such that a side portion of the upper surface of the third insulation is disposed higher than a center portion of the upper surface of the third insulation.

13. The semiconductor device of claim 10, further comprising a circuit layer disposed on the substrate and below the interlayer insulating layer.

14. The semiconductor device of claim 10, wherein a width of an upper portion of the fifth memory cell is less than a width of a lower portion of the fifth memory cell.

15. The semiconductor device of claim 10, wherein a width of an upper portion of the third electrode is different from a width of a lower portion of the third electrode.

16. A semiconductor device comprising:
a substrate;
a first interlayer insulating layer disposed on the substrate;
a first electrode disposed on the first interlayer insulating layer;
a second electrode disposed on the first interlayer insulating layer, and spaced apart from the first electrode;

a first insulation disposed on the first interlayer insulating layer;
a second insulation disposed on the first interlayer insulating layer, and spaced apart from the first insulation;
a first memory cell and a second memory cell disposed on the first electrode, and spaced apart from each other;
a third memory cell and a fourth memory cell disposed on the second electrode, and spaced apart from each other;
a third electrode disposed on the first memory cell and the third memory cell;
a fourth electrode disposed on the second memory cell and the fourth memory cell, and spaced apart from the third electrode;
a third insulation disposed between the third electrode and the fourth electrode;
a fifth memory cell and a sixth memory cell disposed on the third electrode, and spaced apart from each other;
a seventh memory cell and an eighth memory cell disposed on the fourth electrode, and spaced apart from each other;
a fifth electrode disposed on the fifth memory cell and the seventh memory cell;
a sixth electrode disposed on the sixth memory cell and the eighth memory cell, and spaced apart from the fifth electrode;
a fourth insulation disposed between the fifth electrode and the sixth electrode;
a ninth memory cell and a tenth memory cell disposed on the fifth electrode, and spaced apart from each other;
an eleventh memory cell and a twelfth memory cell disposed on the sixth electrode, and spaced apart from each other;
a seventh electrode disposed on the ninth memory cell and the eleventh memory cell;
an eighth electrode disposed on the tenth memory cell and the twelfth memory cell, and spaced apart from the seventh electrode;
a fifth insulation disposed between the seventh electrode and the eighth electrode;
a thirteenth memory cell and a fourteenth memory cell disposed on the seventh electrode, and spaced apart from each other;
a fifteenth memory cell and a sixteenth memory cell disposed on the eighth electrode, and spaced apart from each other;
a ninth electrode disposed on the thirteenth memory cell and the fifteenth memory cell;
a tenth electrode disposed on the fourteenth memory cell and the sixteenth memory cell, and spaced apart from the ninth electrode; and
a sixth insulation disposed between the ninth electrode and the tenth electrode,
wherein each of the first through sixteenth memory cells includes a selection device layer, an intermediate electrode disposed on the selection device layer and a variable resistance layer disposed on the intermediate electrode,
wherein the first electrode is disposed between the first insulation and the second insulation,
wherein a width of an upper portion of the first memory cell is less than a width of a lower portion of the first memory cell, and
wherein an upper surface of the first insulation is uneven.

17. The semiconductor device of claim 16, wherein a side portion of the upper surface of the first insulation is disposed higher than a center portion of the upper surface of the first insulation.

18. The semiconductor device of claim 16, wherein an upper surface of the third insulation includes a recess.

19. The semiconductor device of claim 16, further comprising a second interlayer insulating layer disposed on the fifth electrode, the sixth electrode and the fourth insulation.

20. The semiconductor device of claim 16, wherein a height of the third electrode is greater than a height of the first electrode.

* * * * *